(12) United States Patent
Young et al.

(10) Patent No.: US 11,997,855 B2
(45) Date of Patent: May 28, 2024

(54) BACK-END-OF-LINE SELECTOR FOR MEMORY DEVICE

(71) Applicant: Taiwan Semiconductor Manufacturing Co., Ltd., Hsin-Chu (TW)

(72) Inventors: Bo-Feng Young, Taipei (TW); Sheng-Chen Wang, Hsinchu (TW); Sai-Hooi Yeong, Zhubei (TW); Yu-Ming Lin, Hsinchu (TW); Mauricio Manfrini, Zhubei (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 100 days.

(21) Appl. No.: 17/109,427

(22) Filed: Dec. 2, 2020

(65) Prior Publication Data

US 2021/0375990 A1      Dec. 2, 2021

Related U.S. Application Data

(60) Provisional application No. 63/031,046, filed on May 28, 2020.

(51) Int. Cl.
*H10B 63/00* (2023.01)
*H01L 29/24* (2006.01)
(Continued)

(52) U.S. Cl.
CPC ............ *H10B 63/30* (2023.02); *H01L 29/24* (2013.01); *H01L 29/66969* (2013.01); *H01L 29/7869* (2013.01); *H10B 61/22* (2023.02)

(58) Field of Classification Search
CPC ...... H01L 27/2454; H01L 45/04; H01L 21/22; H01L 27/228; H01L 27/2481;
(Continued)

(56) References Cited

U.S. PATENT DOCUMENTS

| 2010/0059837 | A1  | 3/2010 | Kim et al. |
| 2010/0109061 | A1* | 5/2010 | Kushida ............ G11C 11/1659 |
|              |     |        | 257/295 |

(Continued)

OTHER PUBLICATIONS

U.S. Appl. No. 17/096,993, filed Nov. 13, 2020.

*Primary Examiner* — Samuel A Gebremariam
*Assistant Examiner* — Jonas T Beardsley
(74) *Attorney, Agent, or Firm* — Eschweiler & Potashnik, LLC

(57) ABSTRACT

The present disclosure, in some embodiments, relates to a memory device. In some embodiments, the memory device has a substrate and a lower interconnect metal line disposed over the substrate. The memory device also has a selector channel disposed over the lower interconnect metal line and a selector gate electrode wrapping around a sidewall of the selector channel and separating from the selector channel by a selector gate dielectric. The memory device also has a memory cell disposed over and electrically connected to the selector channel and an upper interconnect metal line disposed over the memory cell. By placing the selector within the back-end interconnect structure, front-end space is saved, and more integration flexibility is provided.

20 Claims, 47 Drawing Sheets

(51) Int. Cl.
*H01L 29/66* (2006.01)
*H01L 29/786* (2006.01)
*H10B 61/00* (2023.01)

(58) Field of Classification Search
CPC . H01L 29/6666; H01L 29/7827; H10B 61/22;
H10B 63/34; H10B 70/826; H10N 70/826
See application file for complete search history.

(56) References Cited

U.S. PATENT DOCUMENTS

| | | | |
|---|---|---|---|
| 2012/0069647 A1* | 3/2012 | Kramer | G11C 11/5607 |
| | | | 257/295 |
| 2015/0249113 A1* | 9/2015 | Takagi | H10N 70/828 |
| | | | 257/5 |
| 2019/0006418 A1 | 1/2019 | Sel et al. | |
| 2019/0097132 A1* | 3/2019 | Rajamohanan | G06F 11/076 |
| 2019/0172532 A1 | 6/2019 | Futase | |
| 2019/0206934 A1* | 7/2019 | Kim | H01L 27/1225 |
| 2019/0267428 A1 | 8/2019 | Wu | |
| 2019/0295626 A1 | 9/2019 | Ikeda et al. | |
| 2020/0106011 A1 | 4/2020 | Chen et al. | |
| 2020/0127052 A1* | 4/2020 | Walker | H01L 43/08 |
| 2020/0312906 A1* | 10/2020 | Reznicek | G11C 5/063 |
| 2021/0210551 A1* | 7/2021 | Han | H01L 45/147 |

* cited by examiner

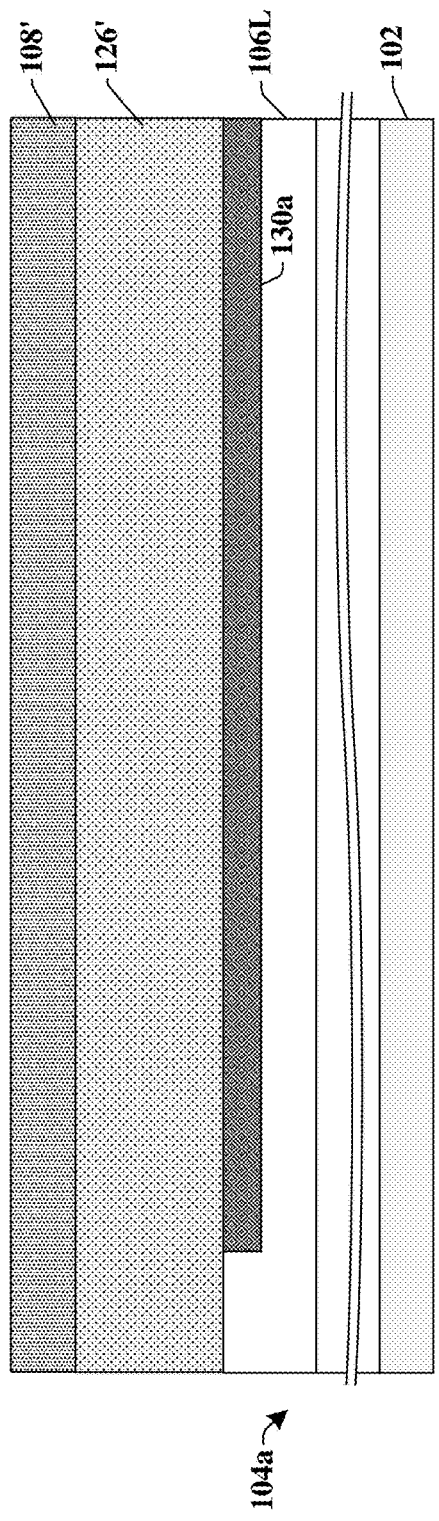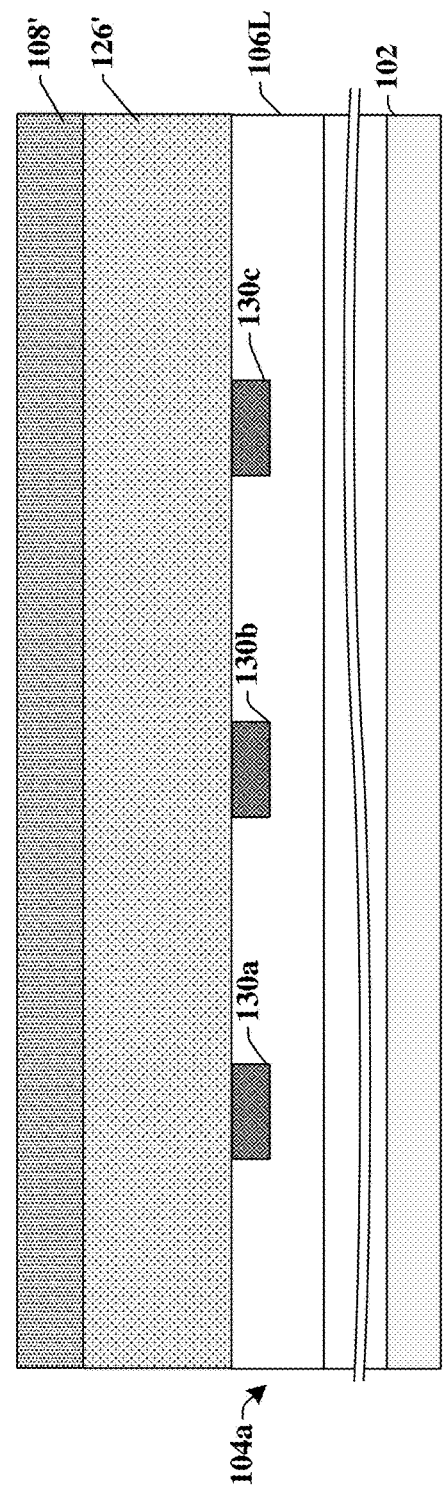

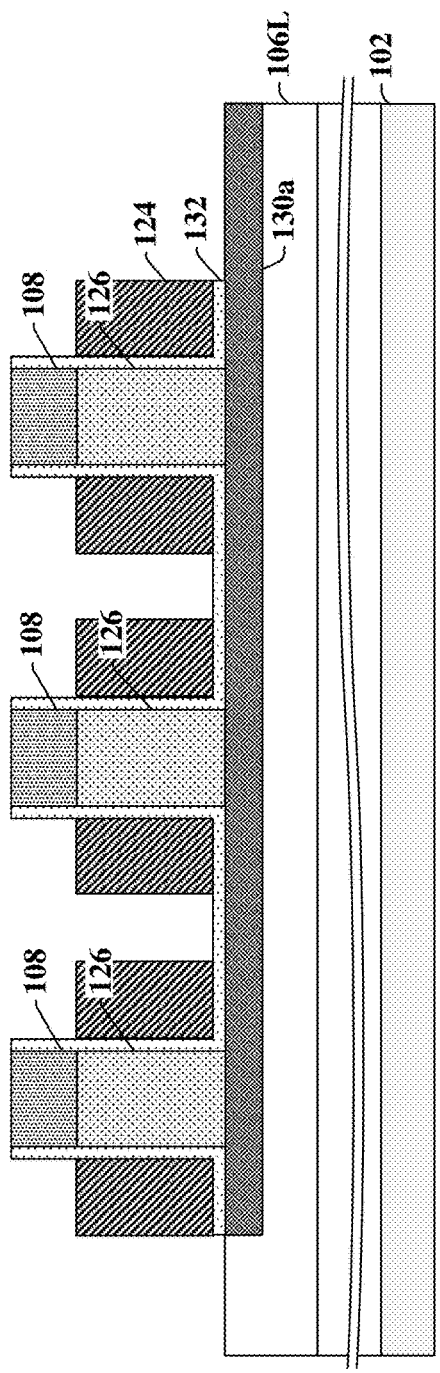
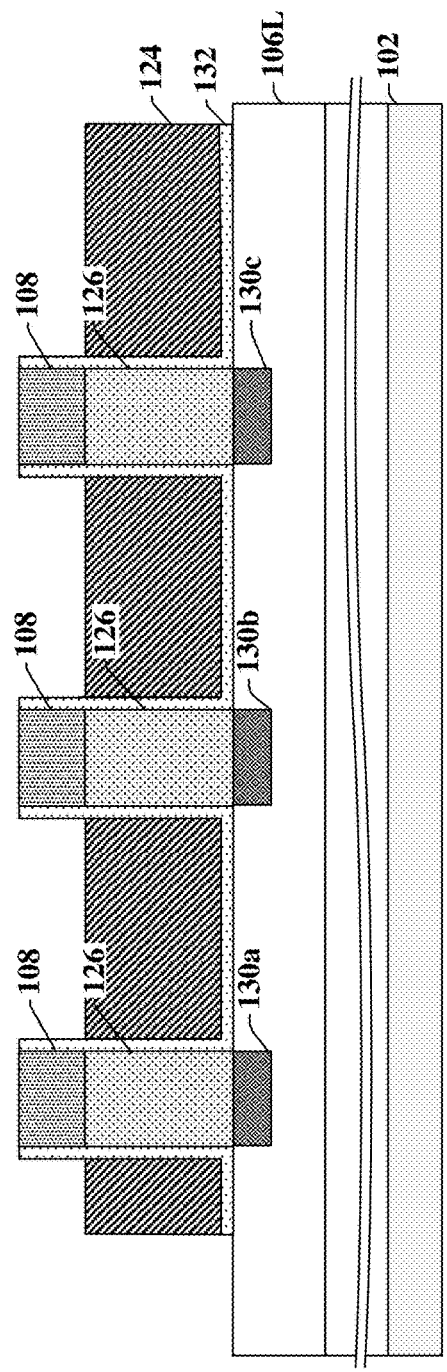
Fig. 15B
Fig. 15C

BACK-END-OF-LINE SELECTOR FOR MEMORY DEVICE

REFERENCE TO RELATED APPLICATION

This Application claims the benefit of U.S. Provisional Application No. 63/031,046, filed on May 28, 2020, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory is a promising candidate for a next generation non-volatile memory technology. This is because resistive random-access memory devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
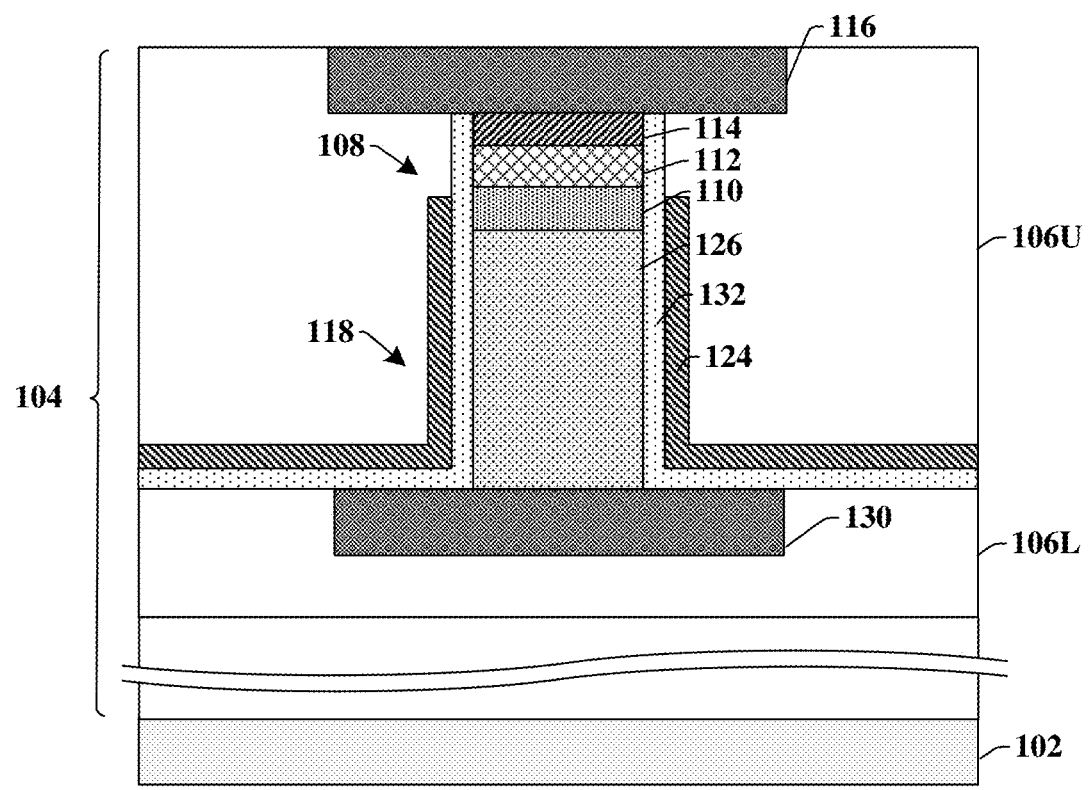
FIG. 1 illustrates a cross-sectional view of some embodiments of a memory device comprising a back-end-of-line (BEOL) selector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of clarity and does not in itself dictate a relationship between the various embodiments and/or configurations discussed. However, features described in one figure may be incorporated into embodiments described associated with another figure as additional embodiments when applicable and may not be repeated from simplicity reason.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry continues to improve the integration density of various electronic devices (e.g., transistors, diodes, resistors, capacitors, etc.) by, for example, reducing minimum feature sizes and/or arranging electronic devices closer to one another, which allows more components to be integrated into a given area. As the nodes of fabrication continue to shrink, front-end-of-line (FEOL) transistor becomes the major bottleneck to drive high-density non-volatile memories (NVMs), such as in magnetoresistive random access memory (MRAM) devices. MRAM's operation requires a high write current (for example, greater than 200 µA/µm). One way to obtain this high write current is to enlarge transistor dimensions or to adopt multiple transistors for one memory element. For example, some proposed schematics use two transistors or more for one memory element in order to have enough drive current. Those approaches pose a large FEOL area penalty.

In view of above, the present disclosure relates to a back-end-of-line (BEOL) transistor as a selector for a memory device and associated manufacturing methods to enable high-density non-volatile memory devices. In some embodiments, the memory device comprises a back-end interconnect structure disposed over a substrate and comprising a lower interconnect metal line and an upper interconnect metal line. A selector and a memory cell electrically connected to the selector are disposed between the upper interconnect metal line and the lower interconnect metal line. By placing the selector within the back-end interconnect structure over the lower interconnect metal line, front-end space is freed-up, and more integration flexibility is provided.

In some further embodiments, the selector has a vertical gate-all-around structure that provides better gate control compared to a planar selector. The selector may comprise a selector channel disposed on the lower interconnect metal line and a selector gate electrode wrapping around a sidewall of the selector channel and separating from the selector channel by a selector gate dielectric. The lower interconnect metal line may serve as one source/drain region for the selector and one of a bit line or a source line for the memory device. The memory cell may be placed on the selector channel, and the upper interconnect metal line may be arranged above the memory cell and serve as the other source/drain region for the selector and the other one of the source line or the bit line for the memory device. By stacking the memory cell directly on the selector channel, wire connection between the memory cell and the selector channel is eliminated, and electrical performance is improved.

In some embodiments, the selector channel may be or be comprised of polysilicon, amorphous silicon, or an oxide semiconductor (OS) material. For example, the selector channel may be or be comprised of indium gallium zinc oxide (IGZO). The OS material channel region provides ultra-low leakage currents ($I_{ON}/I_{OFF} > 10^{13}$) and can be used to fabricate a BEOL compatible transistor for memory devices. In some embodiments, the selector channel can have various shapes. For example, the selector channel can be a column having a top view of circle, square, single-fin, multiple fin, oval or other application shapes. The selector gate electrode can have a block shape or be a conformal layer enclosing the selector channel.

FIG. 1 illustrates a cross-sectional view of some embodiments of a memory device 100 comprising a selector 118. In some embodiments, the memory device 100 comprises an interconnect structure 104 disposed over a substrate 102 and a memory cell 108 disposed within the interconnect structure 104. The interconnect structure 104 comprises a plurality of stacked interconnect metal layers including a lower interconnect metal line 130 disposed within a lower ILD layer 106L and arranged between the memory cell 108 and the substrate 102 and an upper interconnect metal line 116 disposed within an upper ILD layer 106U and above the memory cell 108. The lower ILD layer 106L and the upper ILD layer 106U may each comprise one or more dielectric layers.

The memory cell 108 may comprise a bottom electrode 110, a data storage structure 112 arranged over the bottom electrode 110, and a top electrode 114 arranged over the data storage structure 112. The upper interconnect metal line 116 may extend through the upper ILD layer 106U to reach on the top electrode 114. In some embodiments, the bottom electrode 110 and the top electrode 114 respectively comprises tantalum nitride, titanium nitride, tantalum, titanium, platinum, nickel, hafnium, zirconium, ruthenium, iridium, or the like. In some embodiments, the data storage structure 112 is a magnetic tunnel junction (MTJ) or a spin-valve. In such cases, the memory cell 108 is referred as a magnetic memory cell, and the memory device 100 made of an array of such memory cells 108 is referred as a magnetoresistive random access memory (MRAM) device. In some alternative embodiments, the data storage structure 112 comprises a high-k dielectric material or other semiconductor material, such as nickel oxide (NiO), strontium titanate (Sr(Zr)TiO$_3$), hafnium dioxide (HfO$_2$), zirconium dioxide (ZrO$_2$), aluminum oxide (Al$_2$O$_3$), tantalum pentoxide (Ta$_2$O$_5$), hafnium aluminum oxide (HfAlO), hafnium zirconium oxide (HfZrO), or the like. In such cases, the memory cell 108 is referred as a resistive memory cell, and the memory device 100 made of an array of such memory cells 108 is referred as a resistive random access memory (ReRAM) device. In some further embodiments, the data storage structure 112 comprises a phase-change material, such as Ge$_2$Sb$_2$Te$_5$, and the memory device 100 made of an array of such data storage structures 112 is referred as a PCRAM device. Other structures for the data storage structure 112 and/or other memory-cell types for the memory cell 108 are also amenable.

The selector 118 is electrically connected to the memory cell 108 and configured to control writing/reading operations of the memory cell 108 by controlling the current flowing through the selector 118. In some embodiments, the selector 118 is disposed under and electrically coupled to the bottom electrode 110 of the memory cell 108. In some further embodiments, the selector 118 comprises a selector channel 126 disposed between the lower interconnect metal line 130 and the bottom electrode 110 and a selector gate electrode 124 wrapping around a sidewall of the selector channel 126 and separating from the selector channel 126 by a selector gate dielectric 132. During an operation, a biasing voltage is applied between the lower interconnect metal line 130 and the upper interconnect metal line 116. A gate voltage is applied to the selector gate electrode 124. If the gate voltage is sufficient, a channel path in the selector channel 126 is turned on, and the memory cell 108 can be read/written. By having the selector gate electrode 124 wrapping all-around the selector channel 126, better gate control is provided compared to using a planar selector. In some embodiments, the memory cell 108 is disposed directly on top of the selector channel 126. The memory cell 108 may have sidewalls vertically aligned with that of the selector channel 126. By placing the selector 118 back-end within the interconnect structure 104, front-end becomes available for other logic functions, and more integration flexibility is provided. By stacking the memory cell 108 directly on the selector channel 126, a wiring interconnection between the memory cell 108 and the selector channel 126 is eliminated, and electrical performance is improved.

In some embodiments, the selector channel 126 comprises polysilicon or amorphous silicon. In some other embodiments, the selector channel 126 comprises an oxide semiconductor (OS) material. For example, the channel layer can be made of such as indium gallium zinc oxide (IGZO), indium zinc oxide (IZO), indium tin oxide or indium titanium oxide (ITO), or another oxide semiconductor material. The selector channel 126 may have a thickness in a range of from about 10 nm to about 50 nm. The OS material channel region provides ultra-low leakage and can be used to fabricate a BEOL compatible transistor for memory devices. In some embodiments, the selector gate dielectric 132 comprises aluminum oxide (Al$_2$O$_3$), hafnium oxide (HfO$_2$), tantalum oxide (Ta$_2$O$_5$), Zirconium oxide (ZrO$_2$), titanium oxide (TiO$_2$), strontium titanium oxide (SrTiO$_3$), or other high-k dielectric materials. The selector gate dielectric 132 may have a thickness in a range of from about 1 nm to about 15 nm, or about 1 nm to about 5 nm. In some embodiments, the lower interconnect metal line 130 and the upper interconnect metal line 116 comprise metal materials such as titanium nitride (TiN), tantalum nitride (TaN), tungsten (W), copper (Cu), or the like. The lower interconnect metal line 130 and the upper interconnect metal line 116 may each have a thickness in a range of from about 5 nm to about 30 nm.

Figure 2:
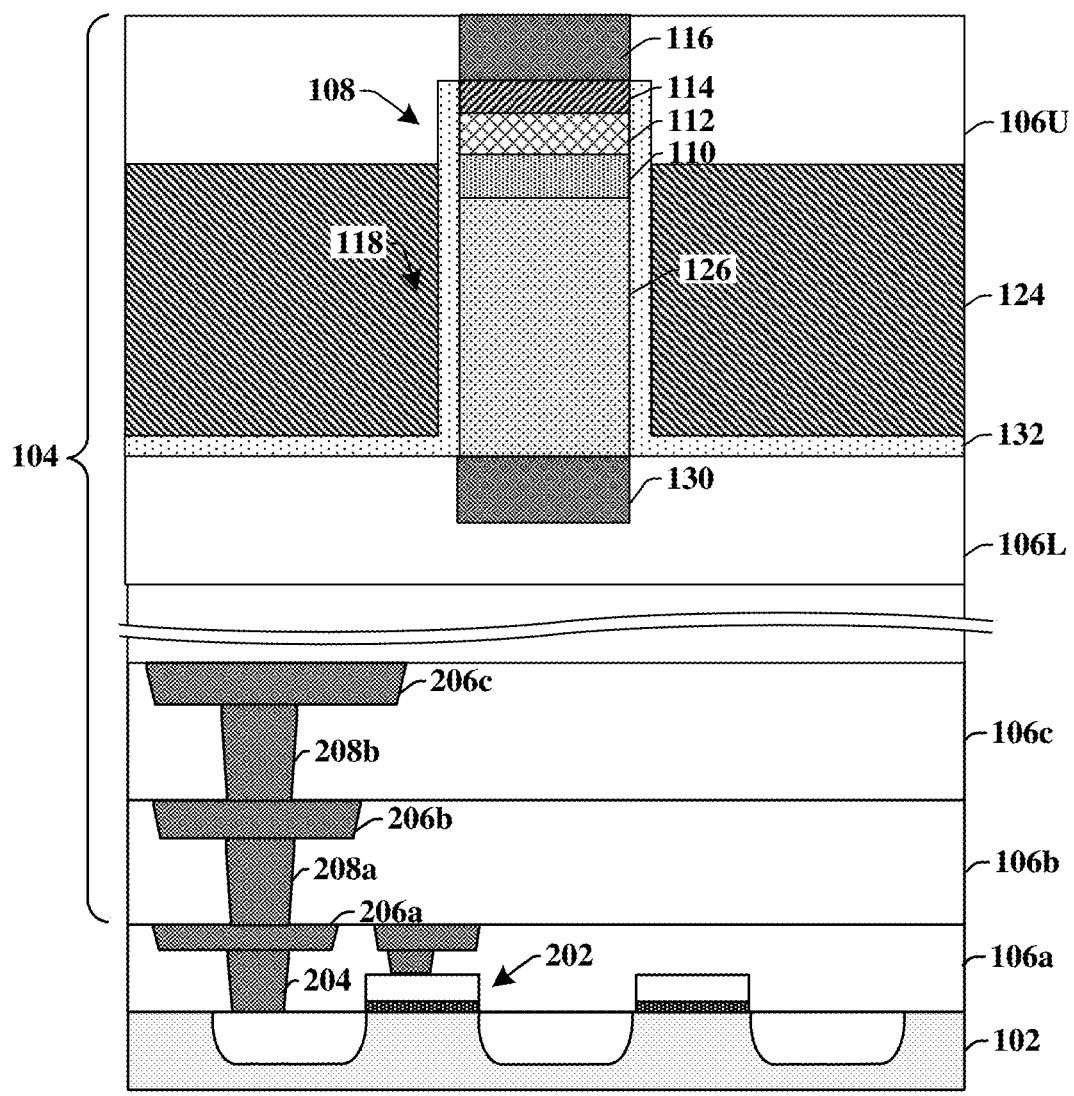
FIG. 2 illustrates a cross-sectional view of some additional embodiments of a memory device comprising a BEOL selector.

FIG. 2 illustrates a cross-sectional view of a memory device 200 comprising a selector 118 inserting in back-end-of-line according to some additional embodiments with more details. As shown in FIG. 2, in some embodiments, a logic device 202 is disposed within a substrate 102 and an ILD layer 106a. The logic device 202 may comprise a transistor device (e.g., a MOSFET device, a BJT, or the like). By inserting the selector 118 in back-end-of-line rather than front-end-of-line, other front-end devices including the logic device 202 is not restricted by structures of a selecting device, and more integration flexibility is provided. The logic device 202 may be a planar device, a FinFET device, a nanowire device, or other gate-all-around (GAA) devices.

An interconnect structure 104 is disposed over the logic device 202 and the substrate 102. The interconnect structure 104 comprises a plurality of stacked interconnect metal layers surrounded by stacked ILD layers and configured to provide electrical connection. In some embodiments, the interconnect metal layers may comprise a conductive contact 204 landing on the logic device 202 and interconnect lines 206a-206c and interconnect vias 208a-208b disposed over the conductive contact 204 and surrounded by stacked ILD layers 106a-106c. In some embodiments, the stacked ILD layers 106a-106c may comprise one or more of silicon dioxide, fluorosilicate glass, silicate glass (e.g., borophosphate silicate glass (BSG), phosphosilicate glass (PSG), borophosphosilicate glass (BPSG), fluorosilicate glass (FSG), undoped silicate glass (USG), or the like. In some embodiments, adjacent ILD layers 106a-106c may be separated by an etch stop layer (not shown) comprising a nitride, a carbide, or the like. The plurality of metal layers is referred by numerals in industry as M0, M1, M2, M3 . . . from a lower position closer to the substrate to an upper position away from the substrate.

The selector 118 is disposed over at least some of the plurality of stacked interconnect metal layers, for example, over the interconnect lines 206a-206c as shown in FIG. 2. In some embodiments, a lower ILD layer 106L is disposed over the interconnect lines 206a-206c and the stacked ILD layers 106a-106c, and a lower interconnect metal line 130 is disposed within the lower ILD layer 106L. In some embodiments, the selector 118 comprises a selector channel 126 disposed on the lower interconnect metal line 130. A selector gate dielectric 132 is disposed over the lower ILD layer 106L and extends upwardly along a sidewall of the selector channel 126. The selector gate dielectric 132 may be or be comprised of one or more dielectric layers of high-k dielectric materials such as aluminum oxide ($Al_2O_3$), hafnium oxide ($HfO_2$), tantalum oxide ($Ta_2O_5$), zirconium oxide ($ZrO_2$), titanium oxide ($TiO_2$), strontium titanium oxide ($SrTiO_3$), or the like. The selector gate dielectric 132 may be a conformal liner lining an upper surface of the lower ILD layer 106L and a sidewall surface of the selector channel 126. A selector gate electrode 124 may be disposed on the selector gate dielectric 132 and wrap around the sidewall of the selector channel 126. By having the selector gate electrode 124 wrapping all-around the selector channel 126, better gate control is provided compared to using a planar selector.

In some embodiments, a memory cell 108 is disposed directly on top of the selector channel 126. The memory cell 108 may have sidewalls vertically aligned with that of the selector channel 126. In some embodiments, an upper interconnect metal line 116 is disposed within an upper ILD layer 106U and directly on the memory cell 108. The lower ILD layer 106L and the upper ILD layer 106U may each comprise one or more dielectric layers (e.g., an oxide, a low-k dielectric, or an ultra low-k dielectric). By placing the selector 118 and the memory cell 108 between the upper interconnect metal line 116 and the lower interconnect metal line 130 within the interconnect structure 104, front-end space is saved for other logic functions, and more integration flexibility is provided. By stacking the memory cell 108 directly on the selector channel 126, a wiring interconnection between the memory cell 108 and the selector channel 126 is eliminated, and electrical performance is improved.

The interconnect lines 206a-206c under the lower interconnect metal line 130 are just shown for a non-limiting exemplary purpose. The selector 118 and the memory cell 108 can be flexibly positioned within various metal layers. Exact location of the selector 118 and the memory cell 108 can be determined with reference to the routing needs, and thus provide design flexibility.

Figure 3:
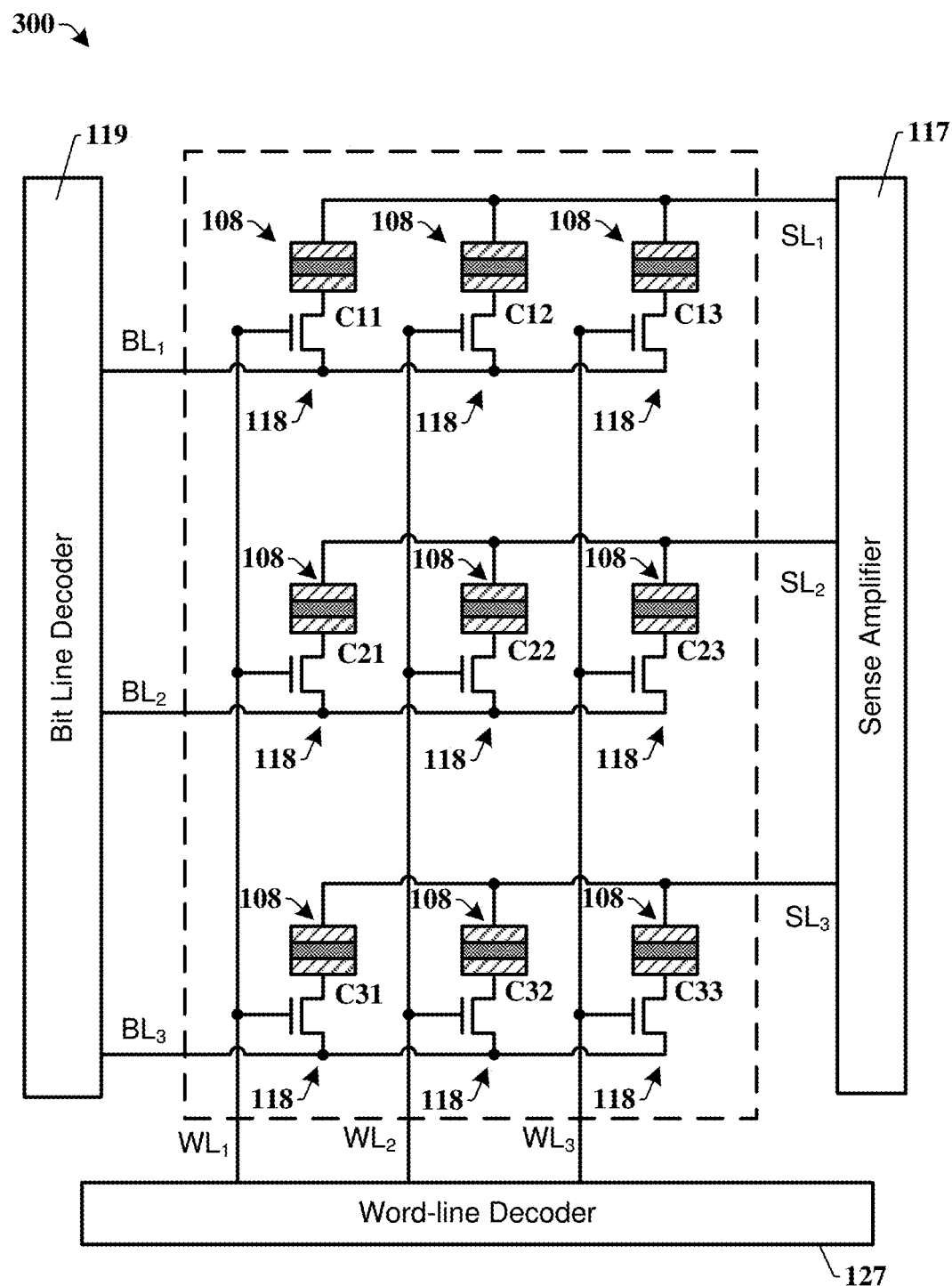
FIG. 3 illustrates a block diagram of some embodiments of a portion of a memory array having a plurality of memory units.

FIG. 3 illustrates a block diagram of a portion of a memory array 300 having a plurality of memory units C11-C33. The memory units C11-C33 are arranged within the memory array 300 in rows and/or columns. Although the memory array 300 is illustrated as having 3 rows and 3 columns, the memory array 300 may have any number of rows and any number of columns. Each of the memory units C11-C33 may include a memory cell 108 coupled to a selector 118. The selector 118 is configured to selectively provide access to the memory cell 108 selected while inhibiting leakage currents through non-selected memory units. Device structures disclosed associated with FIG. 1 or FIG. 2 can be incorporated as some embodiments of the individual memory units C11-C33 of the memory array 300.

The memory units C11-C33 may be controlled through bit-lines $BL_1$-$BL_3$, word-lines $WL_1$-$WL_3$, and source lines $SL_1$-$SL_3$. The word-lines $WL_1$-$WL_3$ may be used to operate the selectors 118 corresponding to the memory units C11-C33. When a selector 118 for a memory cell 108 is turned on, a voltage may be applied to that memory cell. A bit line decoder 119 applies a read voltage or a write voltage to one of the bit-lines $BL_1$-$BL_3$. A word line decoder 127 applies another voltage to one of the word-lines $WL_1$-$WL_3$, which turns on the selector 118 for the memory units C11-C33 in a corresponding row. Together, these operations cause the read voltage or the write voltage to be applied to a selected memory unit among the memory units C11-C33.

Appling a voltage to a selected memory cell 108 results in a current. During read operations, a sense amplifier 117 determines the programming state of the selected memory cell based on the current. The sense amplifier 117 may be connected to source lines $SL_1$-$SL_3$. Alternatively, the sense amplifier 117 may be connected to bit-lines $BL_1$-$BL_3$. The sense amplifier 117 may determine the programming state of the memory cell 108 based on the current. In some embodiments, the sense amplifier 117 determines the programming state of the memory cell 108 by comparing the current to one or more reference currents. The sense amplifier 117 may convey the programming state determination to an I/O buffer, which may be coupled to a driver circuit to implement write and write verify operations. The driver circuit is configured to select a voltage to apply to selected memory unit for read, write, and write-verify operations.

It will be appreciated that the voltage of significance is an absolute value of a potential difference across the memory cell 108. For the memory array 300, applying a voltage to a selected memory cell means operating a word line $WL_1$-$WL_3$ to turn on the selector 118 corresponding to that memory cell and using the driver circuit to make the absolute value of the potential difference between the source line $SL_1$-$SL_3$ and the bit line $BL_1$-$BL_3$ corresponding to that cell equal in magnitude to that voltage. In some embodiments, applying a voltage to a memory cell is accomplished by coupling a corresponding bit line $BL_1$-$BL_3$ to the voltage while holding a corresponding source line $SL_1$-$SL_3$ at a ground potential. Also, source lines $SL_1$-$SL_3$ may be held at other potentials and the roles bit-lines $BL_1$-$BL_3$, and source line $SL_1$-$SL_3$ may be reversed.

Figure 4A:
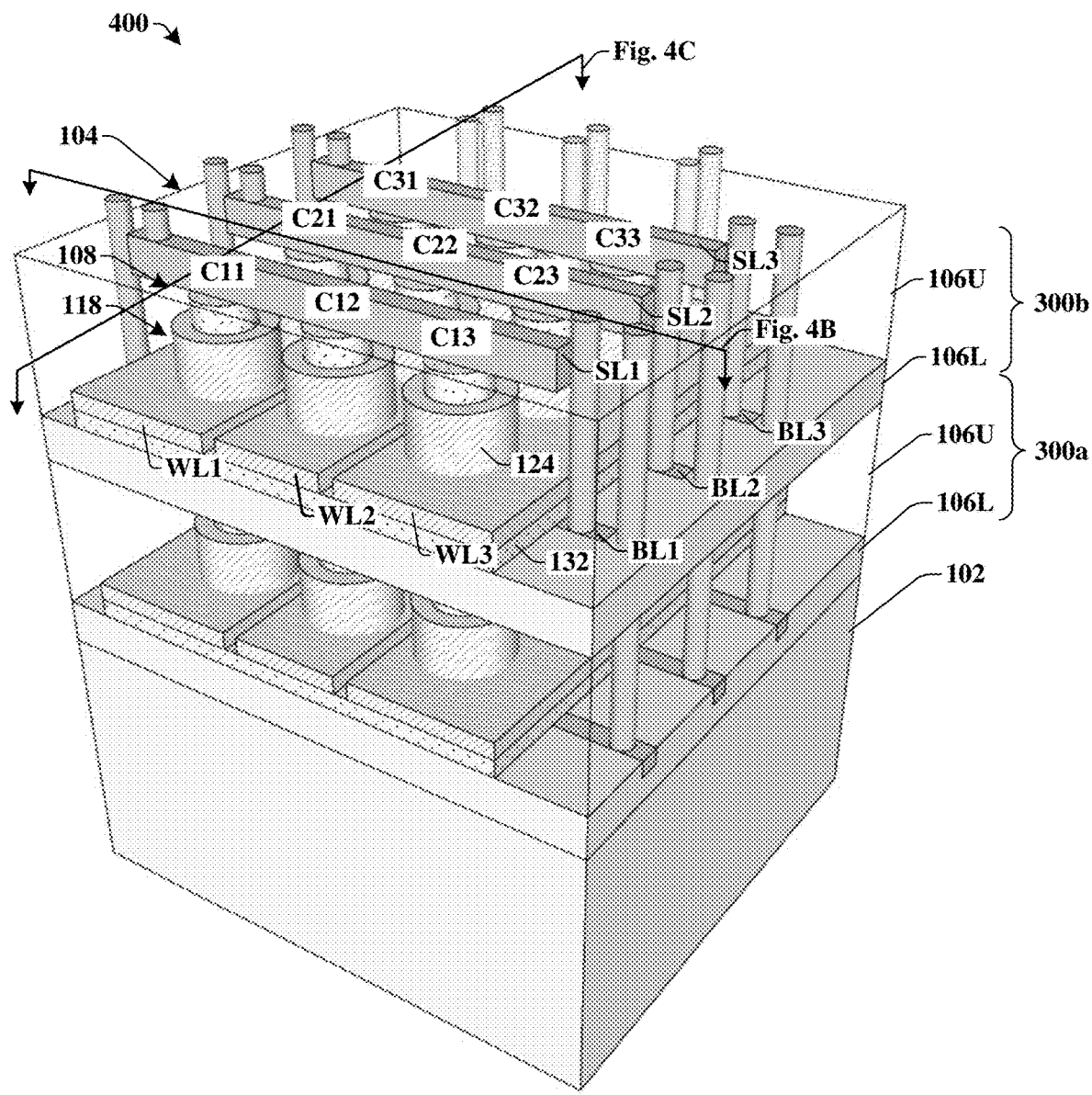
FIG. 4A illustrates a perspective view of some embodiments of a memory device comprising stacked memory arrays.
Figure 4B:
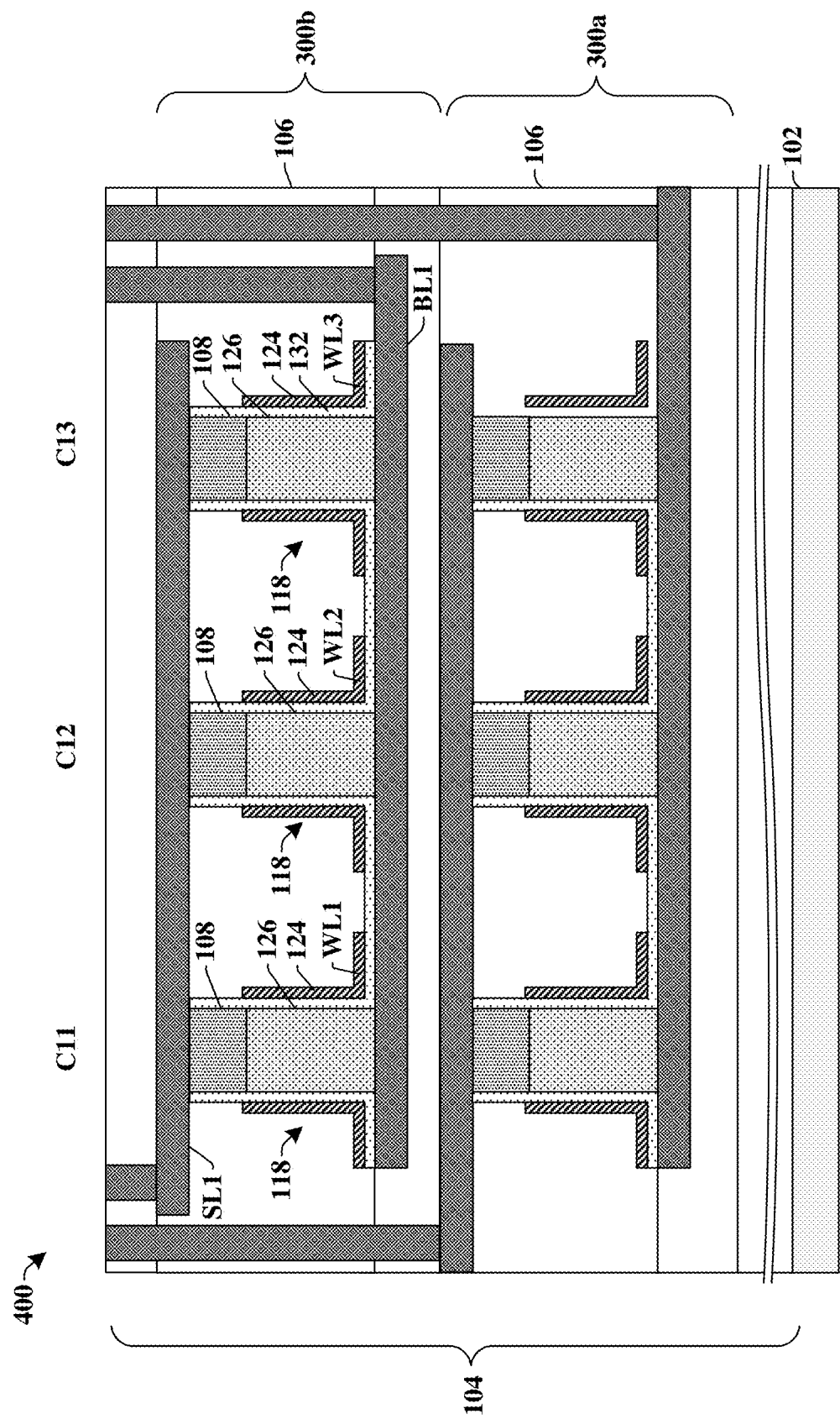
FIG. 4B illustrates a cross-sectional view of some embodiments of the memory device of FIG. 4A along a row direction.
Figure 4C:
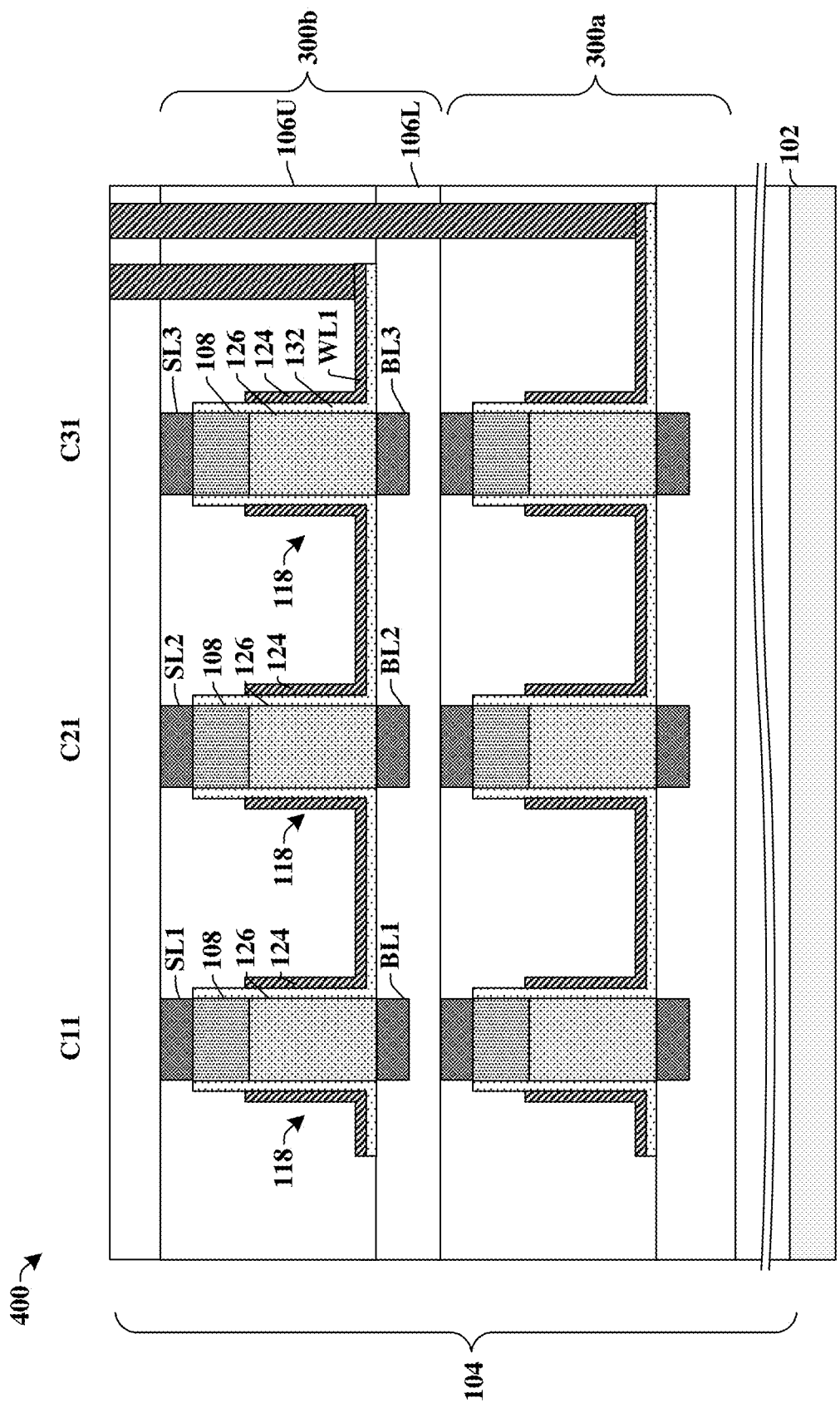
FIG. 4C illustrates a cross-sectional view of some embodiments of the memory device of FIG. 4A along a column direction.

FIGS. 4A-4C provide various views of a memory device 400 comprising stacked memory arrays according to some embodiments. The memory device 400 comprises stacked memory arrays 300a, 300b each comprises a plurality of memory units having a plurality of selectors 118 disposed within an interconnect structure 104 and correspondingly connected to a plurality of memory cells 108. The selectors 118 are configured to selectively provide access to the memory cells 108 selected while inhibiting leakage currents through non-selected memory units. The memory array 300 and the memory units C11-C33 disclosed associated with FIG. 3 can be incorporated as some embodiments of the memory arrays 300a, 300b of the memory device 400. Device structures disclosed associated with FIG. 1 or FIG. 2 can be incorporated as some embodiments of the memory units of the memory device 400. Although the memory device 400 is illustrated as having two stacked memory arrays 300a, 300b for illustration purpose, the memory device 400 may have more memory arrays stacked monolithically for greater integration.

As shown in FIG. 4A of a perspective view of the memory device 400 and shown in FIG. 4B of a cross-sectional view of the memory device 400 along a row direction according to some embodiments, the memory units of one row may share a first signal line and a second signal line disposed on opposite ends of the memory units. For example, the memory unites C11, C12, and C13, may share a common bit line $BL_1$ disposed under and connecting the selectors 118 and a common source line $SL_1$ disposed above and connecting the memory cells 108. Further as shown in FIG. 4C of a cross-sectional view of the memory device 400 along a column direction according to some embodiments, the memory units of one column may share a third signal line connecting gate electrodes of the selectors 118. For example, the memory units C11, C21, and C31 may share a common word line $WL_1$ surrounding and connecting individual selector gate electrodes 124 of the selectors 118. The first, second, and third signal lines may be further connected to upper levels of interconnects through vias and more metal layers not shown in the figures. In some embodiments, the common word line $WL_1$ and the selector gate electrodes 124 comprise the same conductive material or are made of one seamless integral layer. In other words, the selector gate electrodes 124 may extend between the memory units and also act as the common word line. In some embodiments, the selector gate electrodes 124 is a conformal conductive layer disposed between the column of the selectors 118 and extending upwardly along sidewalls of the selector channels 126.

Figure 5A:
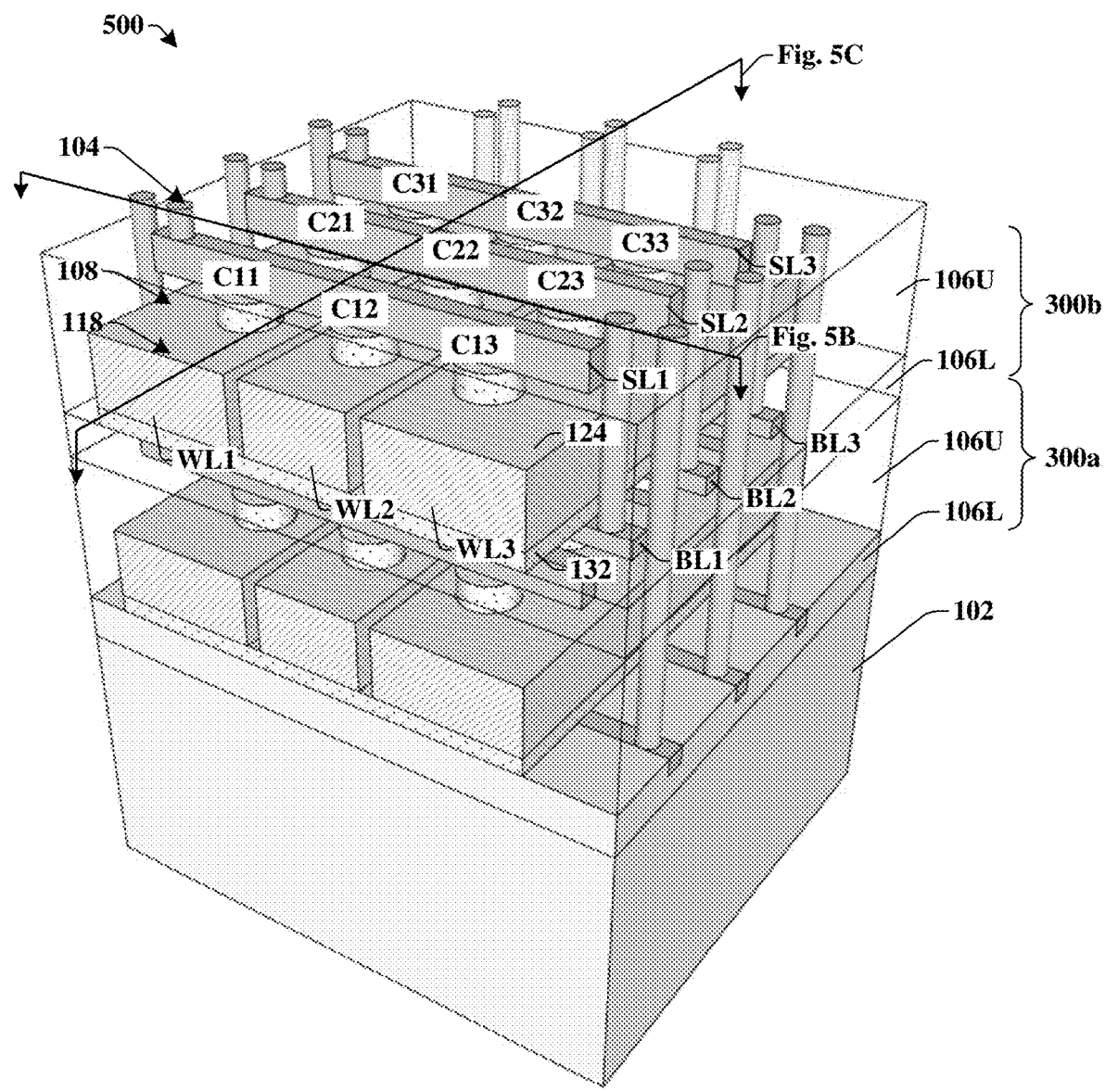
FIG. 5A illustrates a perspective view of some additional embodiments of a memory device comprising stacked memory arrays.
Figure 5B:
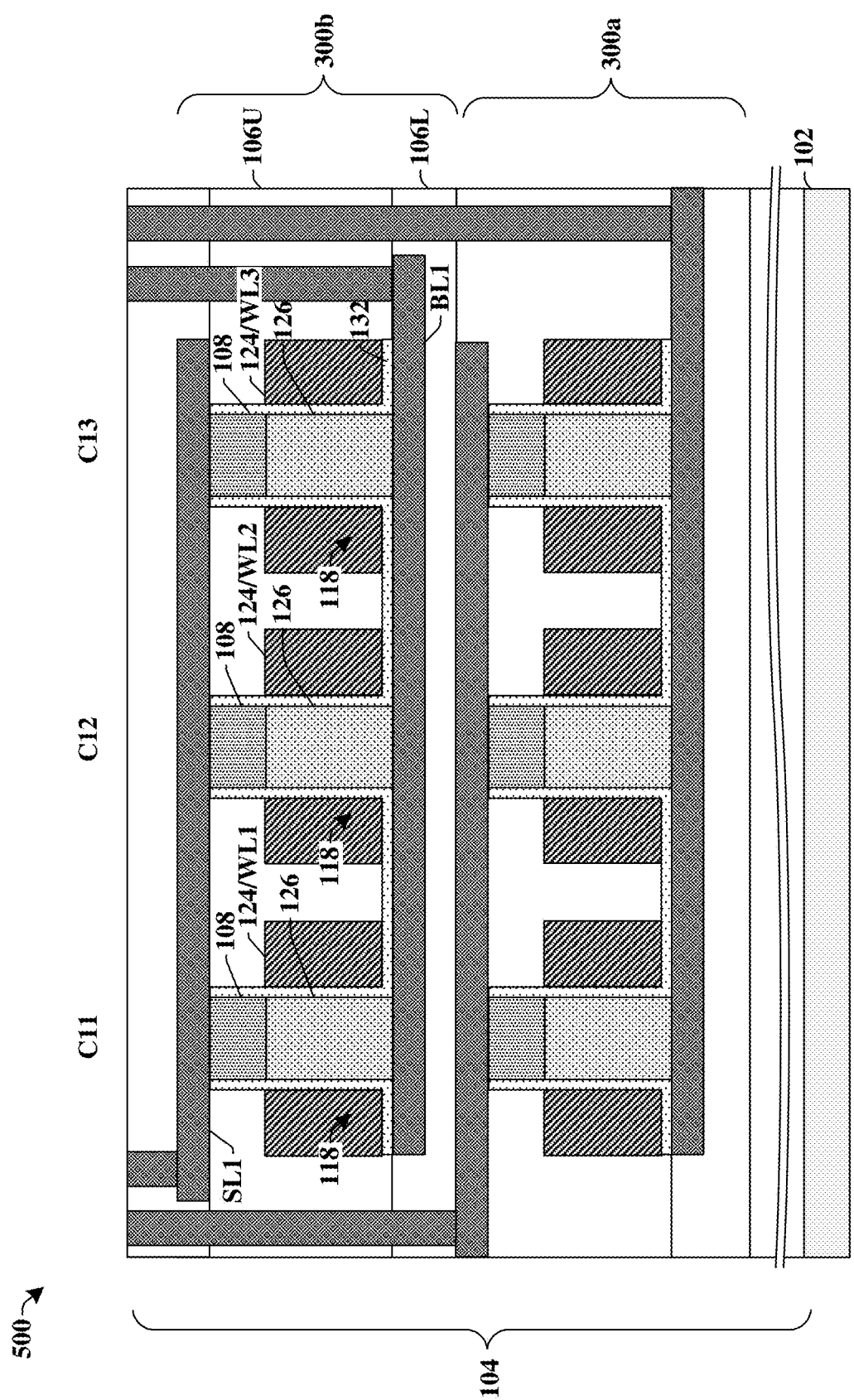
FIG. 5B illustrates a cross-sectional view of some embodiments of the memory device of FIG. 5A along a row direction.
Figure 5C:
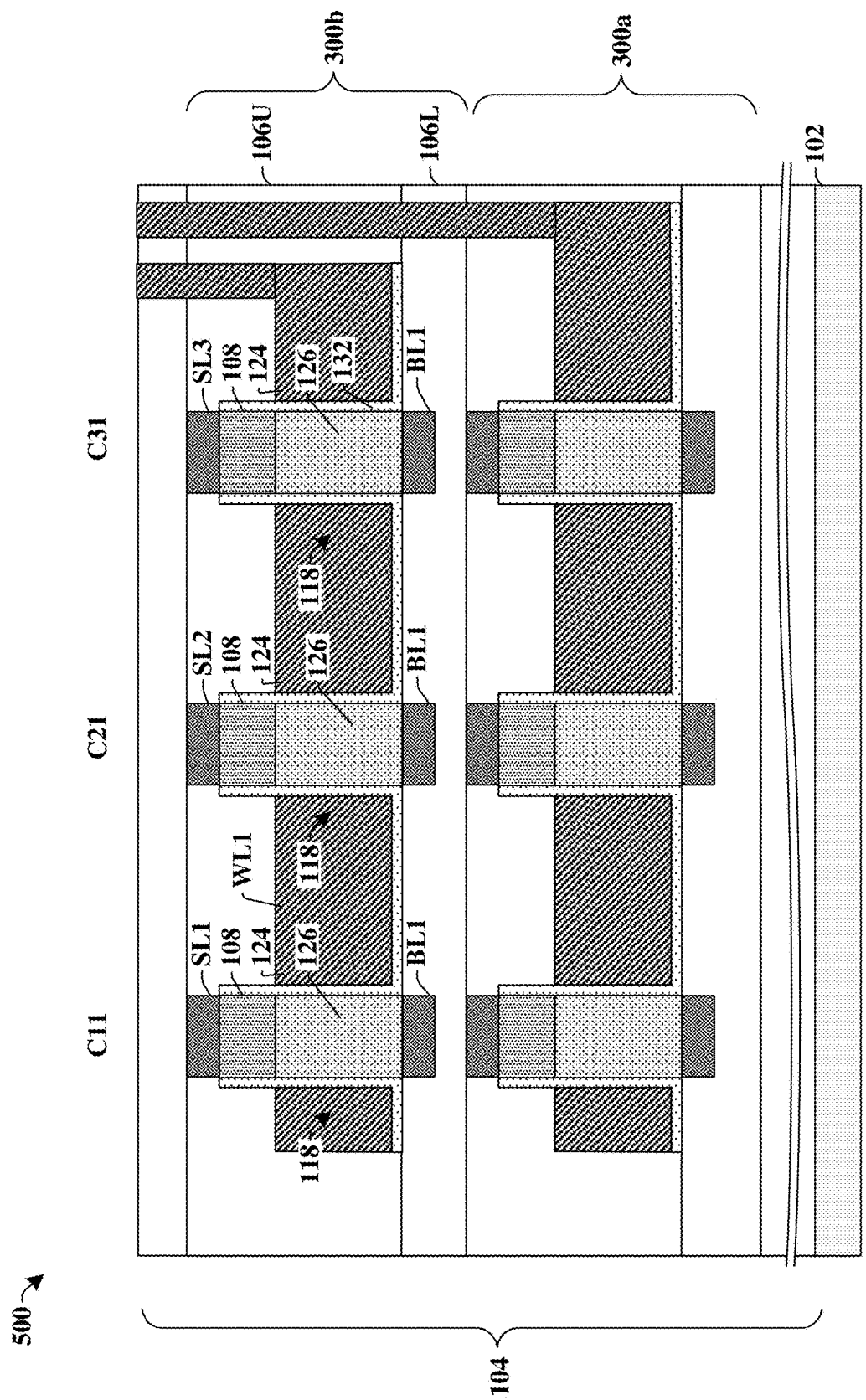
FIG. 5C illustrates a cross-sectional view of some embodiments of the memory device of FIG. 5A along a column direction.

FIGS. 5A-5C provide various views of a memory device 500 comprising stacked memory arrays according to some additional embodiments. Compared to FIGS. 4A-4C, in some alternative embodiments, the selector gate electrodes 124 have a different shape. A plurality of conductive blocks is disposed on the selector gate dielectric 132, extends in parallel and along the column direction, acts as the selector gate electrodes 124 and the common word lines WL1, WL2, WL3, and respectively surrounds and provides control to the selector channels 126.

Figure 6:
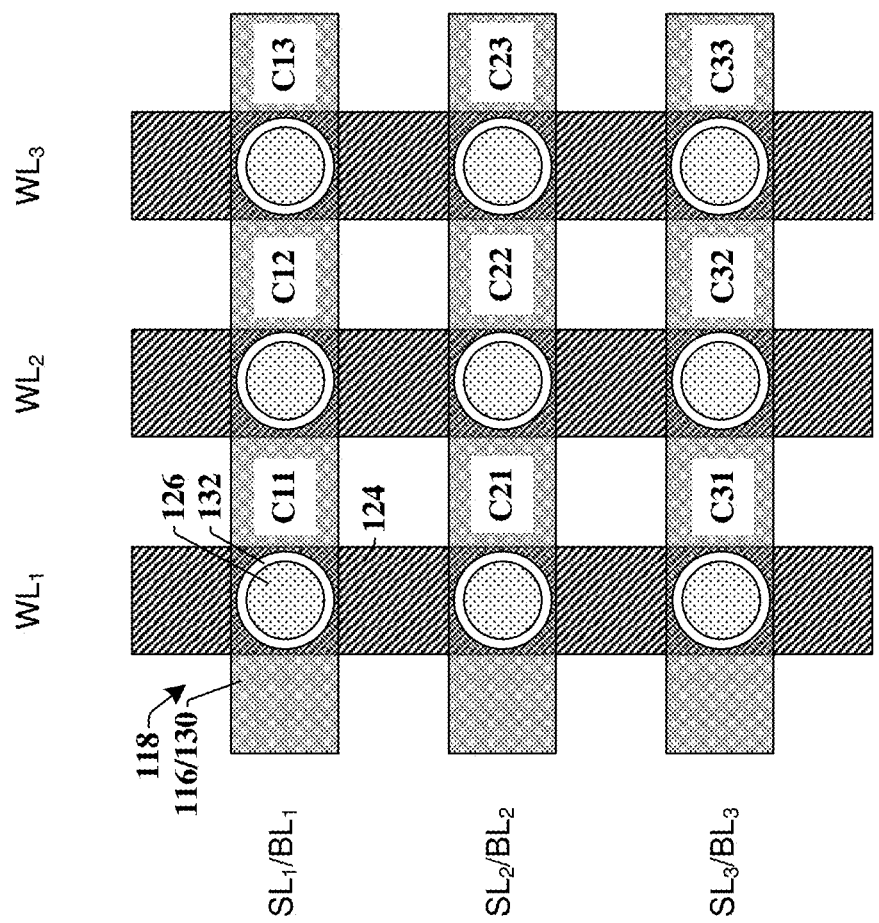
FIGS. 6-7 illustrate top views of some embodiments of a memory array showing corresponding selectors.
Figure 7:
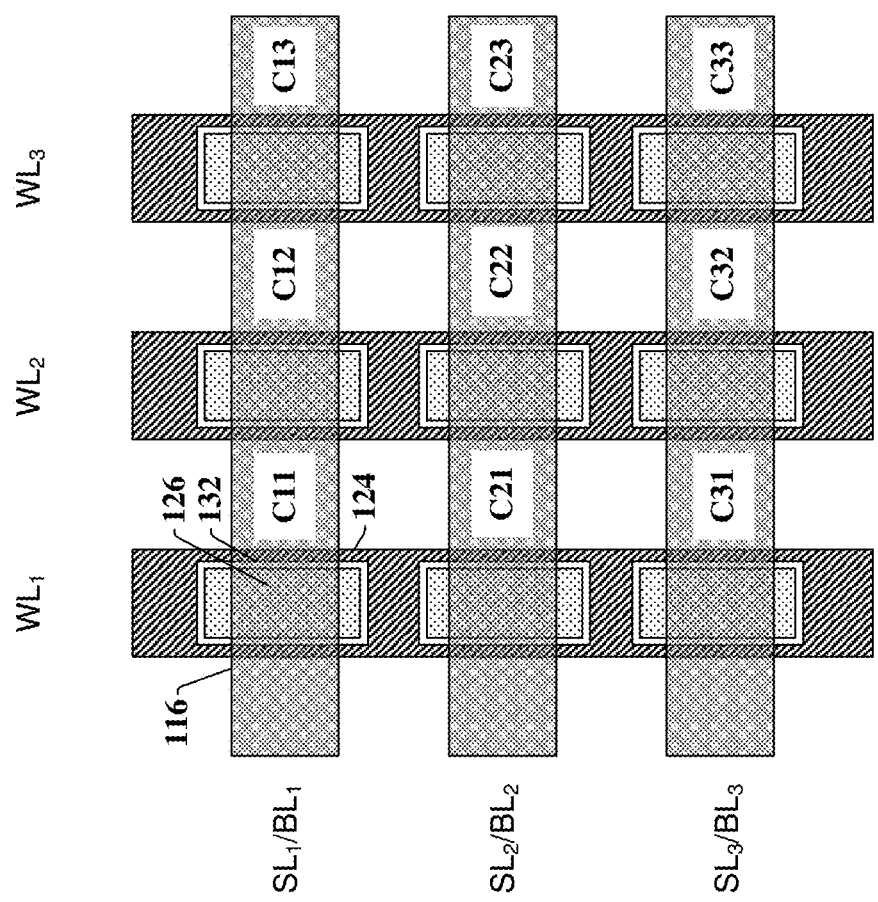

FIGS. 6-7 illustrate top views of the memory array 300 of FIG. 3 showing corresponding selectors 118 according to some embodiments. The numerals are only labeled for one memory unit C11 for simplicity, but can be applied similarly for other memory units. As shown by FIGS. 6-7, the selector channels 126 can be discrete islands enclosed by the selector gate dielectric 132. The selector gate dielectric 132 can have discrete ring shapes from a top view. The selector channels 126 can have various shapes. The selector gate electrode 124 encloses an outer peripheral of the selector gate dielectric 132. In some embodiments, the selector channel 126 has a centro-symmetrical shape such as a circle as shown in FIG. 6, a square, or other orthopolygons. In some alternative embodiments, the selector channel 126 is longer in a length direction of the common word lines $WL_1$, $WL_2$, $WL_3$ than a width direction of the common word lines $WL_1$, $WL_2$, $WL_3$ where the word lines $WL_1$, $WL_2$, $WL_3$ need to be separated, such that an area of the selector channel 126 can be enlarged by arranging a longer length of the selector channel 126. Examples of such selector channel 126 include an oval, or a rectangular as shown in FIG. 7. In some further alternative embodiments, the selector channel 126 may include multiple fins to further enlarge perimeters of the selector channel 126, such that the selector channel 126 is better controlled by the selector gate electrodes 124. Other applicable shapes not shown in the figures (e.g., a square, multiple fins, multiple round fins, etc.) are also amenable.

FIGS. 8A-18C illustrate various views of some embodiments of a method of forming a memory device comprising a BEOL selector. Although FIGS. 8A-18C are described in relation to a method, it will be appreciated that the structures disclosed in FIGS. 8A-18C are not limited to such a method, but instead may stand alone as structures independent of the method.

Figure 8A:
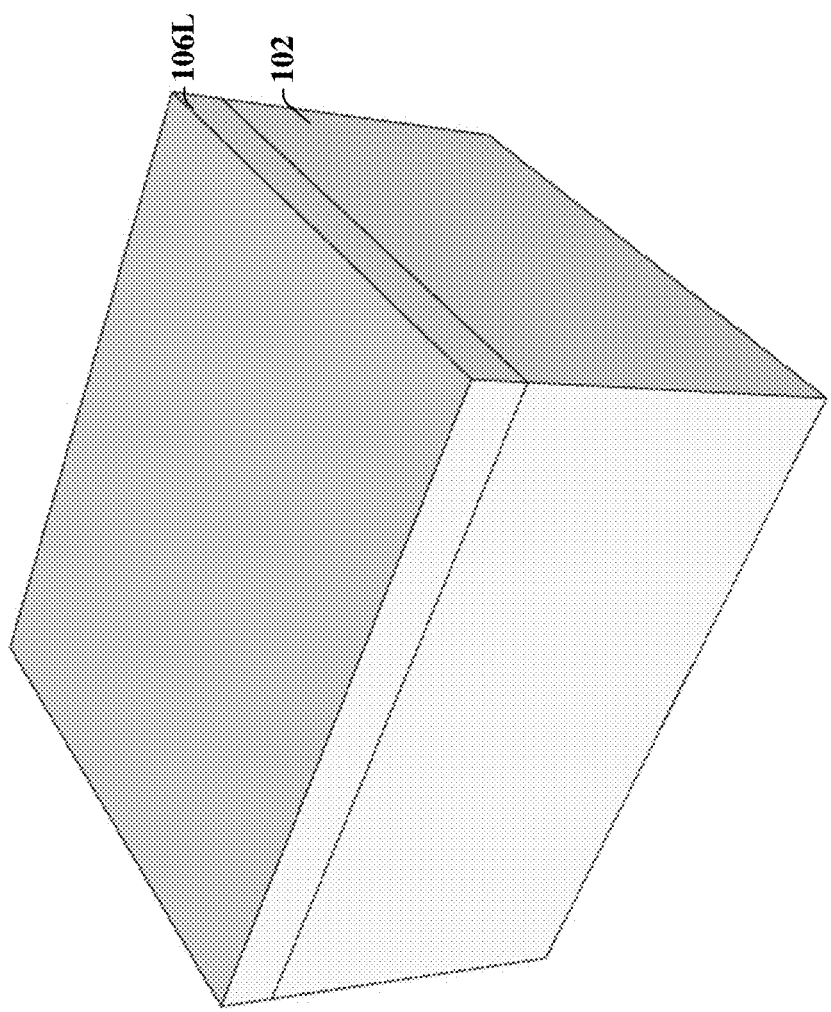
FIGS. 8A-23C illustrate various views of some embodiments of a method of forming a memory device comprising a BEOL selector.
Figure 8B:
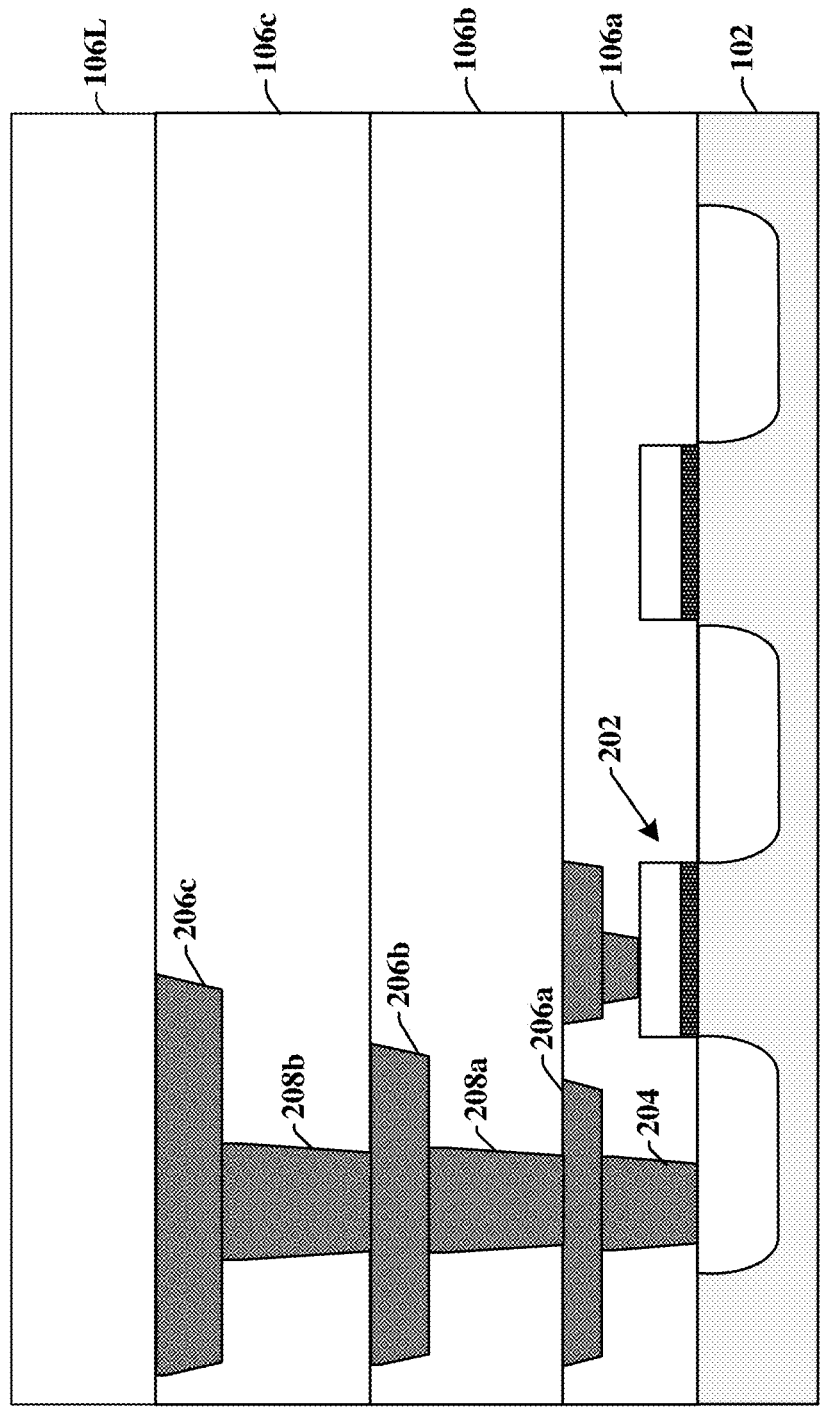

As shown in a perspective view of FIG. 8A and a cross-sectional view of FIG. 8B, a substrate 102 is provides, and a lower ILD layer 106L is formed over the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. Semiconductor devices are formed within the substrate 102. The semiconductor devices may comprise a transistor device (e.g., a MOSFET device, a BJT, or the like). The semiconductor devices may comprise a planar device, a FinFET device, a nanowire device, or other gate-all-around (GAA) devices. For example, as shown in FIG. 8B, a logic device 202 can be formed within the substrate 102 and surrounded by a first ILD layer 106a. One or more interconnect metal layers are formed on the substrate 102 prior to forming the lower ILD layer 106L. In some embodiments, the one or more interconnect metal layers may be formed by forming a conductive contact 204 for the logic device 202 and a first interconnect line 206a in the first ILD layer 106a, a second interconnect line 206b and a first interconnect via 208a in a second ILD layer 106b, and a third interconnect line 206c and a second interconnect via 208b in a third ILD layer 106c. The one or one or more interconnect metal layers may be formed by repeatedly forming an ILD layer (e.g., an oxide, a low-k dielectric, or an ultra low-k dielectric) over the substrate 102, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization process) to remove excess of the conductive material from over the ILD layer. The conductive contact 204, the interconnect line 206a/206b/206c, and the interconnect via 208a/208b shown in FIG. 8B are drawn for illustration purpose, and more or fewer layers of interconnect lines, vias and lower ILD layers can be adjusted by various applications. The semiconductor devices and the interconnect metal layers are omitted from figures hereafter.

Figure 9A:
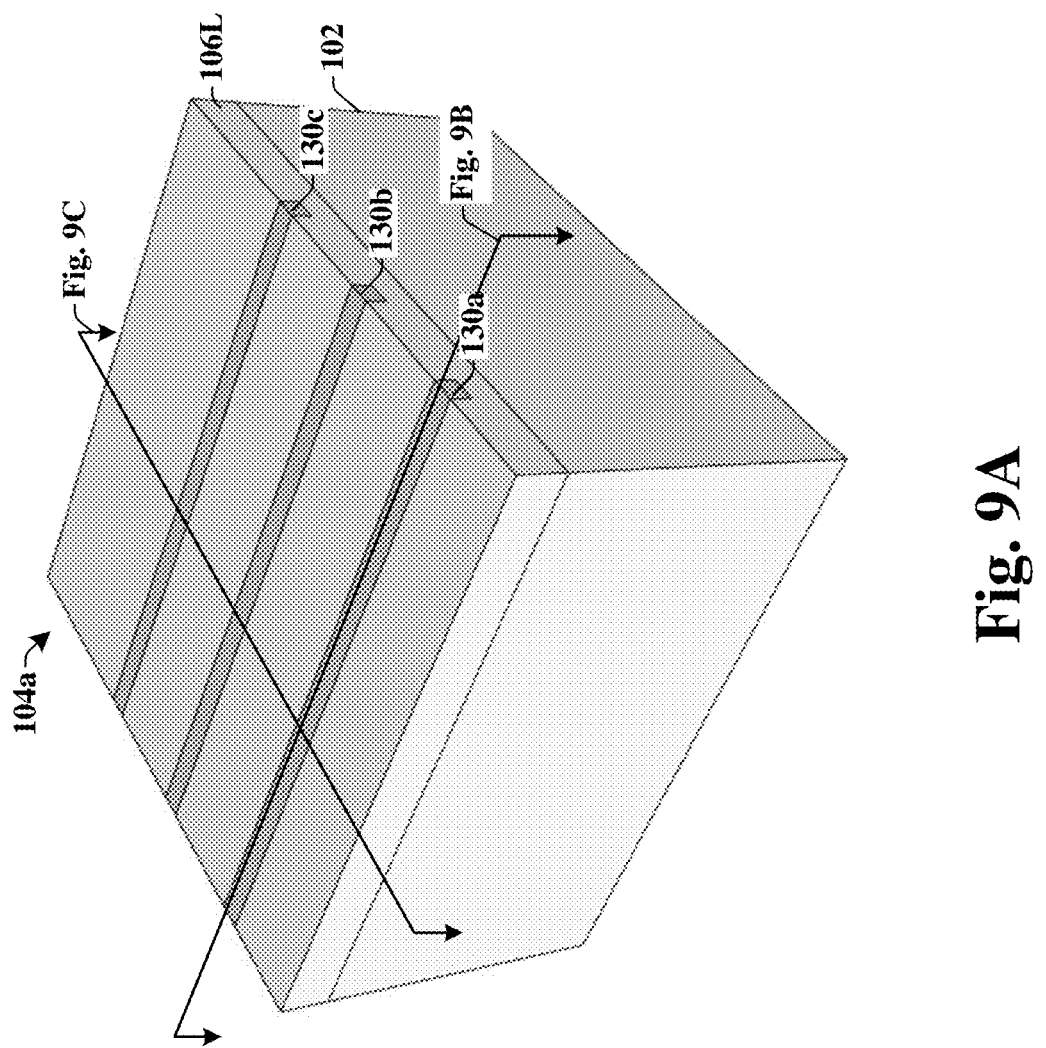
Figure 9B:
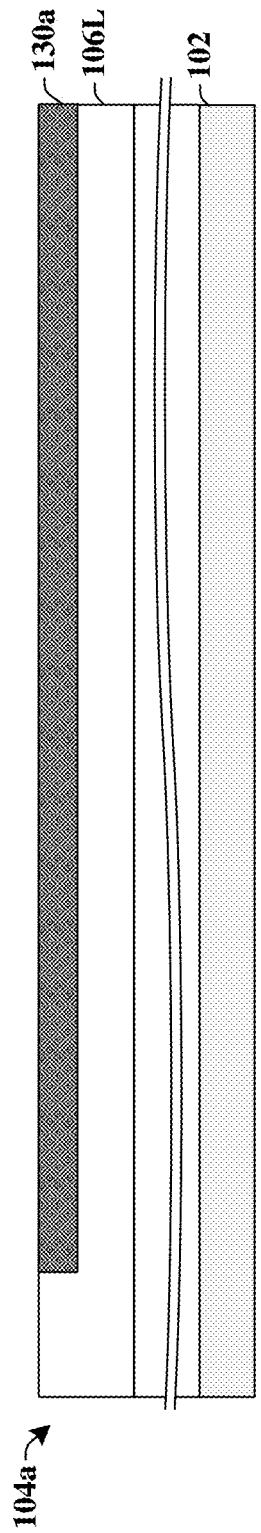
Figure 9C:
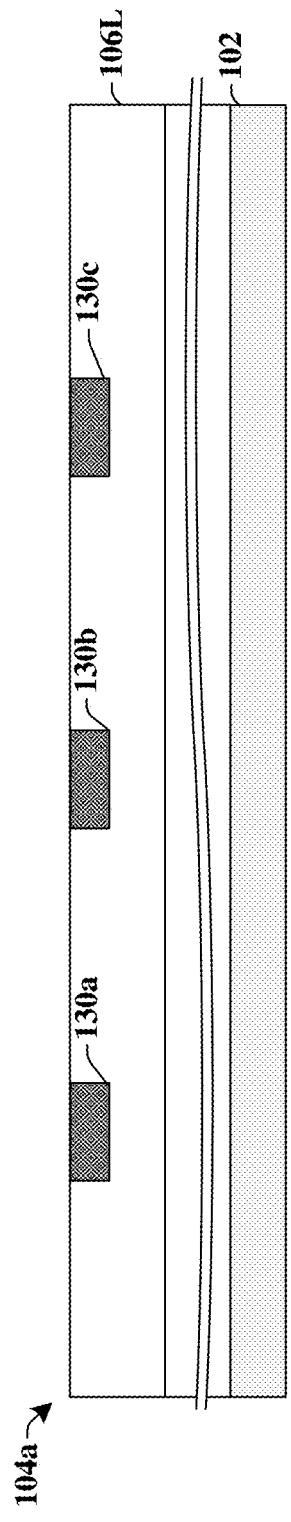

As shown in a perspective view of FIG. 9A and cross-sectional views of FIG. 9B and FIG. 9C, in some embodiments, a plurality of lower interconnect metal lines such as 130a, 130b, 130c shown in the figures is formed within the lower ILD layer 106L as part of a lower interconnect structure 104a. The lower interconnect metal lines 130a, 130b, 130c may function as first signal lines of the memory devices. In some embodiments, the first signal lines are bit lines. The lower interconnect metal lines 130a, 130b, 130c may be formed by selectively etching the lower ILD layer 106L to define a trench within lower ILD layer 106L, forming a conductive material (e.g., tungsten, copper, aluminum, etc.) within the trench, and performing a planarization process (e.g., a chemical mechanical planarization process) to remove excess of the conductive material from over the lower ILD layer 106L. In some embodiments, the lower interconnect metal lines 130a, 130b, 130c are formed by a conductive material same with the interconnect line 206a-206c. In some alternative embodiments, the lower interconnect metal lines is formed by a conductive material different from the interconnect line 206a-206c. In some embodiments, the lower interconnect metal lines 130a, 130b, 130c are formed by a deposition process followed by a planarization process (e.g., a chemical mechanical planarization process), and can have a thickness in a range of from about 5 nm to about 20 nm.

Figure 10A:
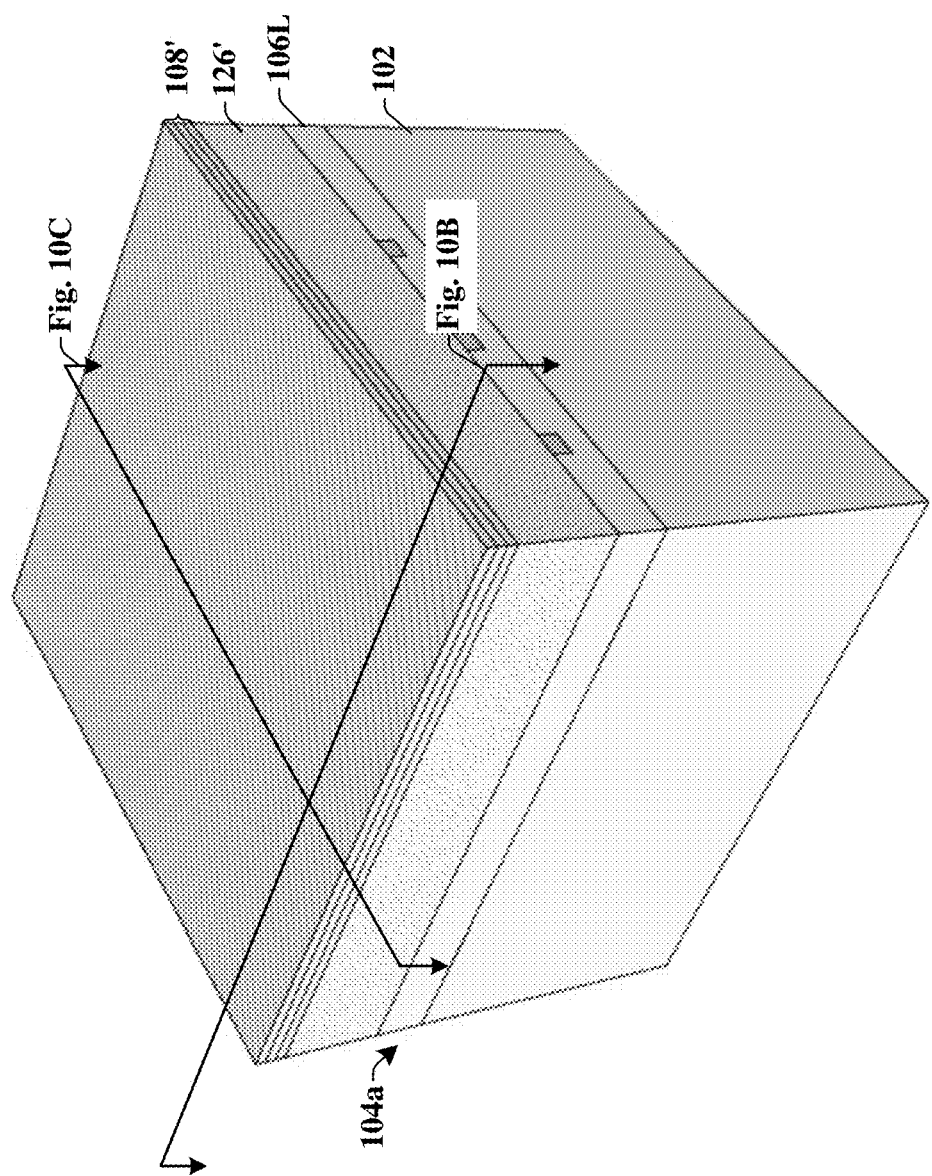

As shown in a perspective view of FIG. 10A and cross-sectional views of FIG. 10B and FIG. 10C, in some embodiments, a selector channel layer 126' and a stack of memory layers 108' are formed on the lower interconnect structure 104a. In some embodiments, the selector channel layer 126' and the memory layers 108' are formed by deposition techniques, such as such as physical vapor deposition (PVD), chemical vapor deposition (CVD), atomic layer depositions (ALD), or the like. The selector channel layer 126' can have a thickness in a range of from about 10 nm to about 50 nm. In some embodiments, the selector channel layer 126' comprises an oxide semiconductor (OS) material. For example, the selector channel layer 126' can be made of such as indium gallium zinc oxide (IGZO), indium zinc oxide (IZO), indium tin oxide or indium titanium oxide (ITO), or another oxide semiconductor material. The OS material provides ultra-low leakage currents ($I_{ON}/I_{OFF} > 10^{13}$) and is compatible to BEOL processes. In some embodiments, the memory layers 108' comprises a bottom electrode layer and a top electrode layer separated by a data storage structure. In some embodiments, the bottom electrode layer and the top electrode layer are made of tantalum nitride, titanium nitride, tantalum, titanium, platinum, nickel, hafnium, zirconium, ruthenium, iridium, or the like. The data storage structure may be made of a magnetic tunnel junction (MTJ), a spin-valve, a ferroelectric capacitor or junction, a high-k dielectric material, or a phase-change material. Other structures for the stack of memory layers 108' are also amenable. In some embodiments, a hard mask layer (not shown) may be formed over the stack of memory layers 108' to provide a masking function for the following patterning processes. In various embodiments, the hard mask layer may comprise a metal (e.g., titanium, titanium nitride, tantalum, or the like) and/or a dielectric material (e.g., silicon-nitride, silicon-carbide, or the like).

Figure 11A:
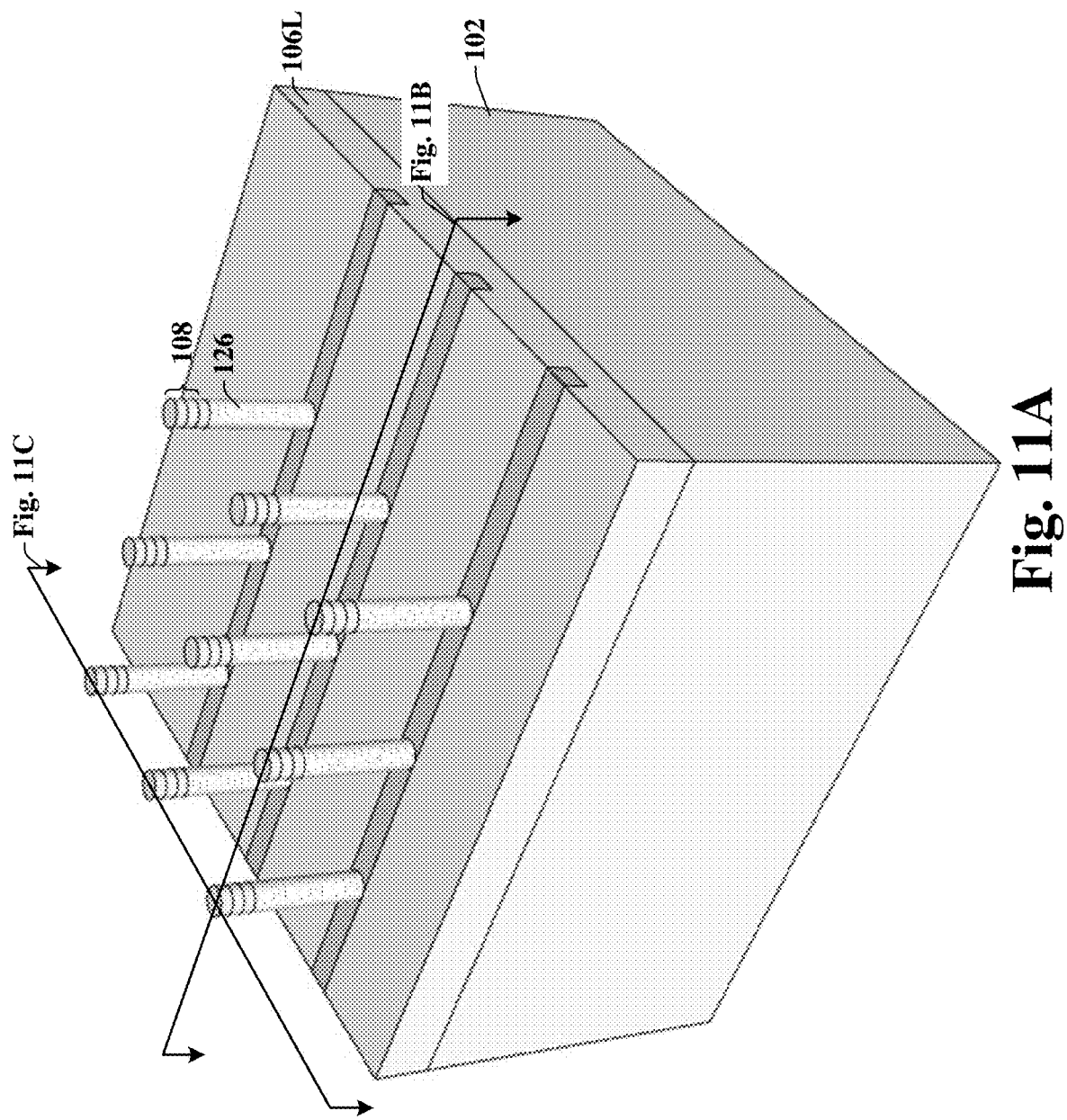
Figure 11B:
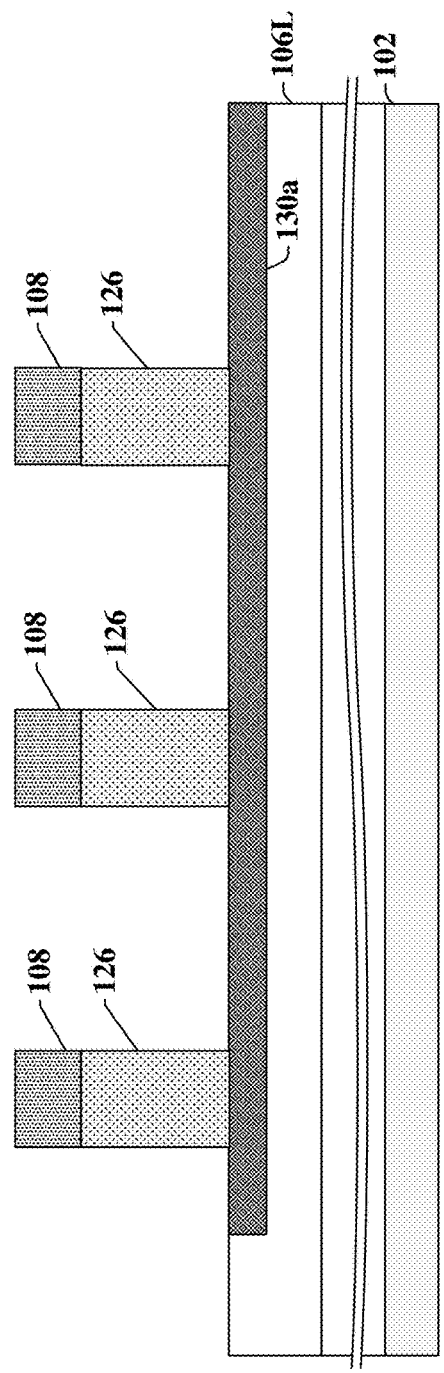
Figure 11C:
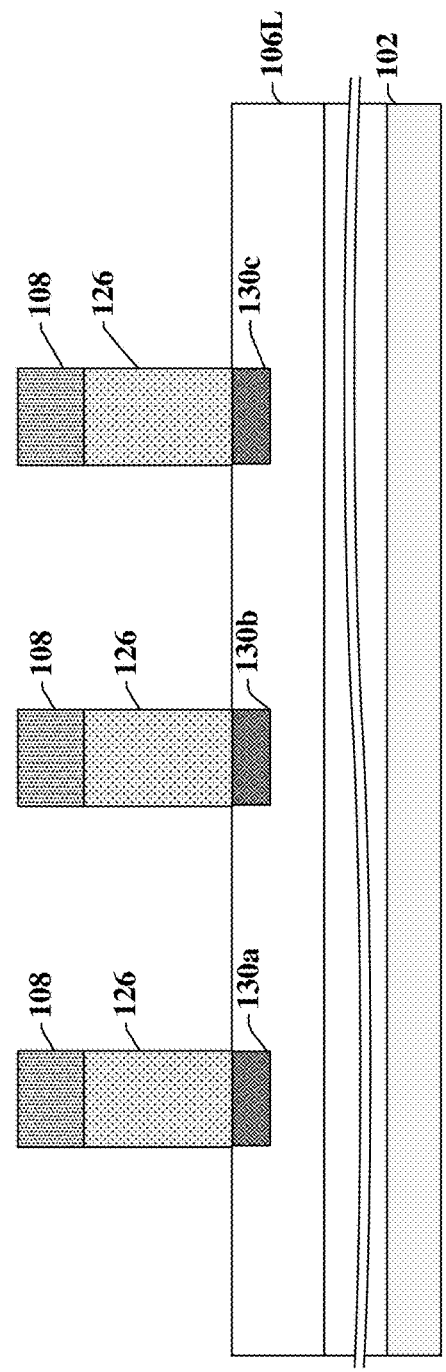

As shown in a perspective view of FIG. 11A and cross-sectional views of FIG. 11B and FIG. 11C, in some embodiments, the selector channel layer 126' and the stack of memory layers 108' are patterned to form an array of selector channels 126 and an array of memory cells 108 in rows and columns. In some embodiments, the selector channels 126 and the memory cells 108 are formed with sidewalls vertically aligned. By forming the memory layers 108' and the selector channel layer 126' consecutively prior to patterning to form the selector channels 126 and the memory cells 108, manufacturing processes are simplified. In addition, by stacking the memory cells 108 directly on the selector channels 126, wire connections between the memory cells 108 and the selector channels 126 are eliminated, and thus electrical performance is improved. In some embodiments, the selector channels 126 can be formed as a circle, a square, or other orthopolygons. In some alternative embodiments, the selector channels 126 can have an axial symmetrical shape such as an oval or a rectangular. In some further alternative embodiments, the selector channels 126 may include multiple fins to further enlarge perimeters of the selector channels 126 and thus increase control of the selector channels 126.

In some alternative embodiments, the selector channel layer 126' and the stack of memory layers 108' are formed and patterned separately. The stack of memory layers 108' may be formed after patterning the selector channel layer 126' to form the selector channels 126. The stack of memory layers 108' is then patterned by one or more additional patterning processes. For example, a first patterning process is performed to define a top electrode and a data storage structure. A sidewall spacer may then be formed along sidewalls of the data storage structure and the top electrode and used as a mask together with the top electrode to perform a second patterning process to the bottom metal layer to define a bottom electrode. By forming and patterning the stack of memory layers 108' after forming the selector channels 126, more flexibility is provided for layout design of the memory cells 108.

Figure 12A:
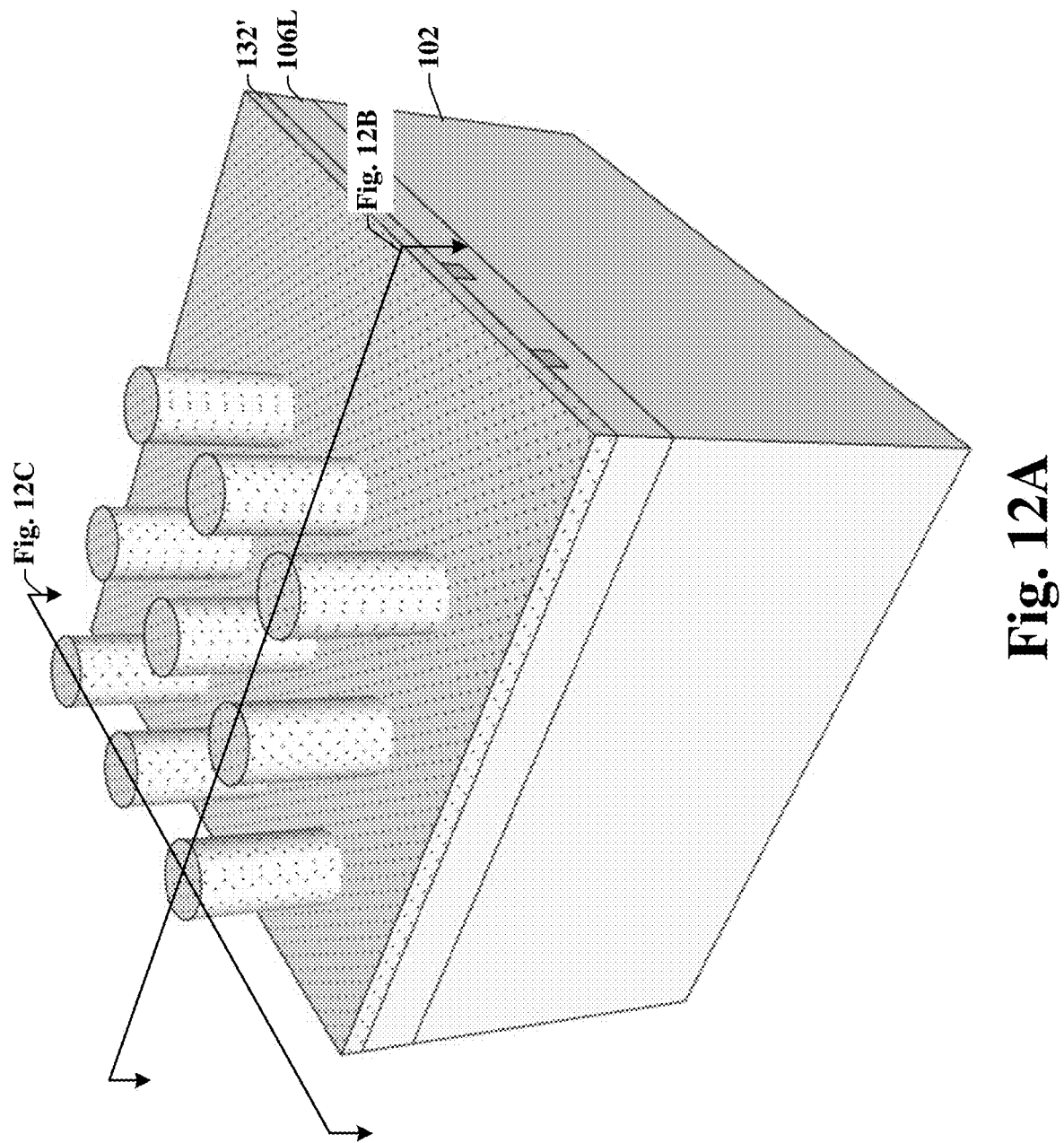
Figure 12B:
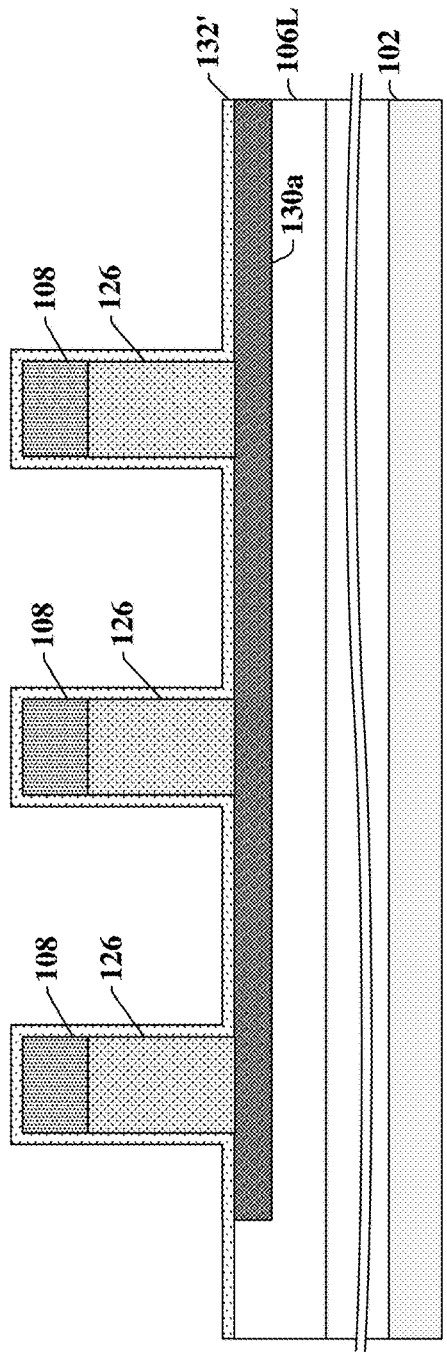
Figure 12C:
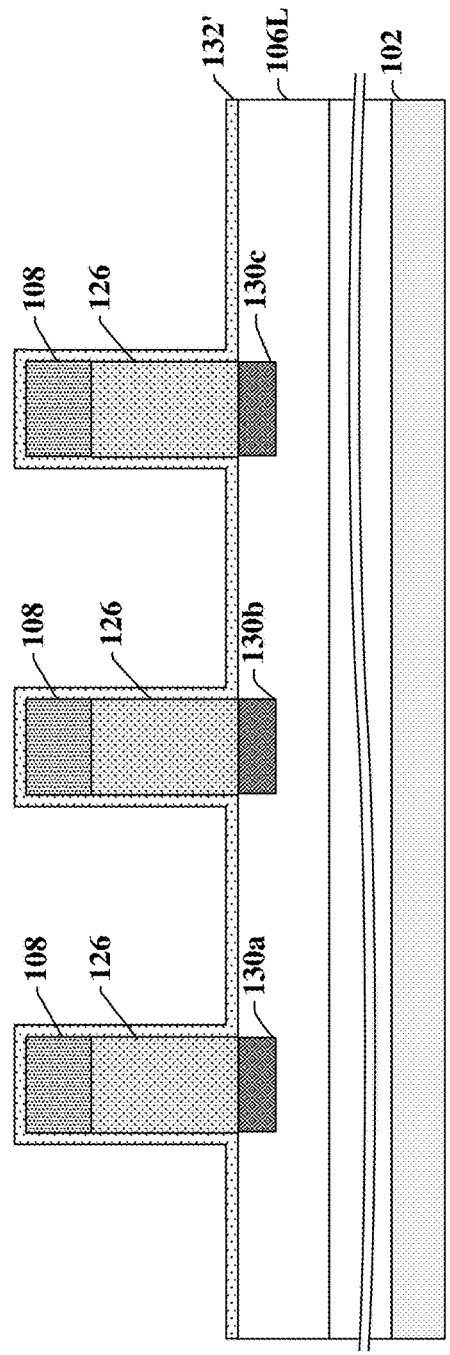

As shown in a perspective view of FIG. 12A and cross-sectional views of FIG. 12B and FIG. 12C, in some embodiments, a selector gate dielectric layer 132' is formed along upper surfaces of the lower ILD layer 106L and the lower interconnect metal lines 130a, 130b, 130c and extending upwardly covering sidewalls of the selector channels 126 and the memory cells 108. In some embodiments, the selector gate dielectric layer 132' is formed by deposition techniques, such as atomic layer depositions (ALD). The selector gate dielectric layer 132' can have a thickness in a range of from about 1 nm to about 15 nm. In some embodiments, the selector gate dielectric layer 132' comprises aluminum oxide ($Al_2O_3$), Hafnium oxide ($HfO_2$), tantalum oxide ($Ta_2O_5$), Zirconium oxide ($ZrO_2$), Titanium oxide ($TiO_2$), strontium titanium oxide ($SrTiO_3$), or another high-k dielectric material, among others.

Figure 13A:
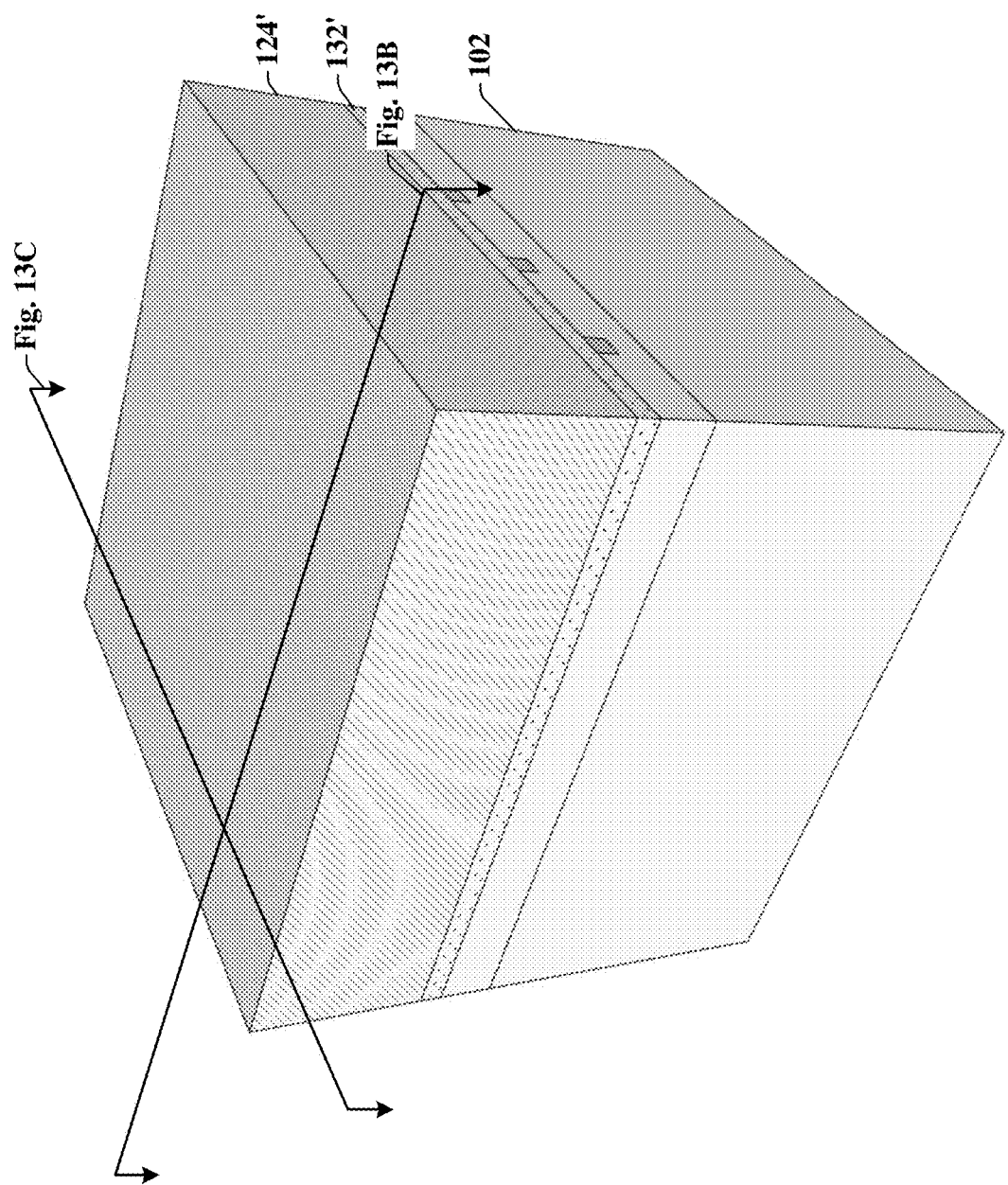
Figure 13B:
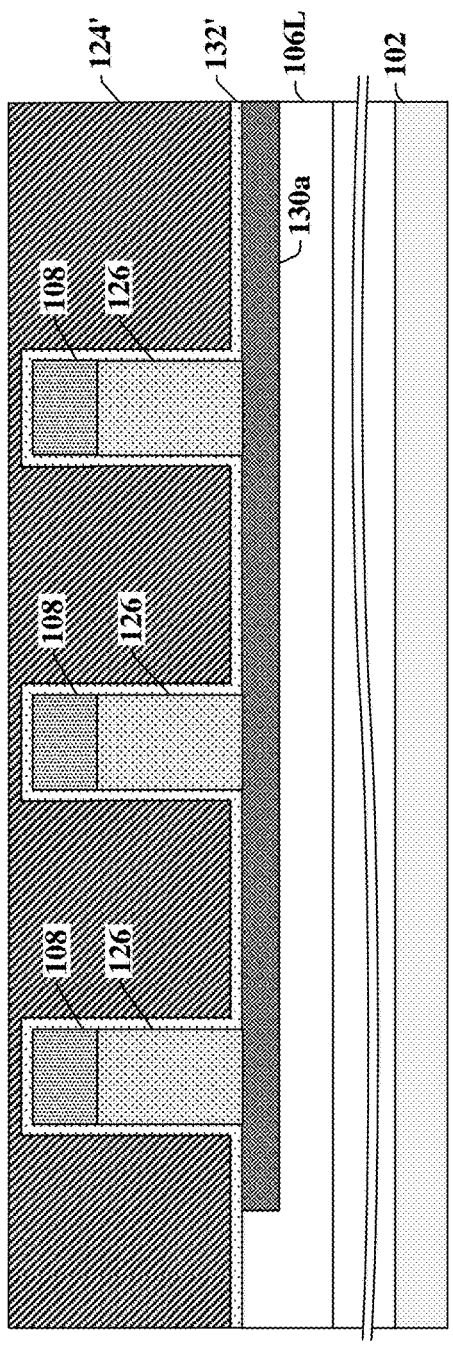
Figure 13C:
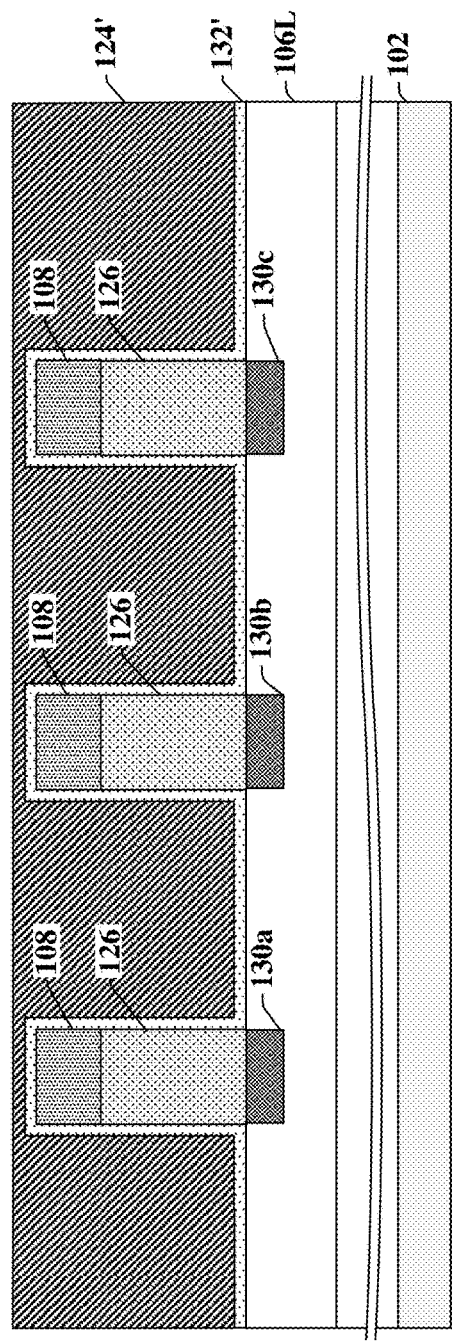

As shown in a perspective view of FIG. 13A and cross-sectional views of FIG. 13B and FIG. 13C, in some embodiments, a selector gate electrode layer 124' is formed on the selector gate dielectric layer 132' surrounding the selector channels 126 and memory cells 108. In some embodiments, the selector gate electrode layer 124' is formed by a deposition process. The selector gate electrode layer 124' can have a thickness in a range of from about 20 nm to about 150 nm. In some embodiments, the selector gate electrode layer 124' can be formed by titanium nitride (TiN), tantalum nitride (TaN), tungsten (W), copper (Cu), or other CMOS contact metals and/or doped semiconductor material (e.g., p-doped or n-doped polysilicon).

Figure 14A:
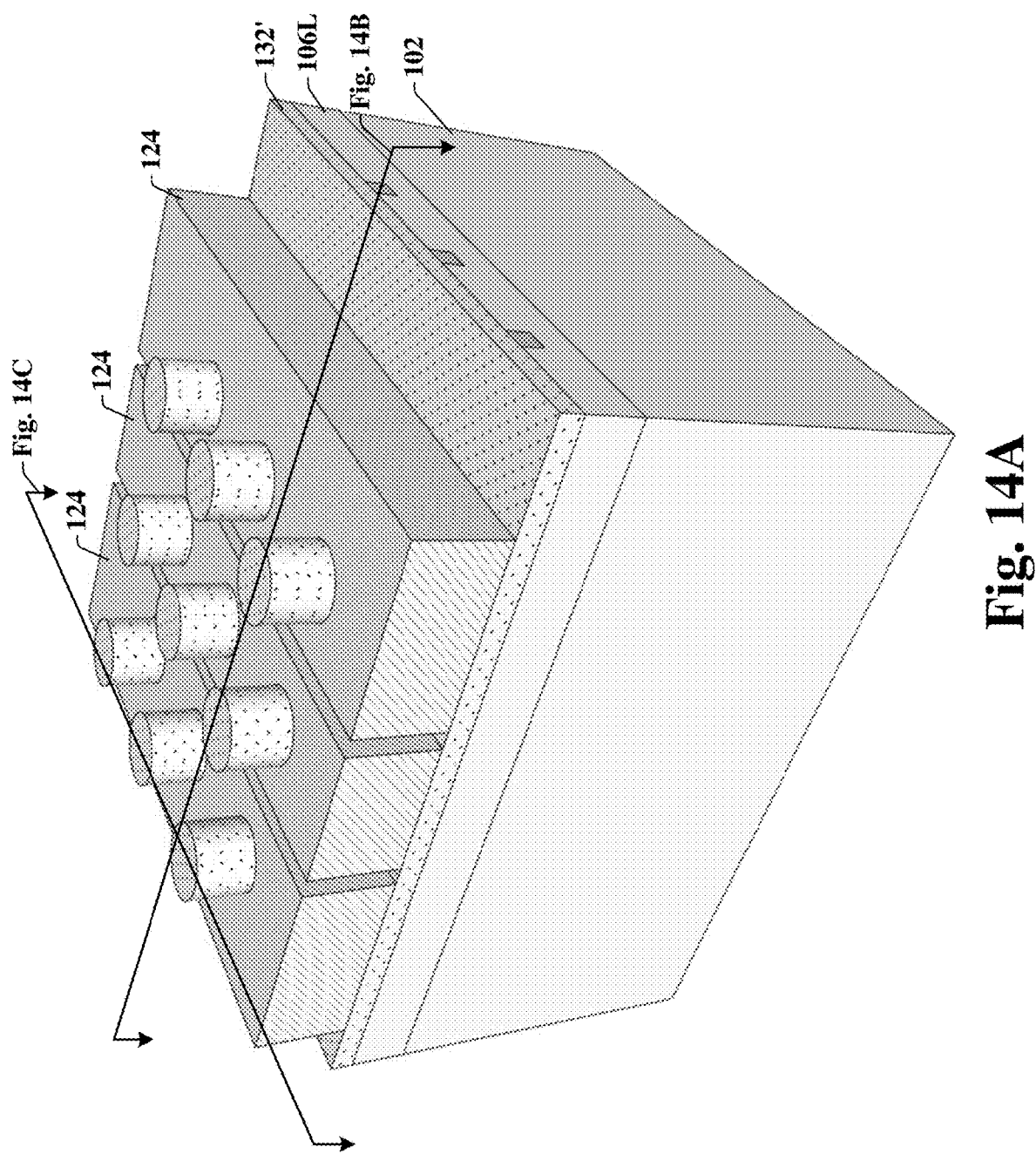
Figure 14B:
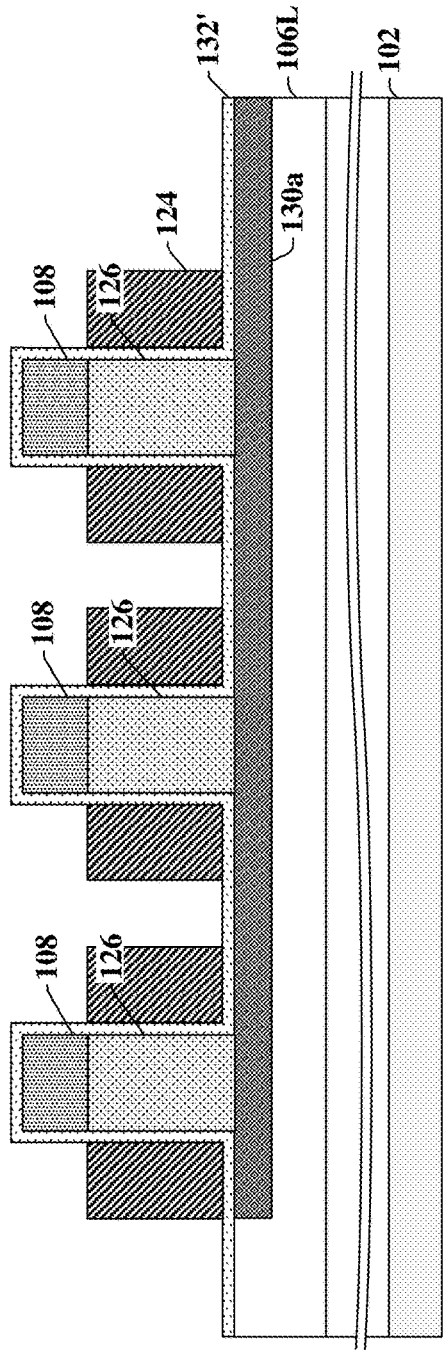
Figure 14C:
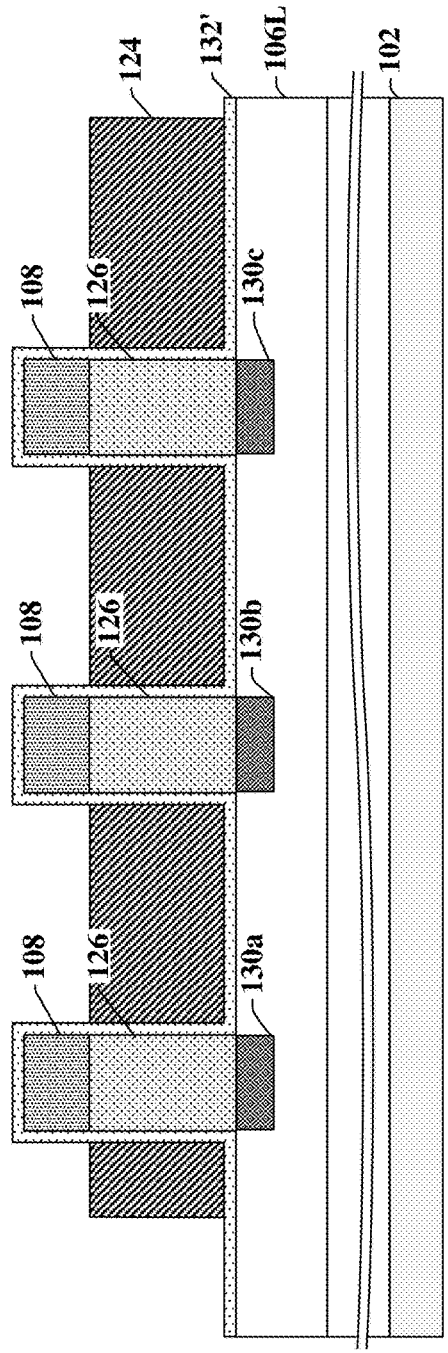

As shown in a perspective view of FIG. 14A and cross-sectional views of FIG. 14B and FIG. 14C, in some embodiments, the selector gate electrode layer 124' is patterned to form a plurality of selector gate electrodes 124. In some embodiments, the plurality of selector gate electrodes 124 is lowered to a position substantially aligned with a top surface of the selector channels 126 and further patterned as a plurality of paralleled conductive lines each connecting a column of selector channels 126. The plurality of paralleled conductive lines may act as word lines for the memory device.

Figure 15A:
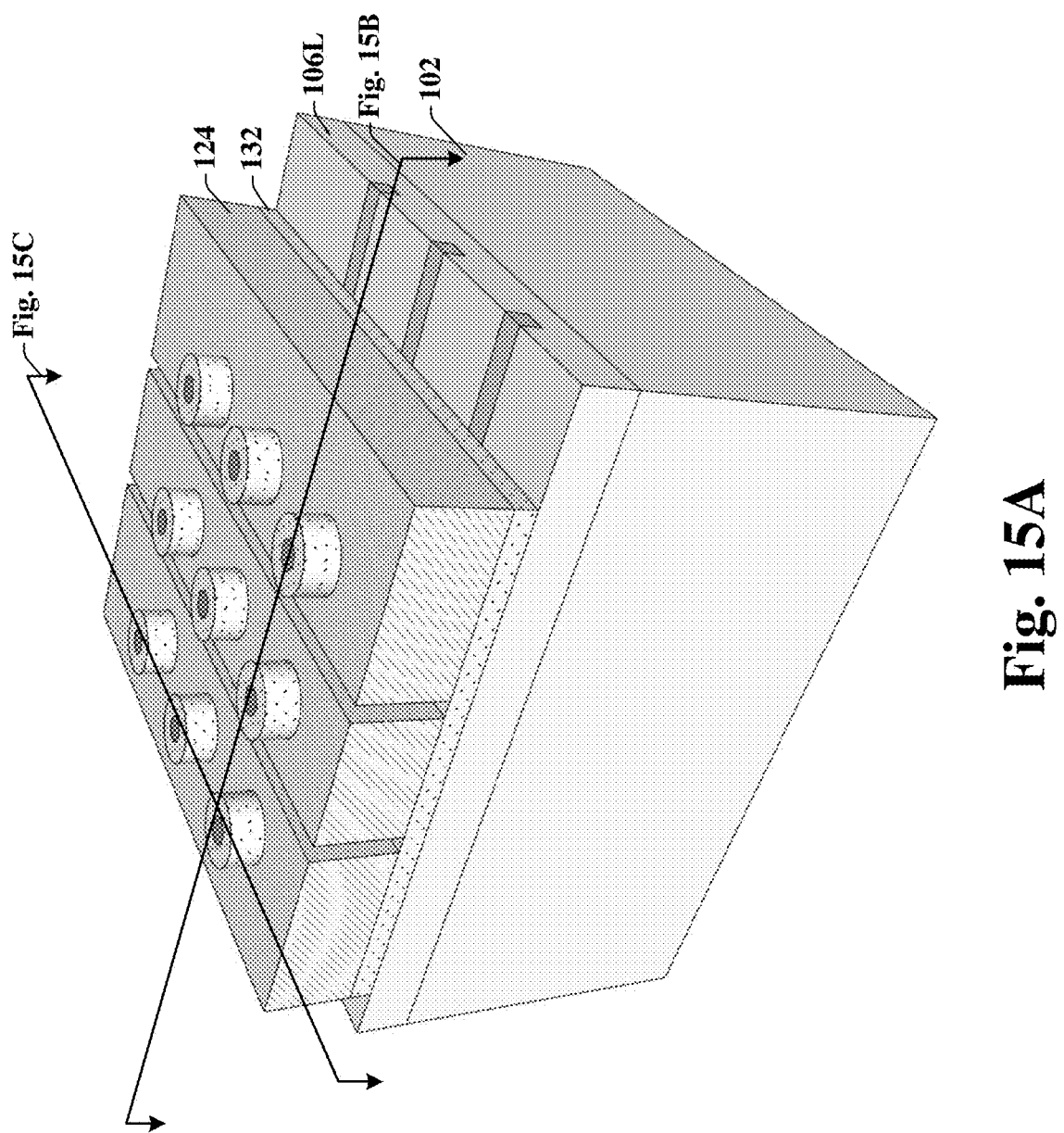

As shown in a perspective view of FIG. 15A and cross-sectional views of FIG. 15B and FIG. 15C, in some embodiments, the selector gate dielectric layer 132' is patterned to form a selector gate dielectric 132. In some embodiments, a masking layer (not shown in the figure) is utilized to protect the selector gate dielectric layer 132' between the memory cells from being removed during the patterning process. The selector gate dielectric layer 132' outside the memory region may be removed according to the masking layer or according to other structures having high selectivity with respect to the selector gate dielectric layer 132'. For example, the selector gate electrodes 124 can be used together with the masking layer during the patterning process, and the formed selector gate dielectric 132 may have outer sidewalls aligned with those of the selector gate electrodes 124. The selector gate dielectric 132 may cover entire sidewalls of the memory cells 108 and thus provide insulation and protection for the memory cells 108.

Figure 16A:
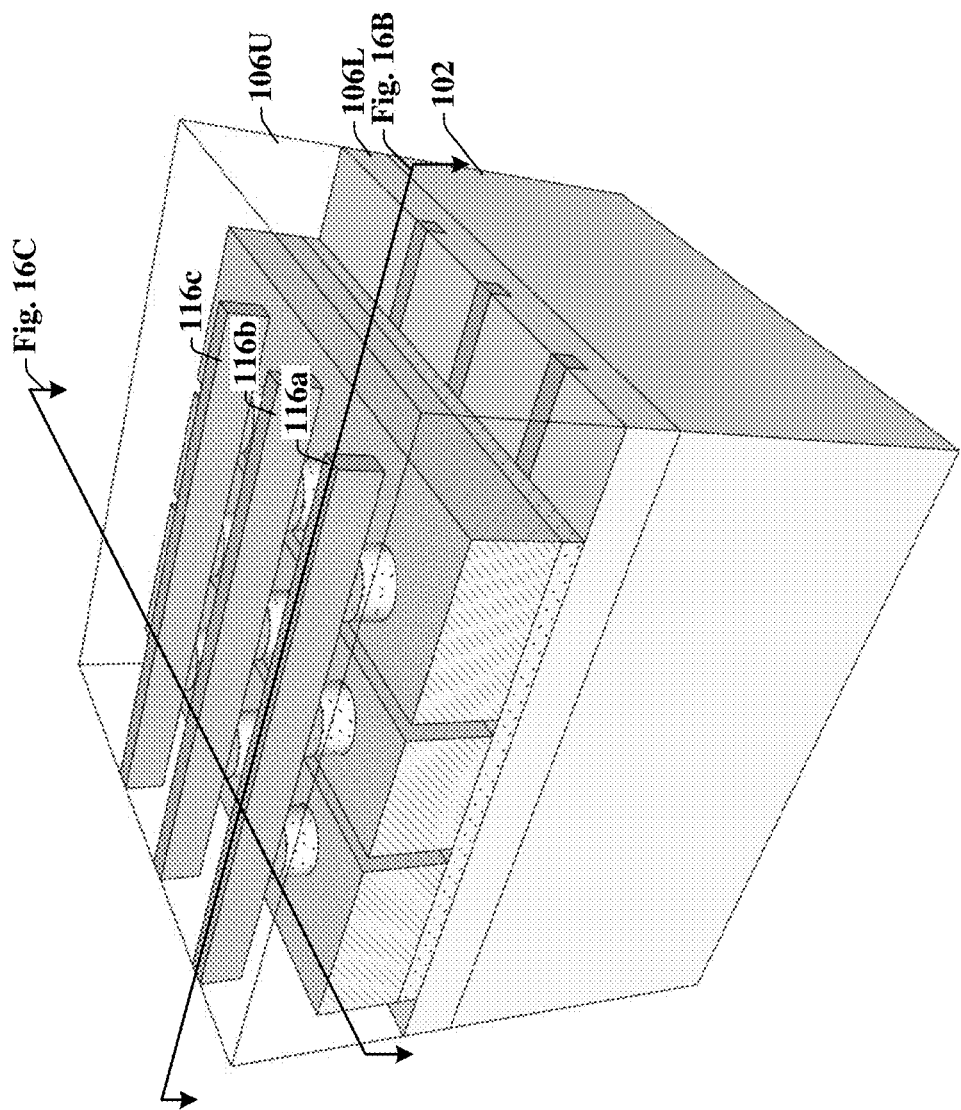
Figure 16B:
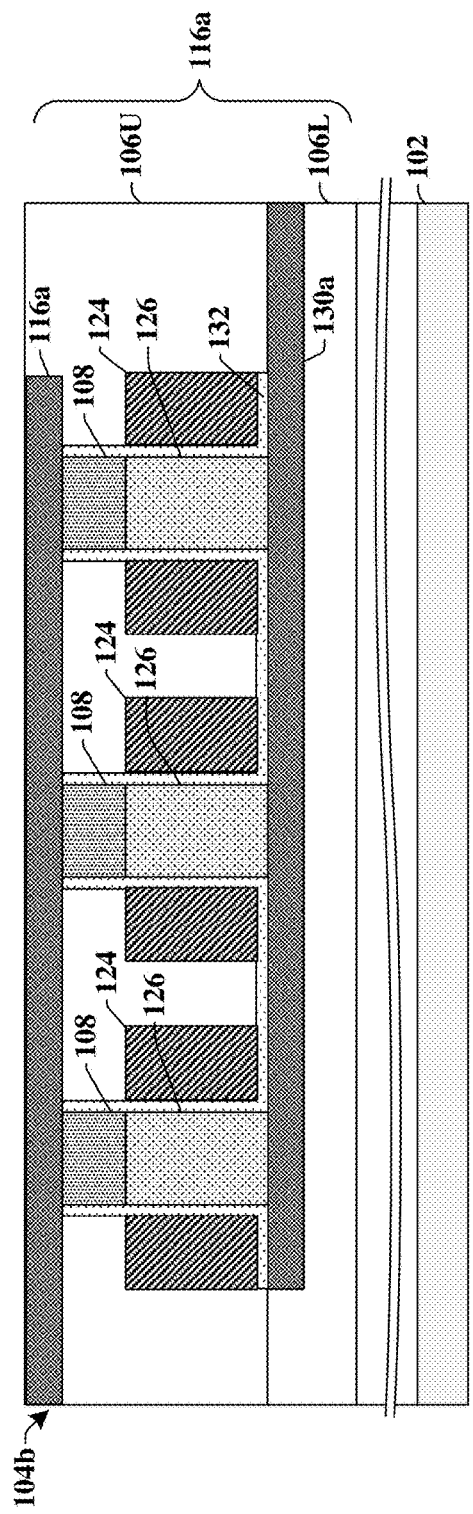
Figure 16C:
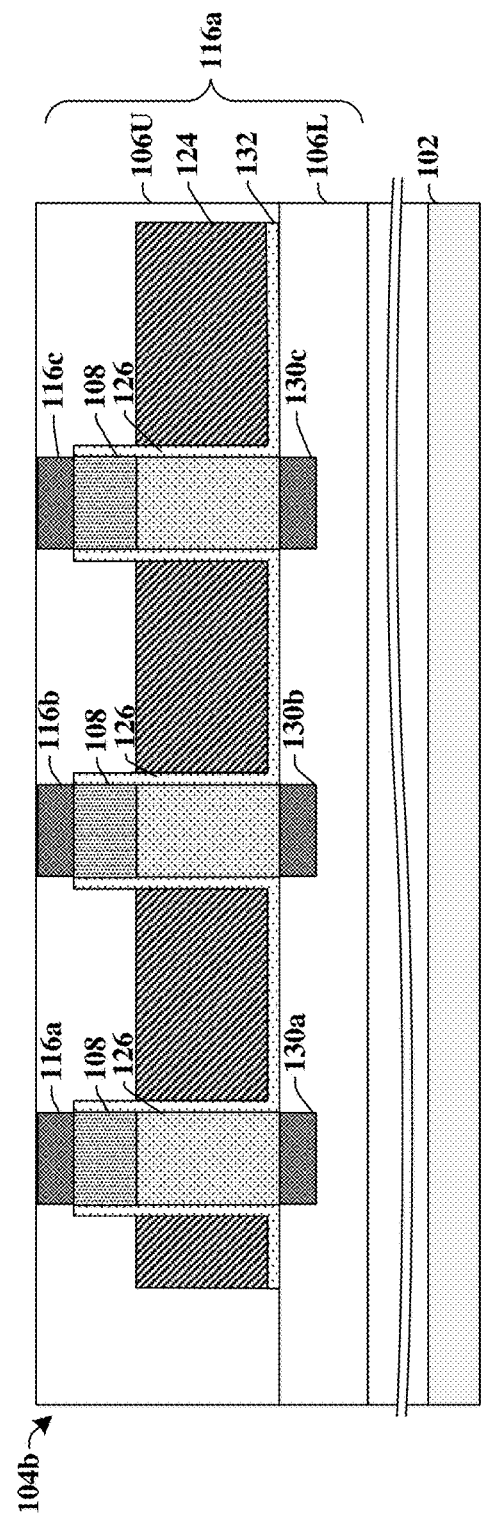

As shown in a perspective view of FIG. 16A and cross-sectional views of FIG. 16B and FIG. 16C, in some embodiments, an upper ILD layer 106U is formed over the memory cells 108, the selector gate dielectric 132, and the selector gate electrodes 124. A plurality of upper interconnect metal lines such as 116a, 116b, 116c shown in the figures are formed within the upper ILD layer 106U as part of an upper interconnect metal layer 104b. The plurality of upper interconnect metal lines 116a, 116b, 116c may function as second signal lines of the memory devices. In some embodiments, the second signal lines are source lines. The upper interconnect metal lines 116a, 116b, 116c may be formed by selectively etching the upper ILD layer 106U to define a trench within upper ILD layer 106U, forming a conductive material (e.g., tungsten, copper, aluminum, etc.) within the trench, and performing a planarization process (e.g., a chemical mechanical planarization process) to remove excess of the conductive material from over the upper ILD layer 106U. In some embodiments, the upper interconnect metal lines 116a, 116b, 116c are formed by a conductive material same with the lower interconnect metal lines 130a, 130b, 130c. In some alternative embodiments, the upper interconnect metal lines 116a, 116b, 116c are formed by a conductive material different from the lower interconnect metal lines 130a, 130b, 130c. In some embodiments, the upper interconnect metal lines 116a, 116b, 116c are formed by a deposition process followed by a planarization process (e.g., a chemical mechanical planarization process), and can have a thickness in a range of from about 5 nm to about 20 nm.

Figure 17A:
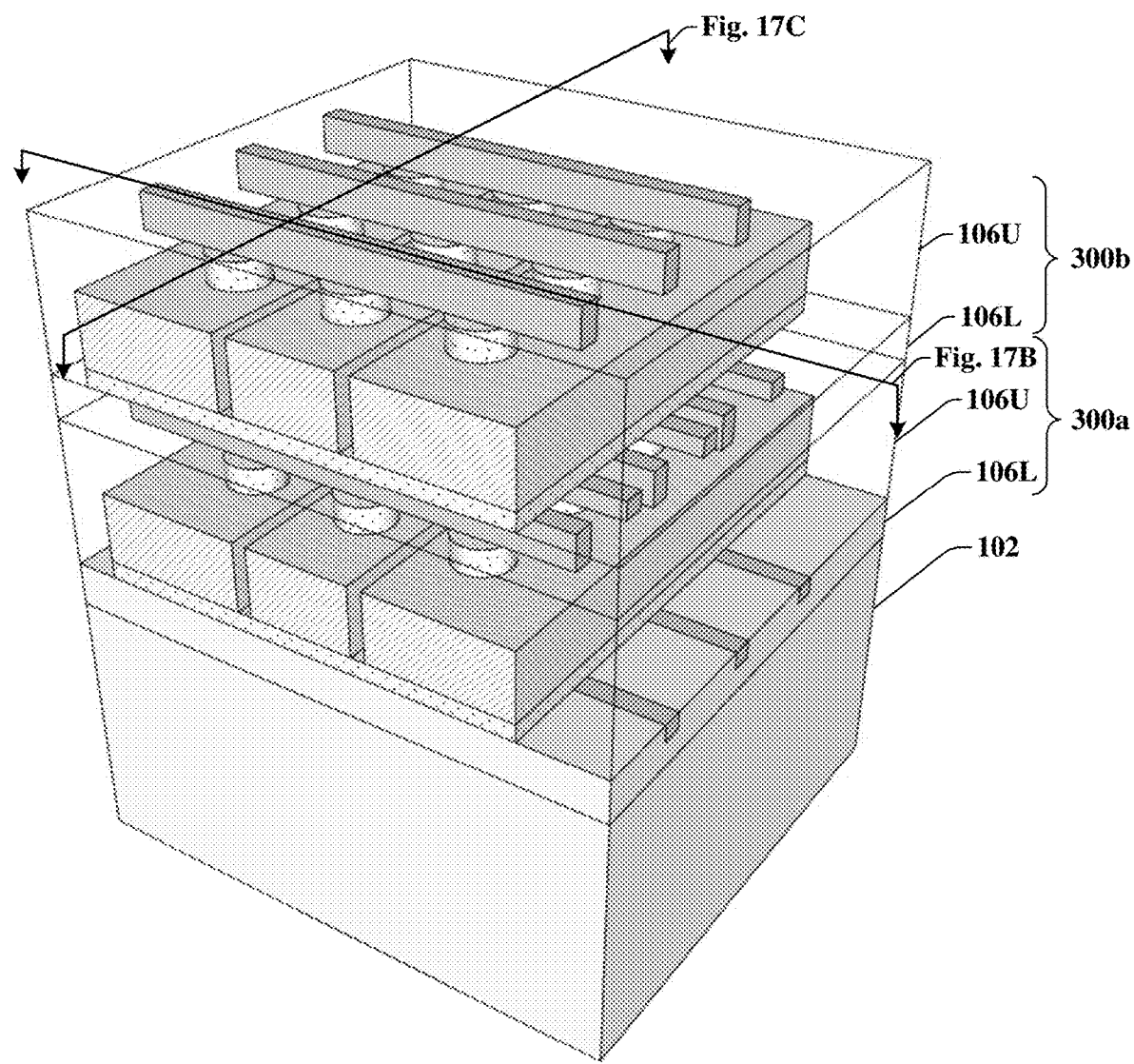
Figure 17B:
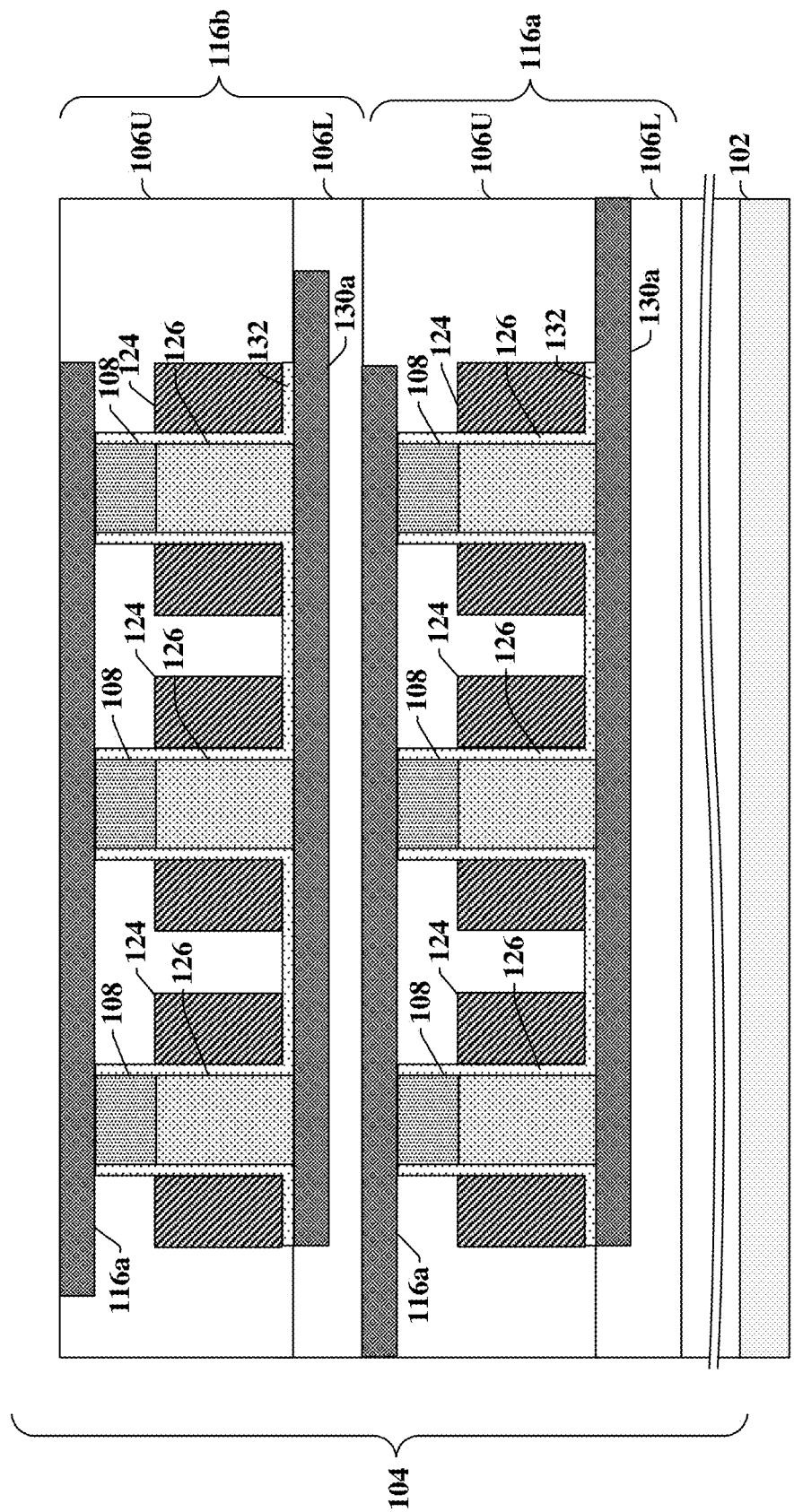
Figure 17C:
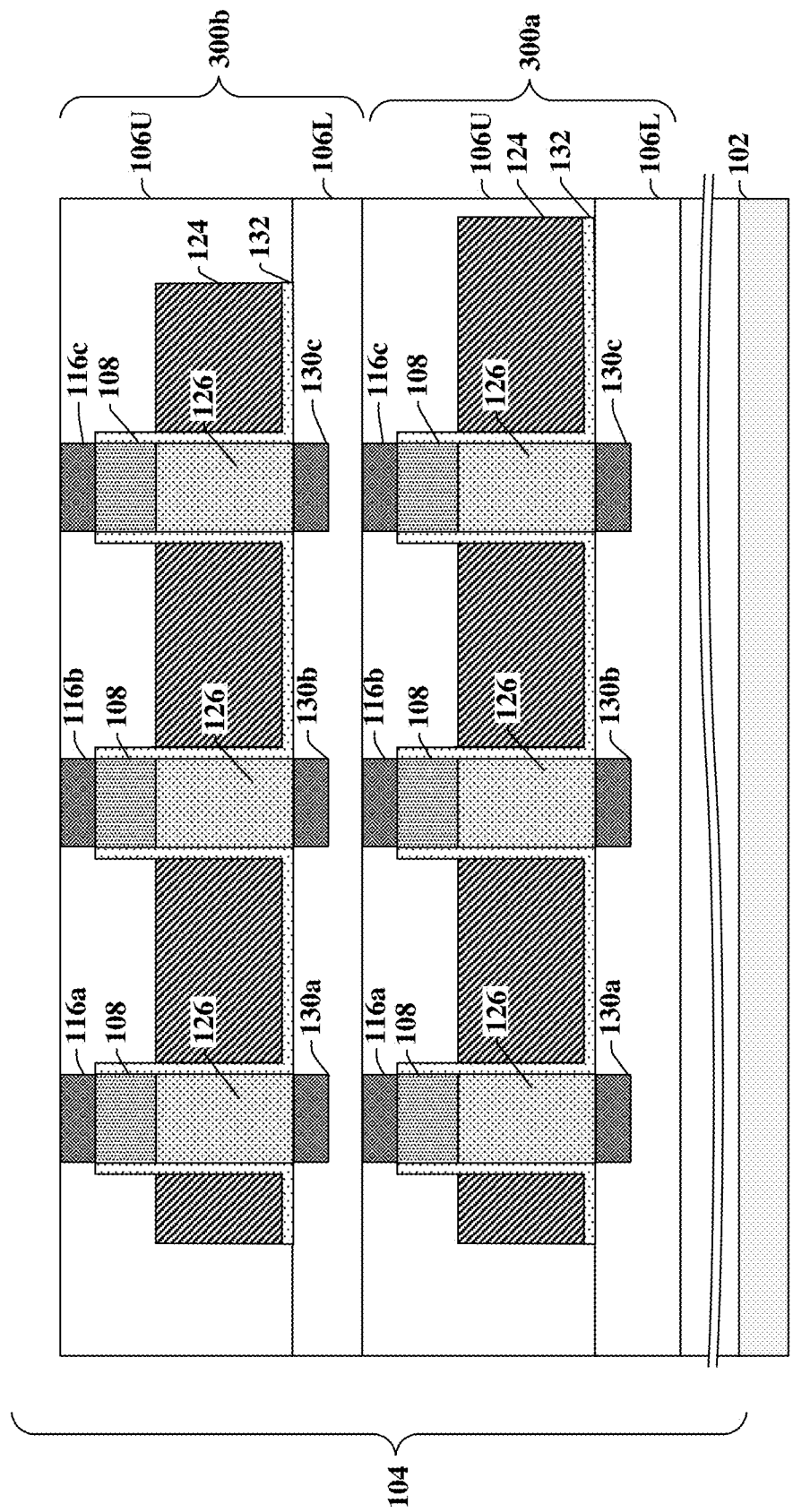

As shown in a perspective view of FIG. 17A and cross-sectional views of FIG. 17B and FIG. 17C, the processes described in FIGS. 8A-16C may be repeated one or more times to form additional memory arrays stacked thereover. For example, a second memory array 300b is shown in the figures stacking over a first memory array 300a.

Figure 18A:
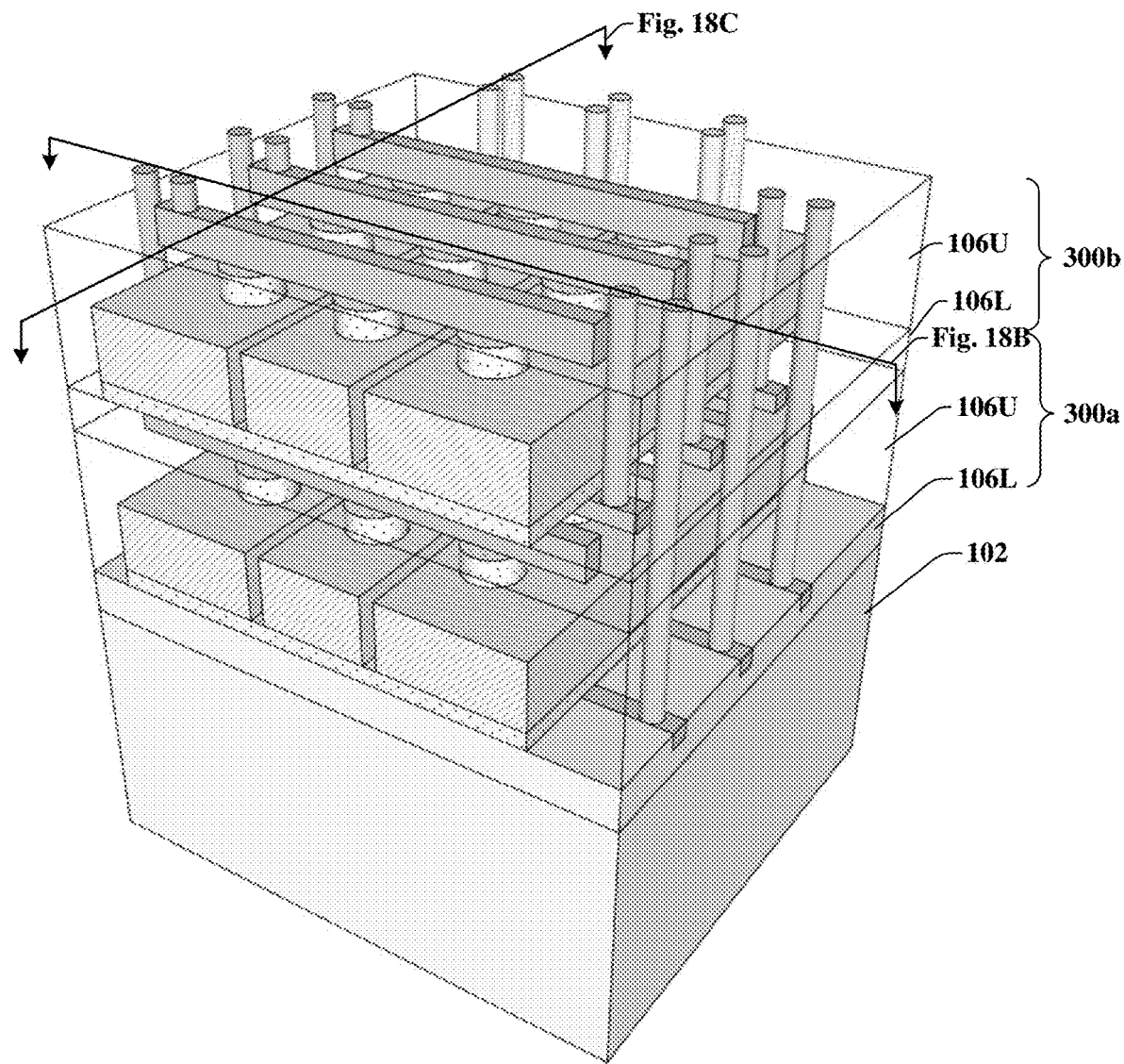
Figure 18B:
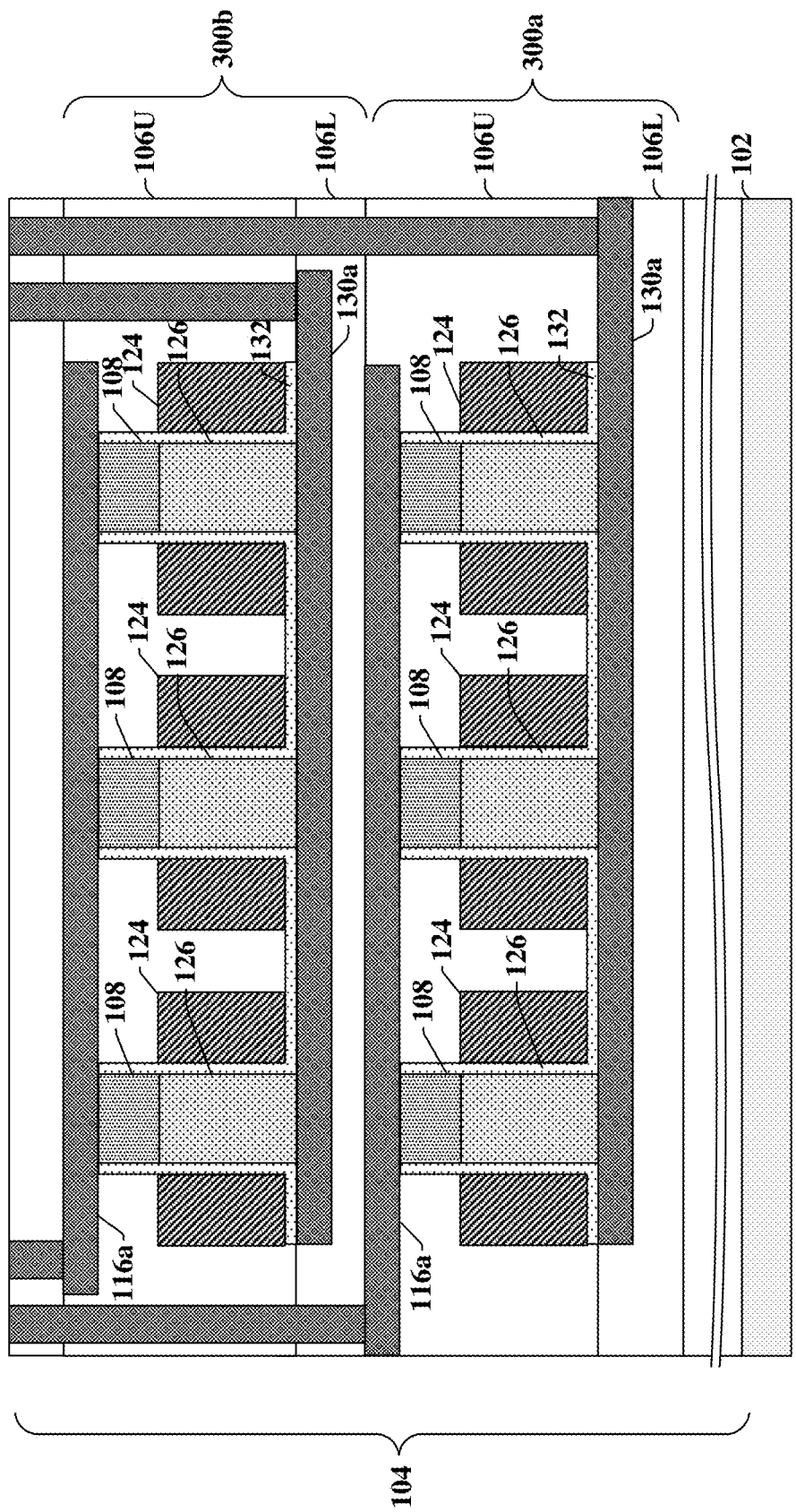
Figure 18C:
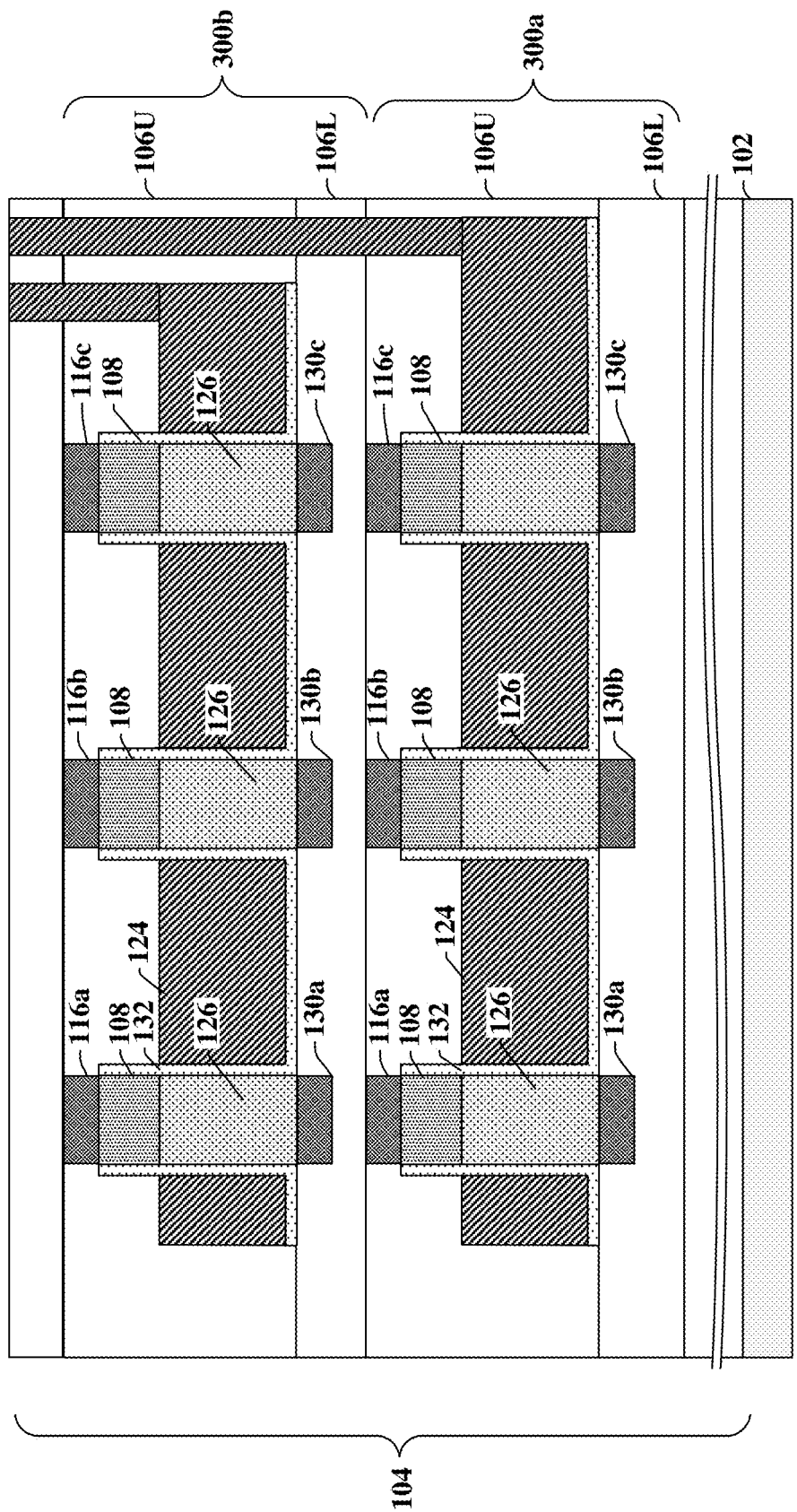

As shown in a perspective view of FIG. 18A and cross-sectional views of FIG. 18B and FIG. 18C, additional interconnect structures are formed for the memory arrays. For example, interconnect vias may be formed through the ILD layers 106L, 106U reaching on the signal lines.

Figure 19A:
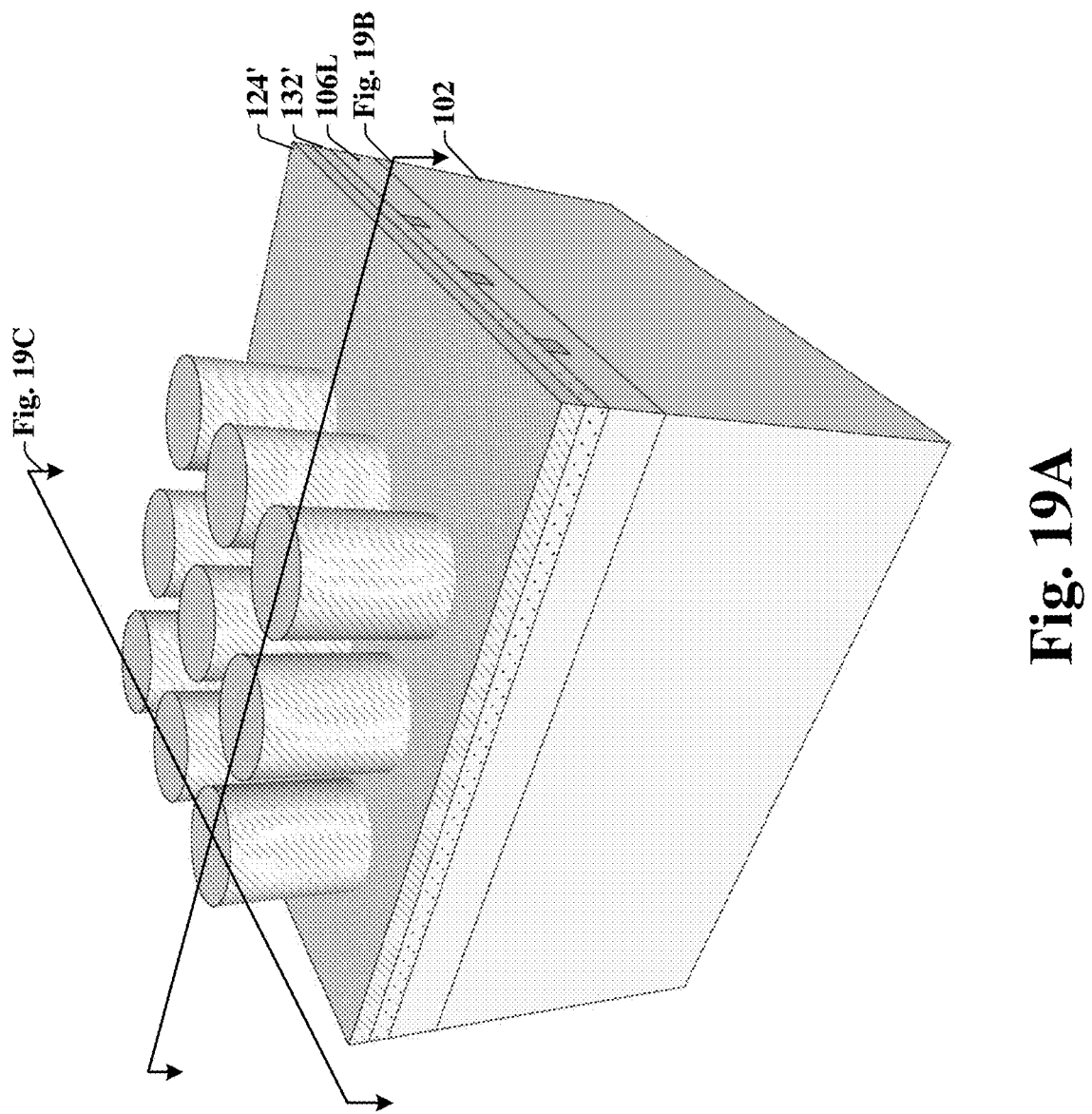
Figure 19B:
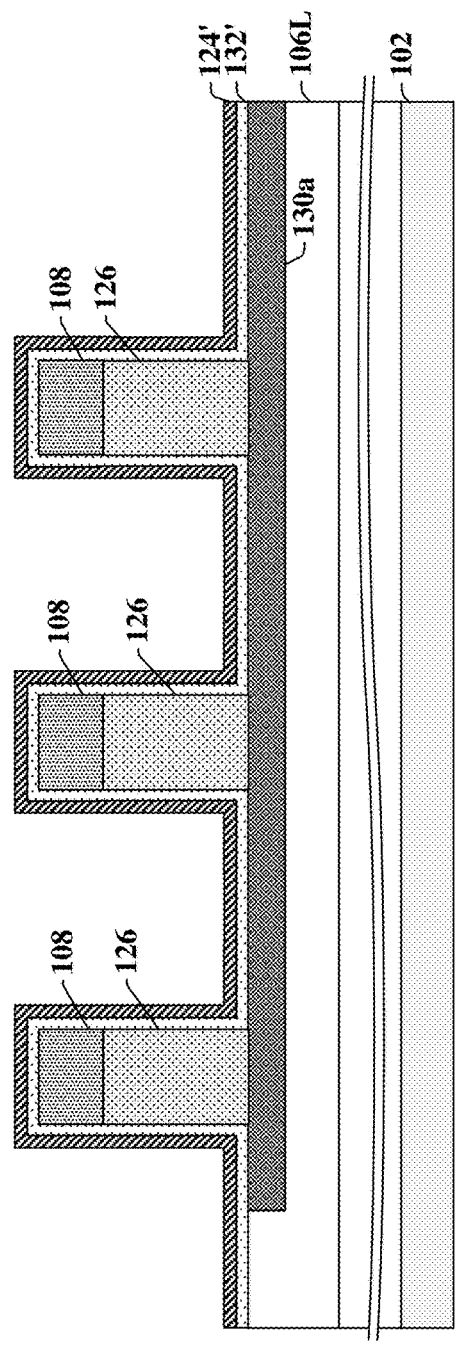
Figure 19C:
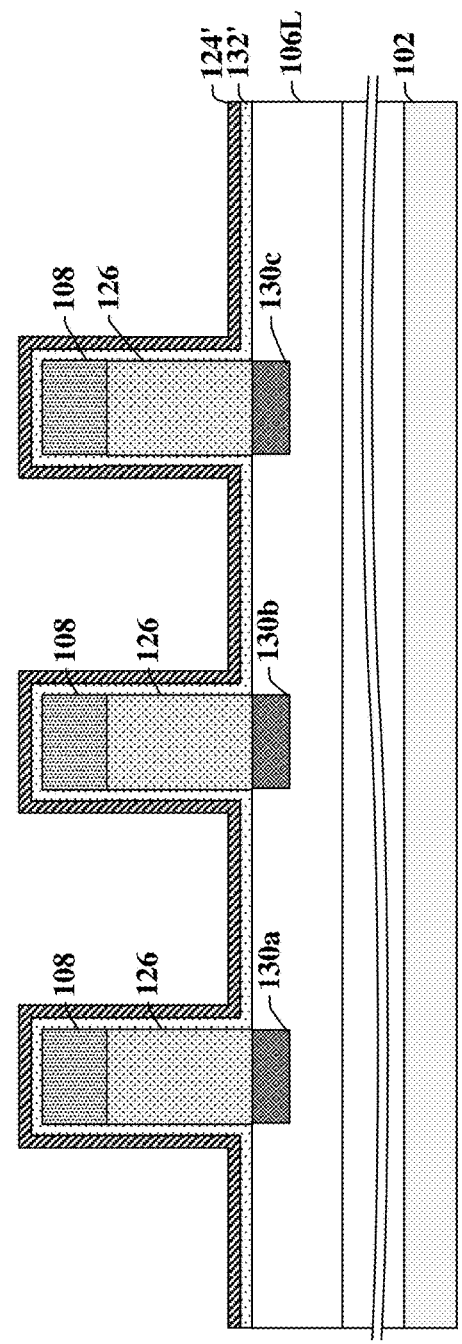
Figure 20A:
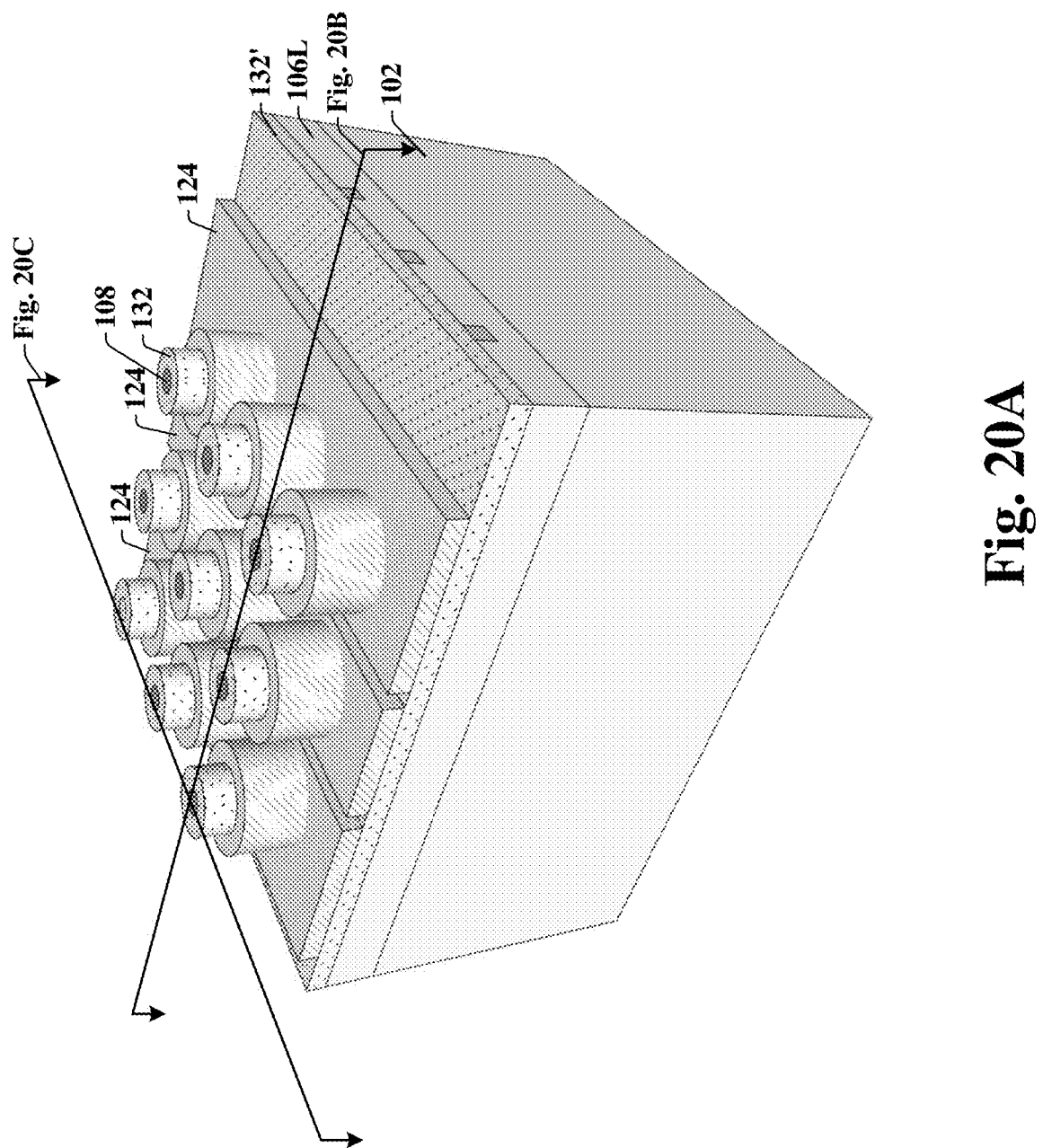
Figure 20B:
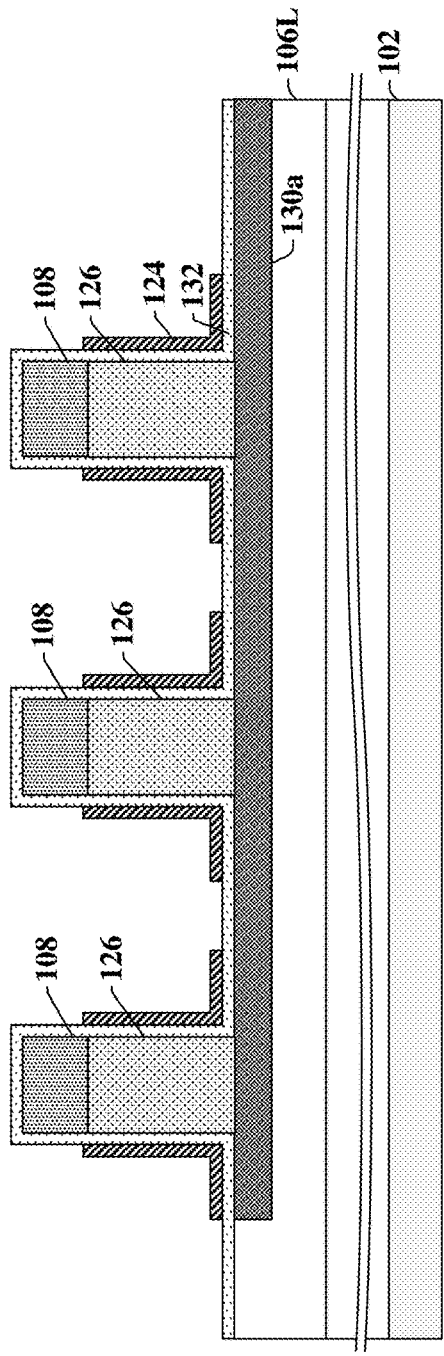
Figure 20C:
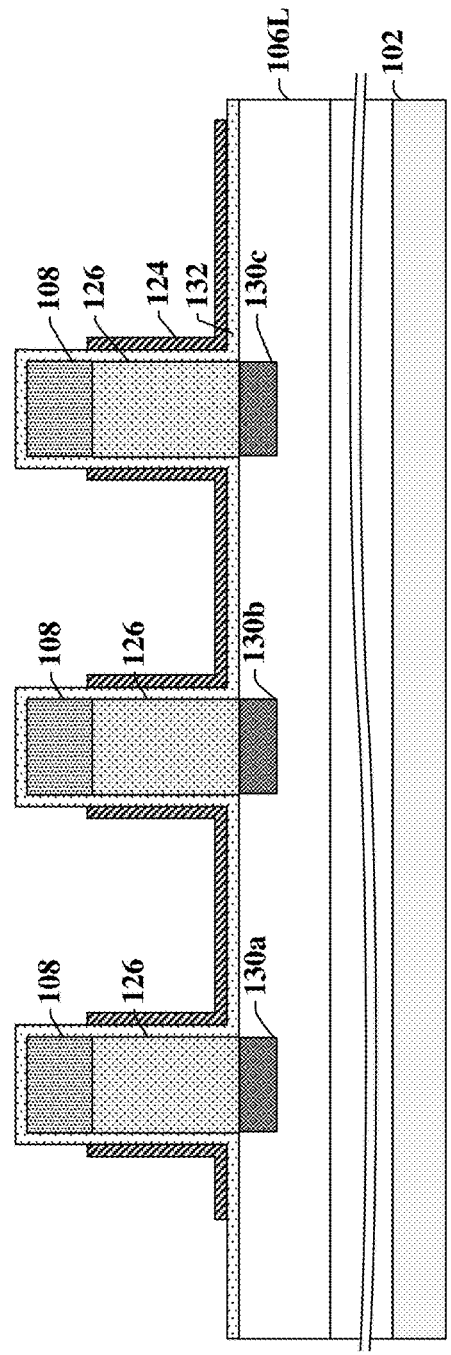
Figure 21A:
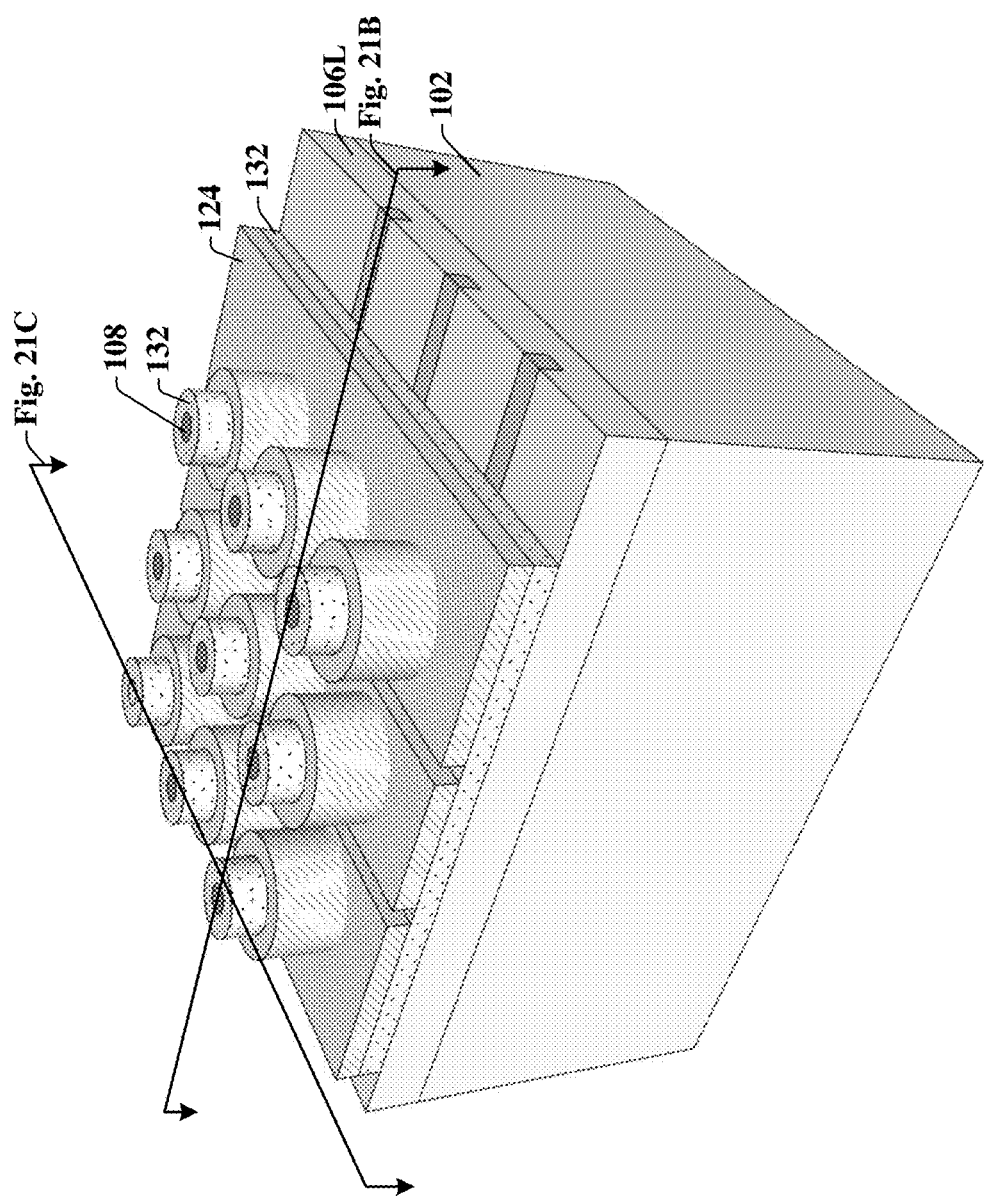
Figure 21B:
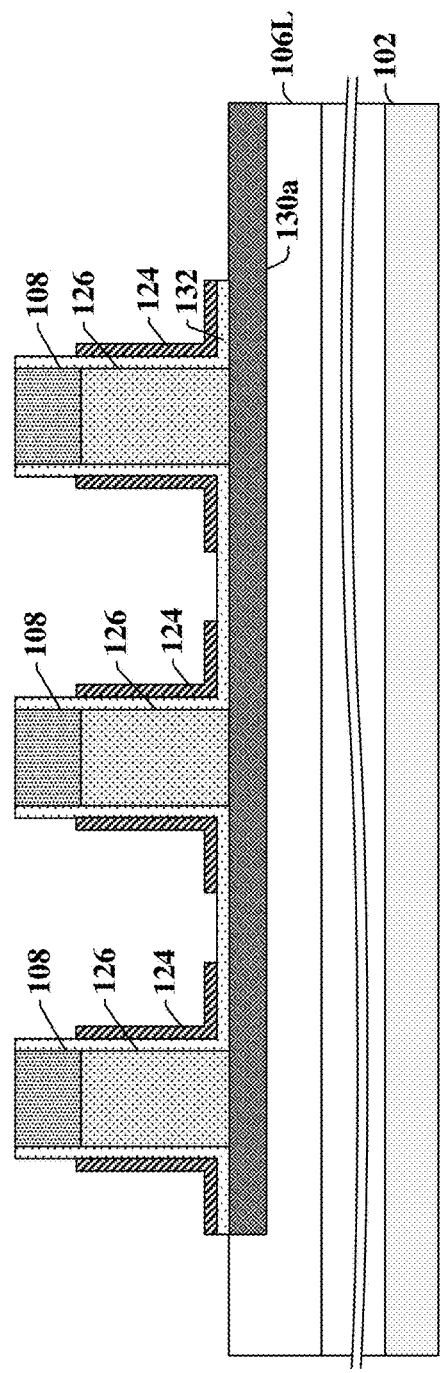
Figure 21C:
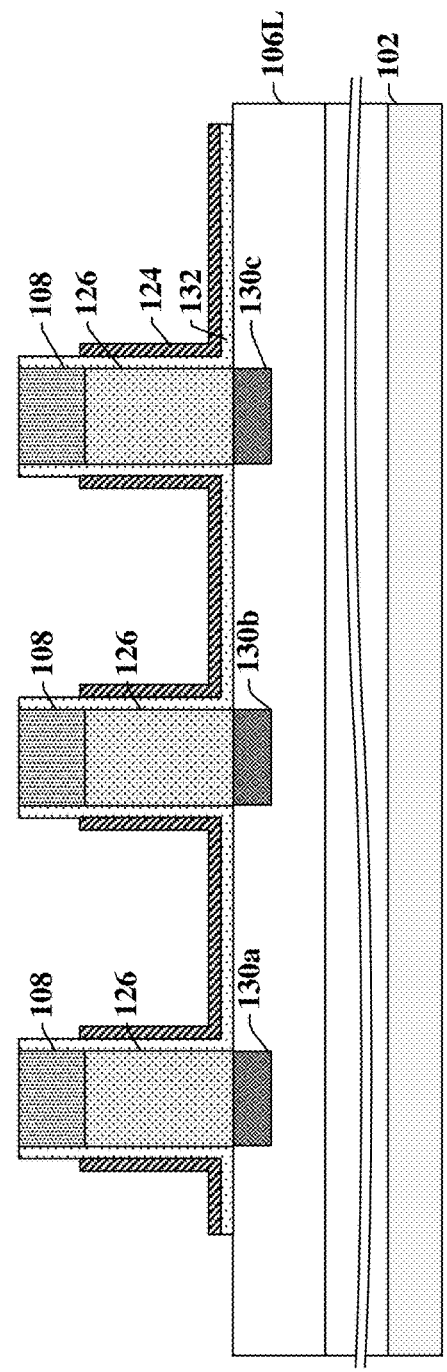
Figure 22A:
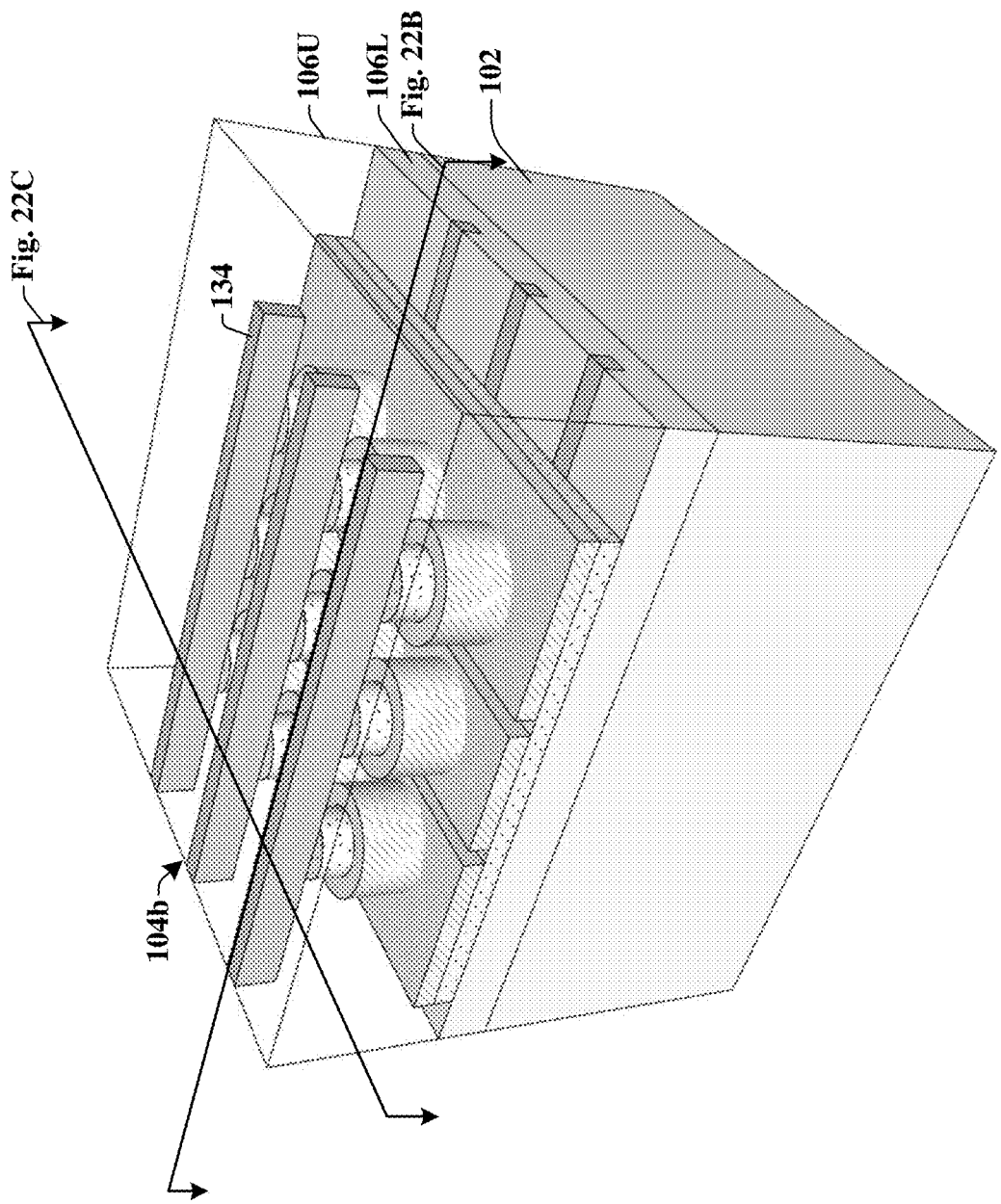
Figure 22B:
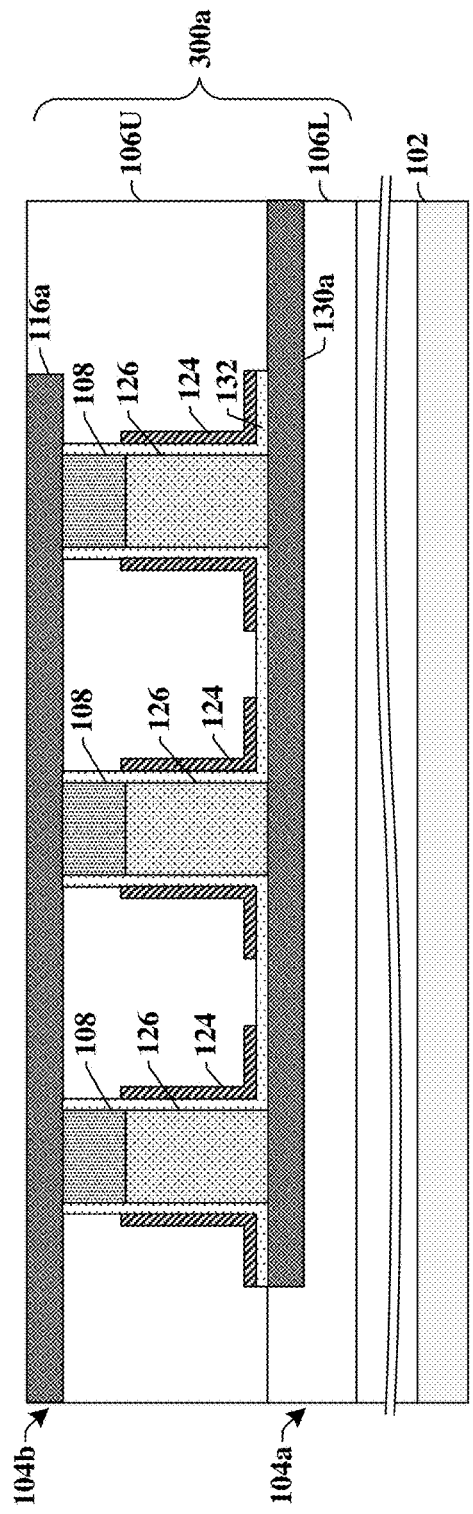
Figure 22C:
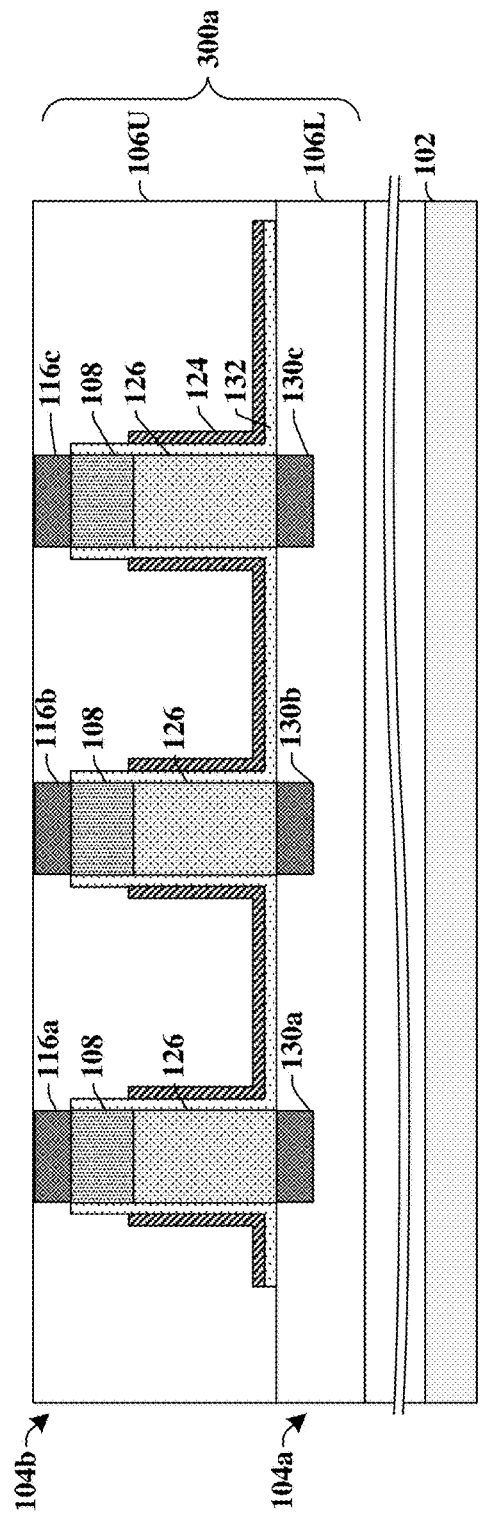
Figure 23A:
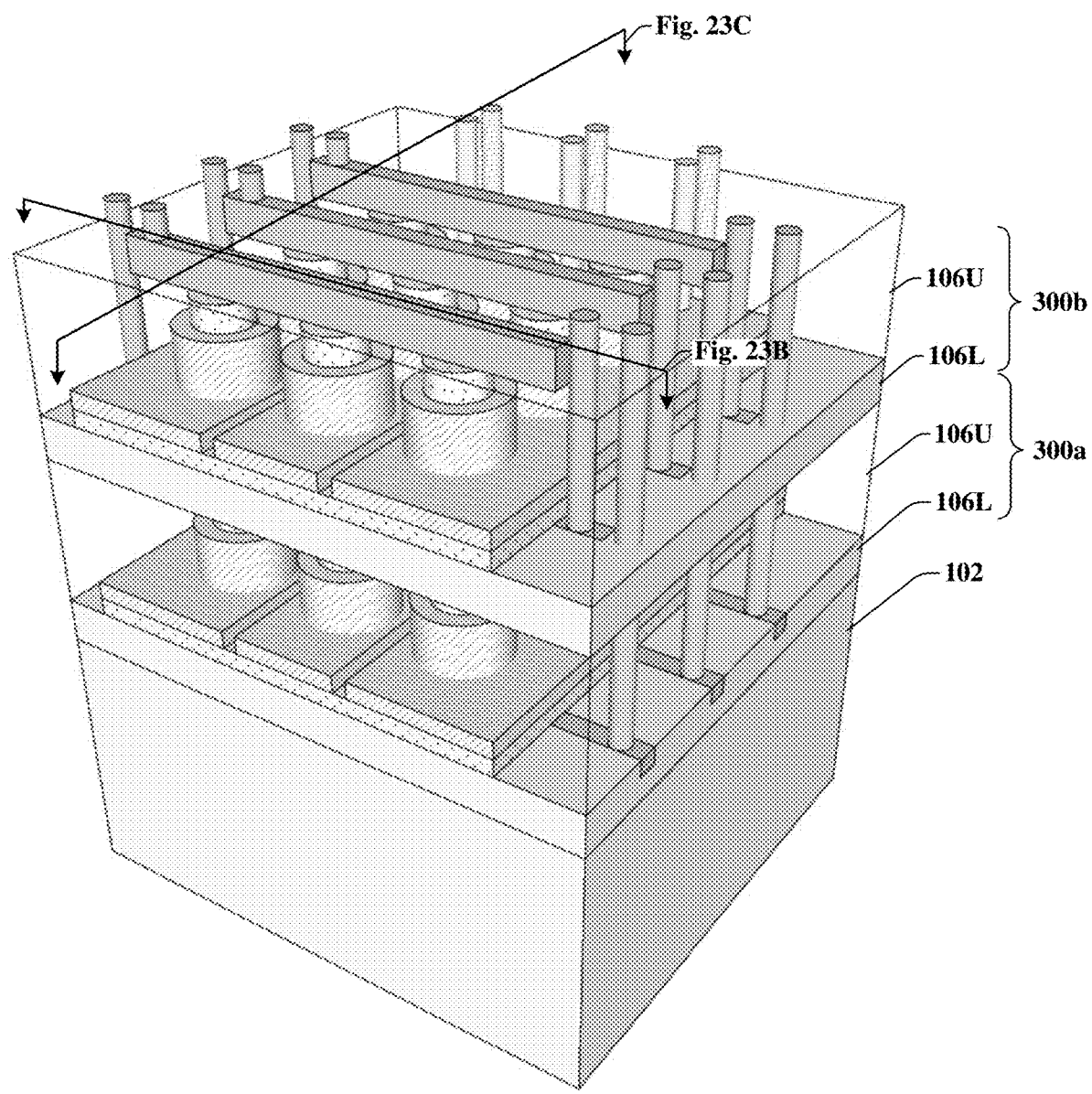
Figure 23B:
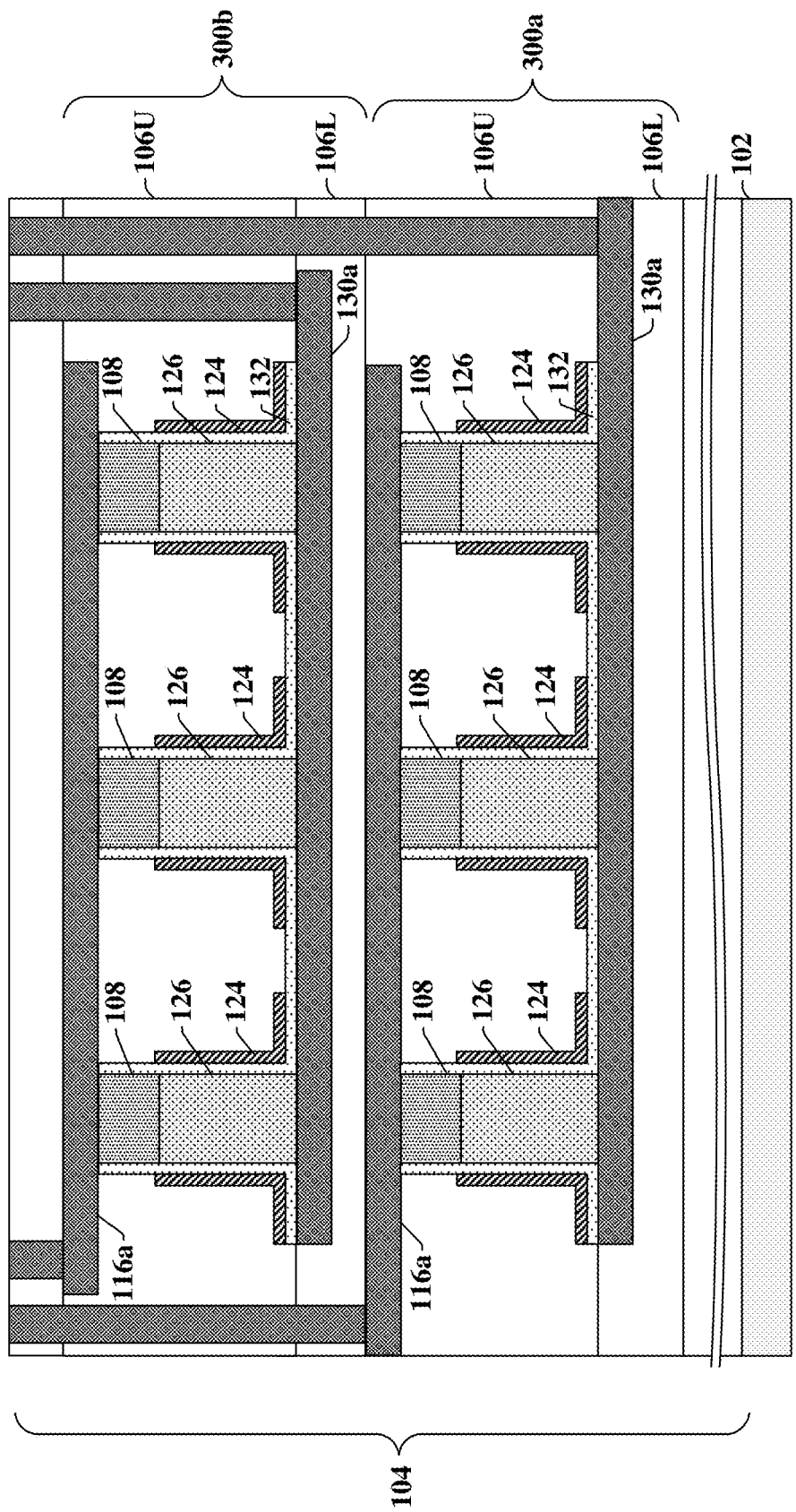
Figure 23C:
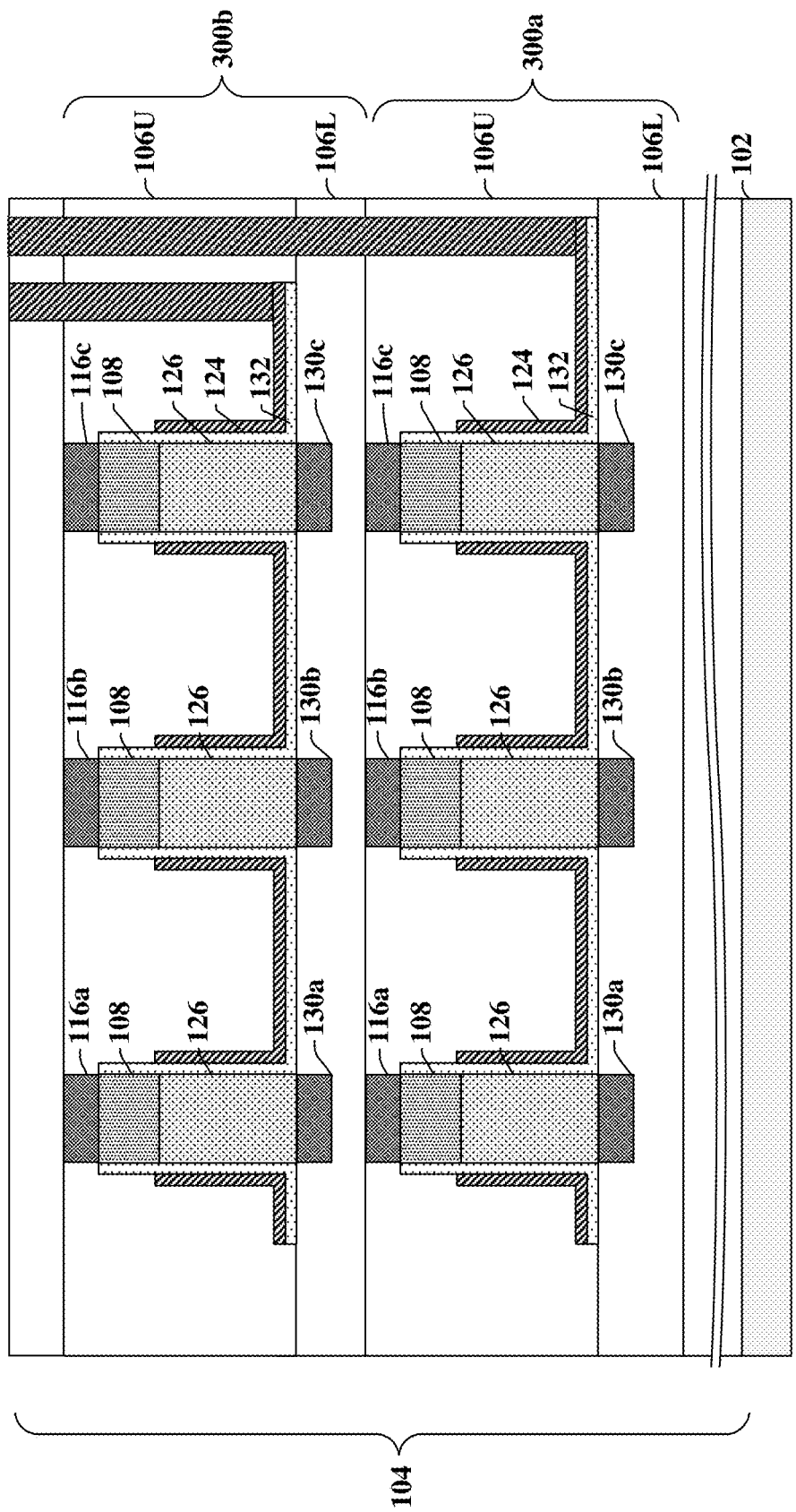

FIGS. 19A-23C illustrate various views of some embodiments of a method of forming a memory device comprising a BEOL selector alternative to FIGS. 13A-18C with the selector gate electrodes 124 having a different shape. As shown in FIGS. 19A-19C, the selector gate electrode layer 124' is formed on the selector gate dielectric layer 132' as a conformal conductive layer lining an upper surface of the selector gate dielectric layer 132'. As shown in FIG. 20A-20C, the selector gate electrode layer 124' is patterned to form a plurality of selector gate electrodes 124 lining sidewall surfaces of the selector channels 126. In some embodiments, the plurality of selector gate electrodes 124 is lowered to a position lower than a top surface of the memory cells 108 and further patterned as a plurality of paralleled conductive lines each connecting a column of selector channels 126. The plurality of paralleled conductive lines may act as word lines for the memory device. As shown in FIGS. 21A-21C, the selector gate dielectric layer 132' is patterned to form a selector gate dielectric 132. In some embodiments, the selector gate dielectric 132 may have outer sidewalls aligned with those of the selector gate electrodes 124. The selector gate dielectric 132 may cover entire sidewalls of the memory cells 108 and thus provide insulation and protection for the memory cells 108. As shown in FIGS. 22A-22C, an upper ILD layer 106U is formed over the memory cells 108, the selector gate dielectric 132, and the selector gate electrodes 124. A plurality of upper interconnect metal lines such as 116a, 116b, 116c shown in the figures are formed within the upper ILD layer 106U as part of an upper interconnect metal layer 104b. The plurality of upper interconnect metal lines 116a, 116b, 116c may function as second signal lines of the memory devices. In some embodiments, the second signal lines are source lines. As shown in FIGS. 23A-23C, a second memory array 300b is formed over a first memory array 300a. Additional memory arrays may be subsequently formed over second memory array 300b. Also, additional interconnect structures are formed for the memory arrays including through substrate vias and may also include more interconnect metal layers formed over the upper interconnect metal layer 104b.

Figure 24:
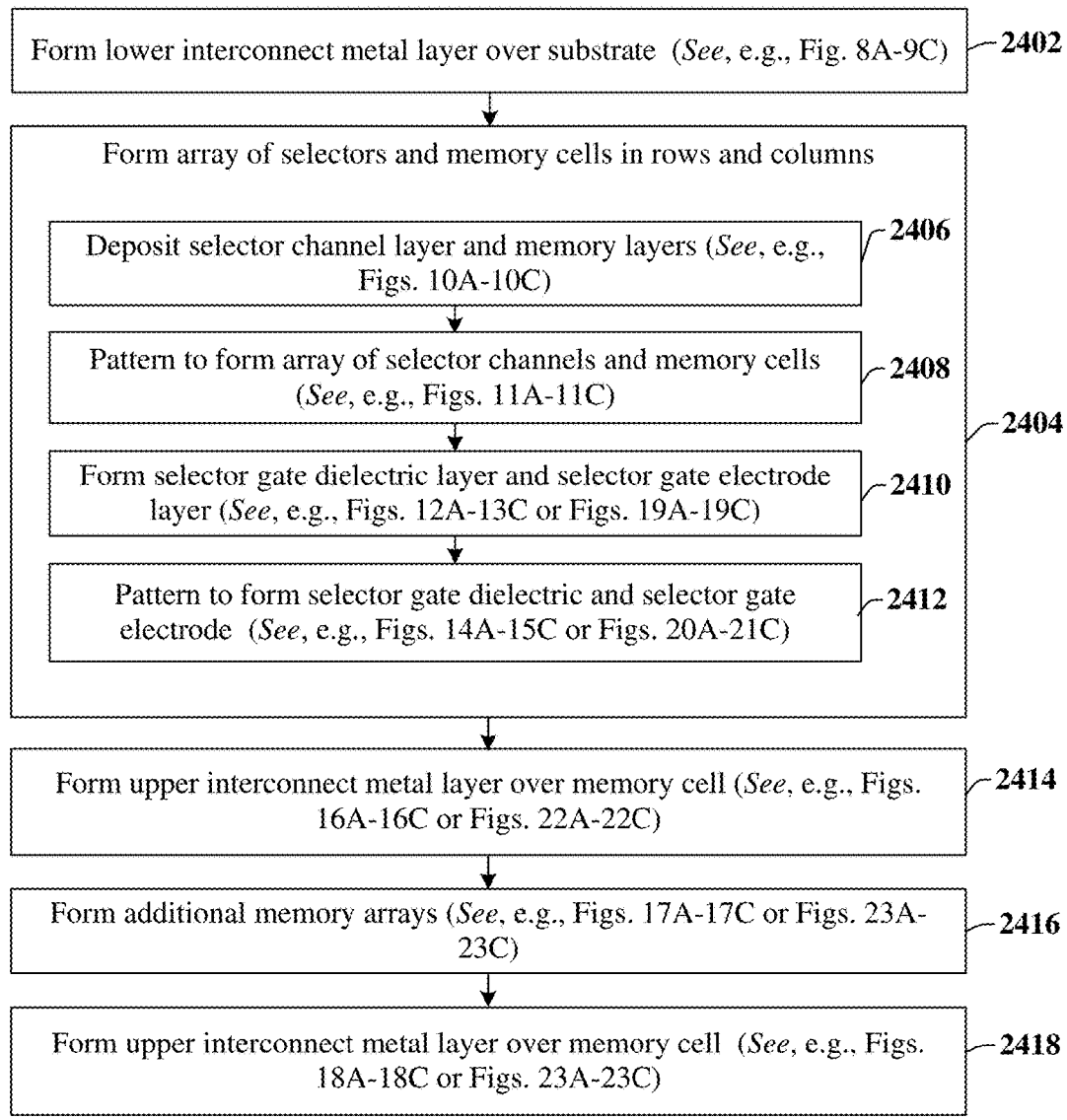
FIG. 24 illustrates a flow diagram of some embodiments of a method of forming a memory device comprising a BEOL selector.

FIG. 24 illustrates a flow diagram of some embodiments of a method 2400 of forming a memory device comprising a BEOL selector.

While method 2400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2402, a substrate is prepared, and a lower interconnect metal layer is formed within a lower inter-level dielectric (ILD) layer over the substrate. In some embodiments, logic devices may be formed within the substrate prior to forming the lower interconnect metal layer. FIGS. 8A-9C illustrate some embodiments corresponding to act 2402.

At act 2404, an array of selectors and an array of memory cells are formed in rows and columns. In some embodiments, act 2404 may be formed through acts 2406-2412.

At act 2406, in some embodiments, a selector channel layer and a stack of memory layers are formed on the lower interconnect metal layer. FIGS. 10A-10C illustrate some embodiments corresponding to act 2406.

At act 2408, the selector channel layer and the stack of memory layers are patterned to form the selector channels and the memory cells. FIGS. 11A-11C illustrate some embodiments corresponding to act 2408.

At act 2410, In some embodiments, a selector gate dielectric layer is formed covering selector channels and an array of memory cells, and a selector gate electrode layer is formed on the selector gate dielectric layer. FIGS. 12A-13C or FIGS. 19A-19C illustrate some embodiments corresponding to act 2410.

At act 2412, the selector gate electrode layer is patterned to form a plurality of selector gate electrodes, and the selector gate dielectric layer is patterned to form a selector gate dielectric layer. FIGS. 14A-15C or FIGS. 20A-21C illustrate some embodiments corresponding to act 2412.

At act 2414, in some embodiments, an upper interconnect metal layer is formed having a plurality of upper interconnect metal lines such are formed within an upper ILD layer 106U. FIGS. 16A-16C or FIGS. 22A-22C illustrate some embodiments corresponding to act 2414.

At act 2416, one or more additional memory arrays are stacked. FIGS. 17A-17C or FIGS. 23A-23C illustrate some embodiments corresponding to act 2416.

At act 2418, additional interconnect structures are formed for the memory arrays. FIGS. 18A-18C or FIGS. 23A-23C illustrate some embodiments corresponding to act 2418.

Accordingly, in some embodiments, the present disclosure relates to a memory device (e.g., an MRAM or a ReRAM, or a PCRAM device) having a BEOL selector inserted in a BEOL interconnect structure.

In some embodiments, the present disclosure relates to a memory device. The memory device comprises a substrate and a lower interconnect metal line disposed over the substrate. The memory device further comprises a selector channel disposed over the lower interconnect metal line and a selector gate electrode wrapping around a sidewall of the selector channel and separating the selector channel by a selector gate dielectric. The memory device further comprises a memory cell disposed over and electrically connected to the selector channel and an upper interconnect metal line disposed over the memory cell.

In other embodiments, the present disclosure relates to a memory device. The memory device comprises a substrate, and an interconnect structure disposed over the substrate. The interconnect structure has a plurality of interconnect metal layers one stacked over another and comprising a plurality of lower interconnect metal lines and a plurality of upper interconnect metal lines. The memory device further comprises a plurality of selectors disposed within the interconnect structure and over the lower interconnect metal lines. The plurality of selectors is arranged in an array of rows and columns. The memory device further comprises a plurality of memory cells disposed on top of the plurality of selectors correspondingly in the array of rows and columns.

In yet other embodiments, the present disclosure relates to a method of forming a memory device. The method includes forming a lower interconnect metal layer over a substrate and forming a plurality of selectors and a plurality of memory cells over the lower interconnect metal layer. The method further comprises forming an upper interconnect metal layer over the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
a lower interconnect metal line disposed over the substrate;
a selector channel disposed over the lower interconnect metal line;
a selector gate electrode wrapping around a sidewall of the selector channel and separated from the selector channel by a selector gate dielectric;
a memory cell disposed over and electrically connected to the selector channel; and
an upper interconnect metal line disposed over the memory cell;
wherein the selector gate dielectric is a continuous dielectric extending to cover entire sidewalls of the selector channel and the memory cell and in direct contact with a sidewall of a data storage structure of the memory cell, and
wherein the selector gate electrode has a top surface disposed between top and bottom surfaces of the memory cell and extends laterally and further disposed along and shared by multiple additional selector channels.

2. The memory device of claim 1, wherein the memory cell is in direct contact with the selector channel.

3. The memory device of claim 1,
wherein the memory cell comprises a bottom electrode and a top electrode sandwiching the data storage structure; and
wherein the selector channel has a sidewall vertically aligned with sidewalls of the bottom electrode, the top electrode, and the data storage structure of the memory cell.

4. The memory device of claim 1, wherein the selector gate electrode comprises a metal layer extending upwardly to the top of the selector channel.

5. The memory device of claim 1, wherein the selector channel comprises oxide semiconductor material.

6. The memory device of claim 1, wherein the selector channel has a round or oval shape from a top view with the same lateral dimension as the memory cell.

7. The memory device of claim 1, the memory cell comprising:
a bottom electrode disposed between the selector channel and the data storage structure; and
a top electrode disposed over the data storage structure;
wherein the selector gate dielectric is in direct contact with entire sidewalls of the bottom electrode, the data storage structure, and the top electrode.

8. The memory device of claim 1, wherein the selector channel has a square or rectangular shape from a top view.

9. The memory device of claim 1, wherein the selector gate dielectric comprises aluminum oxide ($Al_2O_3$), and wherein the selector channel is made of indium gallium zinc oxide (IGZO).

10. The memory device of claim 1, wherein the selector gate electrode is disposed directly on and lateral along selector gate dielectric.

11. A memory device, comprising:
a substrate;
an interconnect structure disposed over the substrate, the interconnect structure having a plurality of interconnect metal layers one stacked over another and comprising a plurality of lower interconnect metal lines and a plurality of upper interconnect metal lines;
a plurality of selectors disposed within the interconnect structure and over the lower interconnect metal lines, the plurality of selectors being arranged in an array of rows and columns; and
a plurality of memory cells disposed on top of the plurality of selectors correspondingly in the array of rows and columns;
wherein the plurality of selectors each comprise:
a selector channel disposed over the lower interconnect metal line and below a memory cell of the plurality of memory cells, the selector channel having the same width as the memory cell;
a selector gate dielectric wrapping around a sidewall of the selector channel; and
a selector gate electrode disposed around the selector gate dielectric and separated from the selector channel by the selector gate dielectric;
wherein the selector gate dielectric is a continuous dielectric that extends from a bottom to a top of the selector channel and the memory cell and further shared by the array of rows and columns of the selectors, and the selector gate electrode extends upwardly to the top of the selector channel.

12. The memory device of claim 11, wherein the selector gate dielectric is disposed directly on a metal line of the plurality of lower interconnect metal lines.

13. The memory device of claim 11, the plurality of memory cells each comprising:
a bottom electrode;
a data storage structure disposed over the bottom electrode; and
a top electrode disposed over the data storage structure;
wherein the selector gate dielectric further extends to directly contact and cover entire sidewalls of the bottom electrode, the data storage structure, and the top electrode.

14. The memory device of claim 13,
wherein a row of the selectors shares one of the plurality of lower interconnect metal lines disposed directly under the selector channels of the row of the selectors, and
wherein the selector gate electrodes of the row of the selectors have lateral portions extending conformally and laterally between the row of the selectors and separated from one another.

15. The memory device of claim 14, wherein the row of the selectors shares one of the plurality of upper interconnect metal lines disposed directly on the top electrodes of the row of the memory cells.

16. The memory device of claim 15,
wherein a column of the selectors shares a word line connecting the selector gate electrodes of the column of the selectors, and
wherein the selector gate electrodes of the column of the selectors are a continuous piece with a lateral portion extending conformally and laterally between the row of the selectors.

17. The memory device of claim 16, wherein the continuous piece has a sidewall vertically aligned with a sidewall of the selector gate dielectric.

18. A method of manufacturing a memory device, the method comprising:
forming a lower interconnect metal layer over a substrate;
forming a selector channel layer on the lower interconnect metal layer;
forming a stack of memory layers on the selector channel layer;
patterning the stack of memory layers and the selector channel layer to form a plurality of selector channels and a plurality of memory cells in an array of rows and columns, the plurality of selector channels and the plurality of memory cells are formed with the same width;
forming a selector gate dielectric of continuous dielectric wrapping around and directly contacting entire sidewalls of the plurality of selector channels and data storage structures of the plurality of memory cells; and
forming a first selector gate electrode shared by a first column of the array of columns and a second selector gate electrode shared by a second column of the array of columns on the selector gate dielectric and separated from the plurality of selector channels by the selector gate dielectric; and
forming an upper interconnect metal layer over the plurality of memory cells,
wherein the first selector gate electrode and the second selector gate electrode are formed with an upper surface formed below an upper portion of the selector gate dielectric surrounding upper portions of the plurality of memory cells.

19. The method of claim 18, wherein the selector gate dielectric is formed to extend between opposing sidewalls of the first selector gate electrode and the second selector gate electrode with a sidewall vertically aligned with an opposite sidewall of the first selector gate electrode or the second selector gate electrode.

20. The method of claim 18, further comprising forming a second plurality of selectors and a second plurality of memory cells stacked over the upper interconnect metal layer.

* * * * *